(12) United States Patent
Tsuchi

(10) Patent No.: US 7,808,416 B2
(45) Date of Patent: Oct. 5, 2010

(54) OUTPUT CIRCUIT, DIGITAL ANALOG CIRCUIT AND DISPLAY DEVICE

(75) Inventor: Hiroshi Tsuchi, Tokyo (JP)

(73) Assignees: Nec Corporation (JP); Nec Electronics Corporation

(*) Notice: Subject to any disclaimer, the term of this patent is extended or adjusted under 35 U.S.C. 154(b) by 1030 days.

(21) Appl. No.: 11/539,898

(22) Filed: Oct. 10, 2006

(65) Prior Publication Data
US 2007/0091052 A1   Apr. 26, 2007

Related U.S. Application Data

(63) Continuation of application No. 10/970,706, filed on Oct. 21, 2004, now Pat. No. 7,126,518.

(30) Foreign Application Priority Data

Oct. 27, 2003   (JP) .................... 2003-365640
Oct. 6, 2006    (JP) .................... 2004-294070

(51) Int. Cl.
*H03M 1/66*   (2006.01)

(52) U.S. Cl. .................. 341/144; 341/145; 341/138
(58) Field of Classification Search ............... 341/144, 341/145, 138
See application file for complete search history.

(56) References Cited

U.S. PATENT DOCUMENTS

| 5,841,384 | A  | * | 11/1998 | Herman et al. | 341/138 |
| 6,037,888 | A  | * | 3/2000  | Nairn         | 341/145 |
| 6,326,913 | B1 | * | 12/2001 | Chao et al.   | 341/144 |
| 6,329,940 | B1 | * | 12/2001 | Dedic         | 341/144 |
| 6,329,941 | B1 | * | 12/2001 | Farooqi       | 341/145 |
| 6,424,283 | B2 | * | 7/2002  | Bugeja et al. | 341/145 |
| 6,507,304 | B1 | * | 1/2003  | Lorenz        | 341/144 |
| 7,126,518 | B2 | * | 10/2006 | Tsuchi        | 341/144 |

* cited by examiner

*Primary Examiner*—Jean B Jeanglaude
(74) *Attorney, Agent, or Firm*—Ostrolenk Faber LLP

(57) ABSTRACT

A selection circuit receives a plural number (m) of respective different values of voltages as reference voltages to select and output two voltages. An amplifier receives at two input terminals the two reference voltages output from the selection circuit to output an output voltage extrapolated.

19 Claims, 46 Drawing Sheets

| LEVEL | INPUT VOLTAGE | V(T1) | V(T2) | D1,D0 |
|---|---|---|---|---|
| 1 | | A | B | 0,0 |
| 2 | A | A | A | 0,1 |
| 3 | B | B | B | 1,0 |
| 4 | | B | A | 1,1 |

FIG. 10

| <INPUT> | <OUTPUT> | (V(T1), V(T2)) |
|---|---|---|
| | ——— Vo16 | (D, A) |
| | ——— Vo15 | (D, B) |
| | ——— Vo14 | (C, A) |
| | ——— Vo13 | (C, B) |
| | ——— Vo12 | (D, C) |
| D——————— | ——— Vo11 | (D, D) |
| C——————— | ——— Vo10 | (C, C) |
| | ——— Vo9 | (C, D) |
| | ——— Vo8 | (B, A) |
| B——————— | ——— Vo7 | (B, B) |
| A——————— | ——— Vo6 | (A, A) |
| | ——— Vo5 | (A, B) |
| | ——— Vo4 | (B, C) |
| | ——— Vo3 | (B, D) |
| | ——— Vo2 | (A, C) |
| | ——— Vo1 | (A, D) |

FIG. 11

| LEVEL | INPUT VOLTAGE | V(T1) | V(T2) | D3,D2,D1,D0 |
|---|---|---|---|---|
| 1 | | A | D | 0,0,0,0 |
| 2 | | A | C | 0,0,0,1 |
| 3 | | B | D | 0,0,1,0 |
| 4 | | B | C | 0,0,1,1 |
| 5 | | A | B | 0,1,0,0 |
| 6 | A | A | A | 0,1,0,1 |
| 7 | B | B | B | 0,1,1,0 |
| 8 | | B | A | 0,1,1,1 |
| 9 | | C | D | 1,0,0,0 |
| 10 | C | C | C | 1,0,0,1 |
| 11 | D | D | D | 1,0,1,0 |
| 12 | | D | C | 1,0,1,1 |
| 13 | | C | B | 1,1,0,0 |
| 14 | | C | A | 1,1,0,1 |
| 15 | | D | B | 1,1,1,0 |
| 16 | | D | A | 1,1,1,1 |

FIG. 16

| LEVEL | INPUT VOLTAGE | V(T1) | V(T2) | D5,D4,D3,D2,D1,D0 |
|---|---|---|---|---|
| 1 |   | A | H | 000000 |
| 2 |   | A | G | 000001 |
| 3 |   | B | H | 000010 |
| 4 |   | B | G | 000011 |
| 5 |   | A | F | 000100 |
| 6 |   | A | E | 000101 |
| 7 |   | B | F | 000110 |
| 8 |   | B | E | 000111 |
| 9 |   | C | H | 001000 |
| 10 |   | C | G | 001001 |
| 11 |   | D | H | 001010 |
| 12 |   | D | G | 001011 |
| 13 |   | C | F | 001100 |
| 14 |   | C | E | 001101 |
| 15 |   | D | F | 001110 |
| 16 |   | D | E | 001111 |
| 17 |   | A | D | 010000 |
| 18 |   | A | C | 010001 |
| 19 |   | B | D | 010010 |
| 20 |   | B | C | 010011 |
| 21 |   | A | B | 010100 |
| 22 | A | A | A | 010101 |
| 23 | B | B | B | 010110 |
| 24 |   | B | A | 010111 |
| 25 |   | C | D | 011000 |
| 26 | C | C | C | 011001 |
| 27 | D | D | D | 011010 |
| 28 |   | D | C | 011011 |
| 29 |   | C | B | 011100 |
| 30 |   | C | A | 011101 |
| 31 |   | D | B | 011110 |
| 32 |   | D | A | 011111 |
| 33 |   | E | H | 100000 |
| 34 |   | E | G | 100001 |
| 35 |   | F | H | 100010 |
| 36 |   | F | G | 100011 |
| 37 |   | E | F | 100100 |
| 38 | E | E | E | 100101 |
| 39 | F | F | F | 100110 |
| 40 |   | F | E | 100111 |
| 41 |   | G | H | 101000 |
| 42 | G | G | G | 101001 |
| 43 | H | H | H | 101010 |
| 44 |   | H | G | 101011 |
| 45 |   | G | F | 101100 |
| 46 |   | G | E | 101101 |
| 47 |   | H | F | 101110 |
| 48 |   | H | E | 101111 |
| 49 |   | E | D | 110000 |
| 50 |   | E | C | 110001 |
| 51 |   | F | D | 110010 |
| 52 |   | F | C | 110011 |
| 53 |   | E | B | 110100 |
| 54 |   | E | A | 110101 |
| 55 |   | F | B | 110110 |
| 56 |   | F | A | 110111 |
| 57 |   | G | D | 111000 |
| 58 |   | G | C | 111001 |
| 59 |   | H | D | 111010 |
| 60 |   | H | C | 111011 |
| 61 |   | G | B | 111100 |
| 62 |   | G | A | 111101 |
| 63 |   | H | B | 111110 |
| 64 |   | H | A | 111111 |

FIG. 19

| \<INPUT\> | \<OUTPUT\> | (V(T1), V(T2)) |
|---|---|---|
| | ——— Vo9 | (C, A) |
| | ——— Vo8 | (C, B) |
| | - - - - - | |
| | - - - - - | |
| C ————————— | ——— Vo7 | (C, C) |
| | - - - - - | |
| | ——— Vo6 | (B, A) |
| B ————————— | ——— Vo5 | (B, B) |
| A ————————— | ——— Vo4 | (A, A) |
| | ——— Vo3 | (A, B) |
| | ——— Vo2 | (B, C) |
| | - - - - - | |
| | ——— Vo1 | (A, C) |

FIG. 20

| <INPUT> | <OUTPUT> | (V(T1), V(T2)) |
|---|---|---|
| | ——— Vo7 | (C, A) |
| | ——— Vo6 | (C, B) |
| C ———————— | ——— Vo5 | (C, C), (B, A) |
| B ———————— | ——— Vo4 | (B, B) |
| A ———————— | ——— Vo3 | (A, A), (B, C) |
| | ——— Vo2 | (A, B) |
| | ——— Vo1 | (A, C) |

FIG. 21

| LEVEL | INPUT VOLTAGE | V(T1) | V(T2) | D4,D3,D2,D1,D0 |
|---|---|---|---|---|
| 1 |  | A1 | B1 | 00000 |
| 2 | A1 | A1 | A1 | 00001 |
| 3 | B1 | B1 | B1 | 00010 |
| 4 |  | B1 | A1 | 00011 |
| 5 |  | A2 | B2 | 00100 |
| 6 | A2 | A2 | A2 | 00101 |
| 7 | B2 | B2 | B2 | 00110 |
| 8 |  | B2 | A2 | 00111 |
| 9 |  | A3 | D3 | 01000 |
| 10 |  | A3 | C3 | 01001 |
| 11 |  | B3 | D3 | 01010 |
| 12 |  | B3 | C3 | 01011 |
| 13 |  | A3 | B3 | 01100 |
| 14 | A3 | A3 | A3 | 01101 |
| 15 | B3 | B3 | B3 | 01110 |
| 16 |  | B3 | A3 | 01111 |
| 17 |  | C3 | D3 | 10000 |
| 18 | C3 | C3 | C3 | 10001 |
| 19 | D3 | D3 | D3 | 10010 |
| 20 |  | D3 | C3 | 10011 |
| 21 |  | C3 | B3 | 10100 |
| 22 |  | C3 | A3 | 10101 |
| 23 |  | D3 | B3 | 10110 |
| 24 |  | D3 | A3 | 10111 |
| 25 |  | A4 | B4 | 11000 |
| 26 | A4 | A4 | A4 | 11001 |
| 27 | B4 | B4 | B4 | 11010 |
| 28 |  | B4 | A4 | 11011 |
| 29 |  | A5 | B5 | 11100 |
| 30 | A5 | A5 | A5 | 11101 |
| 31 | B5 | B5 | B5 | 11110 |
| 32 |  | B5 | A5 | 11111 |

FIG. 22

| LEVEL | INPUT VOLTAGE | V(T1) | V(T2) | D4,D3,D2,D1,D0 |
|---|---|---|---|---|
| 1 |  | A1 | B1 | 00000 |
| 2 | A1 | A1 | A1 | 00001 |
| 3 | B1 | B1 | B1 | 00010 |
| 4 |  | B1 | A1 | 00011 |
| 5 |  | A2 | B2 | 00100 |
| 6 | A2 | A2 | A2 | 00101 |
| 7 | B2 | B2 | B2 | 00110 |
| 8 |  | B2 | A2 | 00111 |
| 9 |  | C2 | D2 | 01000 |
| 10 | C2 | C2 | C2 | 01001 |
| 11 | D2 | D2 | D2 | 01010 |
| 12 |  | D2 | C2 | 01011 |
| 13 |  | C2 | B2 | 01100 |
| 14 |  | C2 | A2 | 01101 |
| 15 |  | D2 | B2 | 01110 |
| 16 |  | D2 | A2 | 01111 |
| 17 |  | A3 | D3 | 10000 |
| 18 |  | A3 | C3 | 10001 |
| 19 |  | B3 | D3 | 10010 |
| 20 |  | B3 | C3 | 10011 |
| 21 |  | A3 | B3 | 10100 |
| 22 | A3 | A3 | A3 | 10101 |
| 23 | B3 | B3 | B3 | 10110 |
| 24 |  | B3 | A3 | 10111 |
| 25 |  | C3 | D3 | 11000 |
| 26 | C3 | C3 | C3 | 11001 |
| 27 | D3 | D3 | D3 | 11010 |
| 28 |  | D3 | C3 | 11011 |
| 29 |  | A4 | B4 | 11100 |
| 30 | A4 | A4 | A4 | 11101 |
| 31 | B4 | B4 | B4 | 11110 |
| 32 |  | B4 | A4 | 11111 |

FIG. 34    PRIOR ART

| LEVEL | INPUT | (Vp1,Vp2) | (D3,D2,D1,D0) |
|---|---|---|---|
| 1 | A | AA | 0,0,0,0 |
| 2 |  | AB | 0,0,0,1 |
| 3 | B | BB | 0,0,1,0 |
| 4 |  | BC | 0,0,1,1 |
| 5 | C | CC | 0,1,0,0 |
| 6 |  | CD | 0,1,0,1 |
| 7 | D | DD | 0,1,1,0 |
| 8 |  | DE | 0,1,1,1 |
| 9 | E | EE | 1,0,0,0 |
| 10 |  | EF | 1,0,0,1 |
| 11 | F | FF | 1,0,1,0 |
| 12 |  | FG | 1,0,1,1 |
| 13 | G | GG | 1,1,0,0 |
| 14 |  | GH | 1,1,0,1 |
| 15 | H | HH | 1,1,1,0 |
| 16 |  | HI | 1,1,1,1 |
| 17 | I | II |  |

※ ORDER OF Vp1, Vp2 IS ARBITRARY

NUMBER OF INPUT VOLTAGES: 16
NUMBER OF TRANSISTORS: 30

OUTPUT CIRCUIT, DIGITAL ANALOG CIRCUIT AND DISPLAY DEVICE

CROSS-REFERENCE TO RELATED APPLICATIONS

This application is a continuation of U.S. application Ser. No. 10/970,706 filed Oct. 21, 2004, by Hiroshi TSUCHI, entitled OUTPUT CIRCUIT, FIGITAL ANALOG CIRCUIT AND DISPLAY DEVICE, which claims the benefit of priority from prior Japanese Patent Application No. 2003-365640, filed on Oct. 27, 2003 and Japanese Patent Application No. 2004-294070, filed on Oct. 6, 2004, the entire contents of which is incorporated herein by reference.

FIELD OF THE INVENTION

This invention relates to a differential amplifier and a display device employing the differential amplifier.

BACKGROUND OF THE INVENTION

Recently, a liquid crystal display device (LCD), featured by thin thickness, lightness of weight and low power consumption, has become popular as a display device, and is now in use for a display device of a mobile information terminal device, such as a portable telephone set (mobile phone or cellular phone), PDA (personal digital assistant) or a notebook PC.

However, the technique for enlarging the size of the liquid crystal display device or for coping with moving pictures has advanced such that not only the LCD for mobile use but also the stationary type large screen display device or a large screen liquid crystal television receiver has become a reality. As the liquid crystal display device, a liquid crystal device of an active matrix driving system, providing for high definition display, is currently in use.

Referring first to FIG. 26, a typical configuration of the liquid crystal display device of the active matrix driving system is explained. In FIG. 26, the major configuration of the connected to a pixel of a liquid crystal display unit is schematically shown by an equivalent circuit.

In general, a display unit 960 of a liquid crystal display device of the active matrix driving system is made up by a semiconductor substrate, including a matrix array of transparent pixel electrodes 964 and thin-film transistors (TFTs) 963, a counter-substrate having a transparent electrode 966 on the entire surface, and a liquid crystal sealed in-between the two substrates. The semiconductor substrate includes the matrix array of 1280×3 columns of pixels by 1024 rows of pixels in the case of a color SXGA panel, as an example.

The TFT 963, having the switching function, has its on/off controlled by the scanning signal, such that, when the TFT 963 is turned on, the grayscale voltage corresponding to a picture signal is applied to the pixel electrode 964, and the liquid crystal has its transmittance changed by the potential difference across the pixel electrodes 964 and the electrode of the counter-substrate 966. This potential difference is maintained by a liquid crystal capacitance 965 for a preset time to display a picture.

On the semiconductor substrate, there is formed a lattice-like interconnection of data lines 962 for sending a plural number of level voltages (grayscale voltages) applied to the pixel electrodes 964, and scanning lines 961 for sending scanning signals. In the case of the color SXGA panel, 1280×3 data lines by 1024 scanning lines are formed on the semiconductor substrate. The scanning lines 961 and the data lines 962 represent a large capacitive load by e.g. the capacitance generated at the intersections and the liquid crystal capacitances sandwiched across the electrodes of the two substrates.

Meanwhile, the scanning signals are supplied from a gate driver 970 to a scanning line 961, whilst the grayscale voltage to the respective pixel electrodes 964 is supplied over a data line 962 by a data driver 980.

Data for one frame is rewritten every frame period (1/60 second) and is selected with each scanning line from one row of pixels to the next (every line). The grayscale voltage is supplied from each data line.

It is sufficient for the gate driver 970 to supply at least two-valued scanning signals, while the data driver 980 is required to drive the data lines with the grayscale voltages of multi-valued levels corresponding to the number of grayscales. Thus, a differential amplifier capable of outputting the voltage to high precision is used as a buffer unit of the data driver 980.

Moreover, the recent tendency is to raise the picture quality (multicolor quality) in the liquid crystal display device, such that there is an increasing demand for at least 2,600,000 colors, corresponding to 6-bit image data for each of R, G and B, and even as many as 26,800,000 colors, corresponding to 8-bit image data for each of R, G and B.

For this reason, a voltage output to an extremely high accuracy is required of the driver, outputting the grayscale voltage corresponding to multi-bit image data. In addition, the number of devices in a circuit unit for processing image data is increased and hence the chip area of the data driver LSI is increased, thereby raising the cost. This problem is discussed in detail hereinbelow.

FIG. 27 shows the configuration of the data driver 980 of FIG. 26. Referring to FIG. 27, the data driver 980 is made up by a latch address selector 981, a latch 982, a grayscale voltage generating circuit 983, a plural number of decoders 984, and a plural number of buffer circuits 985.

The latch address selector 981 determines the data latch timing based on a clock signal CLK.

The latch 982 latches video digital data signals, based on a timing, as determined by the latch address selector 981, and output data signals to the respective decoders 984 at a time, responsive to a STB (strobe signal).

The grayscale voltage generating circuit 983 generates a number of grayscale voltages, which stand for a number of grayscales corresponding to input data.

The decoder 984 selects one grayscale voltage, corresponding to the input data, to output the so selected grayscale voltage.

The buffer circuit 985 is supplied with the grayscale voltage, output from the decoder 984, which is then subjected to current amplification and output as an output voltage Vout.

For example, in case 6-bit video data is supplied, the number of the grayscales is 64, and the grayscale voltage generating circuit 983 generates 64 levels of the grayscale voltages. The decoder 984 is configured for selecting one of the 64-level grayscale voltages.

On the other hand, in case 8-bit image data is input, the number of grayscales is 256. The grayscale voltage generating circuit 983 generates 256 levels of the grayscale voltages. The decoder 984 is configured for selecting one of the 256-level grayscale voltages.

If the video data is multi-bit data, in this manner, the grayscale voltage generating circuit 983 and the decoder 984 are increased in circuit size. For example, if the video data is increased from e.g. 6 bits to 8 bits, the circuit size is increased by a factor not less than four. Hence, as the video data becomes multi-bit data, the chip area of the data driver LSI is increased to raise the cost.

In contradistinction to the foregoing, such a configuration which will minimize the increase in the chip area of the data driver LSI, even though the video data becomes multi-bit data, has been proposed in the Patent Document1 or in the Patent Document2, recited hereinbelow. FIG. 28 shows an example of the configuration proposed in the Patent Document1.

Referring to FIG. 28, the data driver differs from that shown in FIG. 27 in the configuration of a grayscale voltage generating circuit 986, a decoder 987 and a buffer circuit 988.

With the grayscale voltage generating circuit 986 of FIG. 27, the grayscale voltages are generated every two grayscales to decrease the number of grayscale voltage lines of the decoder 987 to approximately one-half of the number of the decoders 984 of FIG. 28.

The decoder 987 is responsive to the video data to select two grayscale voltages to output the selected grayscale voltages to the buffer circuit 988. The buffer circuit 988 is able to current-amplify the input two grayscale voltages and a grayscale voltage intermediate between the two grayscale voltages to output the resulting voltages.

With the configuration, shown in the Patent Documents 1 and 2, provided with the buffer circuits 988, each designed to be supplied with the two grayscale voltages to output one of the two grayscale voltages and the intermediate voltage, the number of the grayscale voltage lines of the decoder 987 may be halved in order to reduce the circuit scale of the decoders 987 to save the area and hence the production cost. It is therefore possible to suppress the increase in the chip area of the data driver LSI against the increase in the number of bits of the video data signals.

As a differential amplifier for the buffer circuits 988, a configuration shown in FIG. 5B of the Patent Document 1, or a configuration shown in FIG. 15 of the Patent Document 2, has been proposed. The configuration shown in FIG. 5B of the Patent Document 1, in which an output of the differential pair is an input end of a current mirror, which is arranged in a diode-connection, is thought not to operate as a differential amplifier.

However, from FIG. 15 of the Patent Document 2, relevant to the Patent Document 1, the illustrative features of the differential amplifier, proposed in the Patent Documents 1 and 2, presumably reside in those of the differential amplifier, having a differential state 910, as shown in FIG. 29.

FIG. 29 shows the configuration of a two-input differential amplifier. A differential stage 910 is featured by transistors 903 and 904 of a second differential pair being connected parallel to transistors 901 and 902 of a first differential pair, with the two differential pairs being driven by a common current source 907. The gates of the transistors 901 and 903 are supplied with grayscale voltages Vp1 and Vp2, respectively, while the gates of the transistors 902 and 904 are connected in common and supplied with an output Vn1 of the differential amplifier in a feedback fashion. Output pairs of the first and second differential pairs are connected to input and output ends of the current mirror circuit (905, 906), to perform an amplifying operation conforming to a common output signal of the first and second differential pairs.

In the above-described configuration of the differential amplifier, the output voltage Vn1 is equal to the input voltage when the voltages Vp1 and Vp2 are the same input voltage and, when the voltages Vp1 and Vp2 differ from each other, the output voltage Vn1 is intermediate between the voltages Vp1 and Vp2.

[Patent Document 1]
Japanese Patent Kokai Publication No. JP-A-2001-34234 (FIGS. 5, 20, 21)

[Patent Document 2]
Japanese Patent Kokai Publication No. JP-A-2001-343948 (FIG. 15)

SUMMARY OF THE DISCLOSURE

In connection with the differential amplifier, shown in FIG. 29, it has been pointed out that, if, in outputting a voltage intermediate between two input voltages, the voltage difference between the two input values is large, the output voltage is not an intermediate voltage and is offset towards one of the two input voltages (see page 13 paragraph [0113] of Patent Document 1).

On the other hand, in the liquid crystal display, the output voltage characteristic of a data driver is as shown in FIG. 30 (corresponding to FIG. 20(b) of the Patent Document1), in which, while the potential difference between different grayscales is small in an intermediate portion of grayscale data, the potential difference between different grayscales is large in the lower and higher portions of the grayscale data.

Hence, the problem arises that, when the differential amplifier is used as an output buffer circuit of the data driver of the liquid crystal display device, it can be used only for the intermediate portion of the grayscale data, while it cannot be used in other than this intermediate portion (second problem).

Thus, in the aforementioned Patent Document 1, the configuration of FIG. 31 (corresponding to FIG. 21 of the Patent Document 1) is stated as a data driver of the liquid crystal display device.

The configuration of the data driver, shown in FIG. 31, differs from the data driver, shown in FIG. 28, as to the configuration of the grayscale voltage generating circuit. In the configuration of FIG. 31, the grayscale voltage generating circuit generates grayscale voltages (V0, V1, V2, ..., Vk and Vn, V(n+1), ..., V(m−1)), every grayscale, for the grayscale voltage corresponding to low-side grayscale data and high-side grayscale data, while generating the grayscale voltages (Vk, V(k+2), V(k+4), ..., Vn every two grayscales, for the grayscale voltage corresponding to the intermediate grayscale data.

Thus, in case the differential amplifier, shown in FIG. 29, is used for an output buffer circuit 988 of the data driver of the liquid crystal device, shown in FIG. 31, the possible ratio of reduction of the number of data lines is lowered. Consequently, a problem arises that the effect of reduction of the circuit scale of the decoder 987 or of reduction of the area of the data driver LSI (third problem) becomes smaller.

The following is the results of our searches into characteristics of the differential amplifier of FIG. 29, disclosed in e.g. the Patent Document 1, and into the problem of the differential amplifier of FIG. 29.

FIG. 32 illustrates the operation in case the intermediate voltage Vn1 between the input voltages Vp1 and Vp2 is output by the differential amplifier of FIG. 29. Reference is now made to FIG. 32 for explanation.

Assume that the transistors of the two differential pairs (901, 902) and (903, 904) of the differential amplifier of FIG. 29 are of the same size, and that the currents flowing through the transistors 901 to 904 are Ia, Ib, Ic and Id, respectively.

FIG. 32 shows an example in which the input voltage Vp1<input voltage Vp2. FIG. 32, showing the relationship between the drain-to-source current Ids (ordinate) and the voltage V as from the power supply VSS (abscissa), depicts a characteristic curve for the transistors 901 to 904. With use of this figure, the operation of the amplifier can be understood relatively readily.

Since the two differential pairs have sources tied in common, and are of the same transistor size, the operating points of the transistors of the two differential pairs are on the common characteristic curve, shown in FIG. 32.

Since the currents flowing through the input and output ends of the current mirror (905, 906) are the same, the relationship of the following equation (1) holds for the currents flowing through the respective transistors of the two differential pairs.

$$Ia+Ic=Ib+Id \quad (1)$$

Moreover, since the transistors 902 and 904 have their gate, sources and drains connected in common respectively, we have the relationship of the following equation (2).

$$Ib=Id \quad (2)$$

From the above two equations, Ib and Id are of a size bisecting Ia and Ic. The corresponding voltage is Vn1.

Since the characteristic curve is a quadratic curve, the characteristic curve may be approximated by a straight line when the voltage difference between the voltages Vp1 and Vp2 is small, as may be seen from FIG. 32, so that the voltage Vn1 is a voltage bisecting the voltages Vp1 and Vp2 (intermediate voltage).

However, as the voltage difference between the voltages Vp1 and Vp2 becomes larger, the voltage Vn1 shifts towards the high potential side Vp2.

For verifying this more concretely, we conducted the simulation using the differential amplifier shown in FIG. 29. The results of the simulation are shown in FIG. 33 showing output characteristics in case the input voltage Vp1 is constant and Vp2 is changed in a range of ±0.5V with respect to Vp1. In the drawing, a broken line designates an output expected value bisecting the voltages Vp1 and Vp2.

It may be seen from FIG. 33 that the voltage Vn1 is closer to the output expected value, for the range of Vp2 to Vp1 of ±0.1V. However, for the range of Vp2 to Vp1 of +0.5V, the voltage Vn1 deviates appreciably from the output expected value, and is shifted towards the input voltage Vp1 or Vp2, whichever is higher.

Thus, with the differential amplifier, shown in FIG. 29, a further problem arises that the voltage intermediate between the two input voltages may be output only when the potential difference between the two input voltages is extremely small.

The decoder 987 of the data driver, shown in FIG. 28, is analyzed in detail. The grayscale voltage generating circuit 986 of FIG. 28 generates grayscale voltages every two grayscales to reduce the number of the grayscale voltage lines of the decoder 987 to about one-half of the number of the grayscale voltage lines of the decoder 987 of the data driver, shown in FIG. 28. However, such a problem has also been found to persist that, since the number of the transistors, forming the decoder, is not decreased appreciably, the space saving effect is low, as evidenced by our researches. This problem is now discussed, by referring to FIGS. 34 and 35, for a case of the decoder 987 supplied with 4-bit data.

FIG. 34 shows the relationship of the input/output correspondence of the decoder 987 and the buffer circuit 988 of FIG. 28. FIG. 34 provides nine grayscale voltages A to I, every two grayscales, for 17 output levels, and shows the combinations of the two grayscale voltages, selected by the decoder 987, in a column labeled (Vp1, Vp2).

For example, with the first level, the input voltage (grayscale voltage) A is output from the buffer circuit 988. Hence, the decoder 987 selects (A, A) as two voltages (Vp1, VP2) to be supplied to the buffer circuit 988.

For the second level, an intermediate voltage of the first and third level input voltages (grayscale voltages) A and B is output from the buffer circuit 988. Hence, the decoder 987 selects (A, B) as two voltages (Vp1, VP2) to be supplied to the buffer circuit 988.

In similar manner, combinations of (Vp1, Vp2) corresponding to 17 levels are determined.

In FIG. 34, 1 to 16 levels are associated with the 4-bit data (D3, D2, D1, D0).

That is, with the method consisting in being selectively supplied with two grayscale voltages to send out one of the two grayscale voltages and an intermediate voltage, as disclosed in the Patent Document1, the number of the output levels plus one level is required, while the number of the input voltages (grayscale voltages) required is equal to one-half the number of the output levels plus one.

FIG. 35 shows a specified example of the configuration of the decoder 987 which is made up of n-channel transistors and which is designed for selecting the combinations of (Vp1, Vp2) of FIG. 34. The grayscale voltages, selected from nine input voltages (grayscale voltages) A to I, by the 4-bit data signals (D3, D2, D1, D0) and inverted signals thereof (D3, D2, D1, D0), are output to the output lines (Vp1, Vp2). Meanwhile, the decoder of the p-channel transistor configuration may readily be implemented by interchanging the data signals of the respective bits and inverted versions thereof.

In the exemplary decoder configuration, shown in FIG. 35, there is shown a configuration in which bit lines (D1, D1B) are added and the bits are divided into upper three bits (D3, D2, D1) and lower two bits (D1, D0). The configuration of the upper bits (D3, D2, D1) is of the tournament type in which the number of the transistors is minimum. In the decoder shown in FIG. 35, two grayscale voltages are selected by the upper three bits (D3, D2, D1), and the grayscale voltages output to the output lines (Vp1, Vp2) are selected by the lower two bits (D1, D0). In this case, the 4-bit decoder of FIG. 35 is made up by 9 input voltages (grayscale voltages), 10 bit lines and 30 transistors (transistors 401 to 430). It is also possible to divide the bits into upper two bits (D3, D2) and lower two bits (D1, D0). That is, the three grayscale voltages are selected by upper two bits (D3, D2), and the grayscale voltages, to be sent out to the output lines (Vp1, Vp2), are selected from the three grayscale voltages by the lower two bits (D1, D0), although this configuration is not shown. In this case, it is necessary to add grayscale voltage lines.

For comparison with the decoder 987 of FIG. 35, the configuration of the decoder 984 of FIG. 27 (n-channel transistor configuration) is shown in FIG. 36.

With the configuration shown in FIG. 36 in this case, showing a tournament configuration in which the number of transistors is minimum, the 4-bit decoder of FIG. 35 is made up by 16 input voltages (grayscale voltages), 8 bit lines and 30 transistors (transistors 501 to 530).

It may be seen from comparison of the decoder configurations of FIGS. 35 and 36 that, although the number of input voltages (grayscale voltages) of the decoder configuration of FIG. 35 is approximately halved, the number of the transistors remains the same. That is, the decoder 987 of FIG. 28, disclosed in the aforementioned Patent Document1, suffers from the problem that, in general, the number of the transistors, making up the decoder, is not drastically decreased, so that the space saving effect is only low.

In consideration of the above problems, it is desirable that the differential amplifier, used in the output buffer circuit 988, is able to output three or more multi-valued voltage levels, for two input voltages, and that the respective output levels may be output to high precision over a wide voltage range.

Accordingly, it is an object of the present invention to provide an output circuit including an amplifier for outputting up to a maximum of multi-valued voltage levels for two input voltages to diminish the number of input voltages as required and the number of transistors to save the space. It is another object to provide a digital-to-analog converter for outputting up to a maximum of multi-valued voltage levels for two input voltages to diminish the number of input voltages as required and the number of transistors to save the space.

It is still another object of the present invention to provide a space-saving low-cost data driver, employing the above output circuit, and a display device including the data driver.

The above and other objects are attained by an output circuit in accordance with one aspect of the present invention, which comprises a selection circuit supplied with a plurality of m reference voltages having respective different voltage values to select two of the same or different reference voltages out of the m reference voltages, based on an input selection signal, to send the selected reference voltages to first and second terminals, and an amplifier supplied with the voltages supplied to the first and second terminals to extrapolate the voltages at the first and second terminals by a preset extrapolation ratio to send out the resulting voltage at an output terminal. A number equal to a second power of m at the maximum of respective different voltage levels can be output from the output terminal responsive to the input selection signal.

A digital-to-analog converter in accordance with another aspect of the present invention, comprises a selection circuit supplied with m reference voltages of respective different voltage values to select two reference voltages of the same or different values out of the m reference voltages, with a digital data signal entered from a data input terminal as a selection signal, to send out the selected voltages to first and second terminals, and an amplifier supplied with the voltages supplied to the first and second terminals to extrapolate the voltages at the first and second terminals by a preset extrapolation ratio to send out the resulting voltage at an output terminal. A number equal to the second power of m at the maximum of respective different voltage levels can be output from the output terminal, depending on the value of the digital data signal.

In the output circuit or in the digital-to-analog converter, according to the present invention, the selection circuit is supplied with a first reference voltage (A) and with a second reference voltage (B) having respective different voltage values. The selection circuit supplies one out of reference voltage pairs of first and second reference voltages (A, B), first and first reference voltages (A, A), second and second reference voltages (B, B) and second and first reference voltages (B, A) to the first and second terminals, based on the selection signal, whereby a number of respective different voltage levels equal to four at the maximum can be output from the output terminal.

In the output circuit or in the digital-to-analog converter, according to the present invention, the extrapolation ratio is 1:2, with the sum of the output voltage and the input voltage to the second terminal being twice as large as the input voltage to the first terminal. The first and second reference voltages are of second and third levels out of first to fourth levels equally spaced. A sum total of four voltage levels from an output voltage of the first level by the selection of the pair of the first and second reference voltages (A, B) in the selection circuit up to an output voltage of the fourth level by the selection of the pair of the second and first reference voltages (B, A) is output.

In the output circuit or in the digital-to-analog converter, according to the present invention, the selection circuit is supplied with first to fourth reference voltages (A to D) of respective different voltage values to send any of paired reference voltages of first and fourth reference voltages (A, D), first and third reference voltages (A, C), second and fourth reference voltages (B, D), second and third reference voltages (B, C), first and second reference voltages (A, B), first and first reference voltages (A, A), second and second reference voltages (B, B), second and first reference voltages (B, A), third and fourth reference voltages (C, D), third and third reference voltages (C, C), fourth and fourth reference voltages (D, D), fourth and third reference voltages (D, C), third and second reference voltages (C, B), third and first reference voltages (C, A), fourth and second reference voltages (D, B), and fourth and first reference voltages (D, A), to the first and second terminals, based on the selection signals, to enable a number equal to a second power of 4 at the maximum of respective different voltage levels to be output from the output terminal.

In the output circuit or in the digital-to-analog converter, according to the present invention, the extrapolation ratio is 1:2, with the sum of the output voltage and the input voltage to the second terminal being twice as large as the input voltage to the first terminal. The first to fourth reference voltages are of sixth, seventh, tenth and eleventh levels out of first to 16th levels equally spaced apart from one another. A sum total of 16 voltage levels from an output voltage of the first level by the selection of the pair of the first and fourth reference voltages (A, D) in the selection circuit up to an output voltage of the 16th level by the selection of the pair of the fourth and first reference voltages (D, A) is output.

In the output circuit or the digital-to-analog converter, according to the present invention, the range of the output voltage, prescribed by the lower and upper limits of the outputtable output voltage, is divided into a plurality (n) of non-overlapping sections. At least two reference voltages, having respective different voltage levels, and which are associated with the respective sections, are provided for the respective sections, such that, in each section, up to a maximum of a second power of n of output voltages may be output by the n reference voltages. There may be overlapping outputtable voltage levels across different sections.

In the output circuit or the digital-to-analog converter according to the present invention, the separation of at least one pair of neighboring output voltage levels may differ from that of another pair of neighboring output voltage levels. With this configuration, the number of reference voltages supplied to the selection circuit may be increased to realize desirable non-linear input/output characteristics, such as interpolation of gamma characteristics.

In the output circuit or the digital-to-analog converter according to the present invention, the amplifier may be provided with a capacitance and a differential amplifier. In addition, means may be provided for applying the differential voltage between the input voltages applied to the first and second terminals as a voltage across the terminals of the capacitor, and for managing control to output a voltage which extrapolates the input voltages applied to the first and second terminals by adding the voltage across the terminals of the capacitor to one of the first and second terminals or subtracting the voltage across the terminals of the capacitor from one of the first and second terminals.

In the output circuit or the digital-to-analog converter according to the present invention, the amplifier includes an amplifier stage at least including first and second input terminals, an output terminal, a first differential pair having an input pair, one input of which is connected to the first input terminal and the other input of which is connected to the output terminal, a second differential pair having an input pair, one input of which is connected to the first input terminal and the other input of which is connected to the second input terminal, a first current source for supplying the current to the first differential pair, a second current source for supplying the current to the second differential pair, and a load circuit connected to output pairs of the first and second differential pairs. At least one output of the output pair of the first differential pair is connected common to one output of the output pair of the second differential pair. The amplifier stage has an input end connected to a common connection node of one output of the output pair of the first differential pair and one output of the output pair of the second differential pair, while having an output end connected to the output terminal.

In the output circuit or the digital-to-analog converter according to the present invention, the selection circuit is supplied with first to m'th reference voltages having respective different voltage values, where m=$2^K$ (K-th power of 2, K being a preset positive integer). The selection circuit selects one of voltage pairs corresponding to the $4^K$ combinations (K-th power of 4 of combinations) of first to $2^{K'}$th reference voltages, based on the selection signal, to send the selected voltage pair to the first and second terminals, so that up to a maximum of $4^K$ different voltage levels may be output from the output terminal.

In the output circuit or the digital-to-analog converter according to the present invention, in case the extrapolation ratio is 1:2, the sum of the output voltage and the input voltage to the second terminal is twice as large as the input voltage to the first terminal. The selection circuit is supplied with first to m'th reference voltages having respective different voltage values, where m=$2^K$ (K'th power of 2, K being a preset positive integer). The first to $2^{K'}$th reference voltages are of the levels, out of equally spaced first to $4^{K'}$th level, $4^K$ being K'th power of 4, represented by $$\{1+a \times 4^{(K-1)} + b \times 4^{(K-2)} + c \times 4^{(K-3)} + \ldots \}$$

where a, b, c, . . . is 1 or 2 and, if the term of K'th power of 4 is of a value less than 1, that is, if $4^{(K-X)} < 1$, X being an integer, the term of K'th power of 4 is set to 0, a sum total of $4^K$ respective different voltage levels of from first level to the $4^{K'}$th level are output from the output terminal responsive to the selection signal.

A display device in a further aspect of the present invention includes the output circuit as a driver driving data lines.

A digital-to-analog converter or an output circuit according to another aspect of the present invention comprises:

a circuit for generating a plural number (m×S) of reference voltages having respective different voltage values, where m and S are predetermined positive integer;

an output terminal;

at least one decoder block, receiving said (m×S) reference voltages and an input digital data signal having plural bits, for selecting two voltages based on first to third bit groups each composing a predetermined bit field of the input digital data signal to supply selected voltages to first and second terminals; and an amplifier, receiving the voltages supplied to said first and second terminals, for extrapolating the voltages of said first and second terminals by a preset extrapolation ratio to output the resulting voltage at said output terminal;

said decoder block comprising first to third stages of circuit blocks; wherein said first stage includes first to S'th circuit blocks each receiving each m reference voltages and selecting two voltages including an overlap to supply the selected voltages in accordance with the value of the first bit group;

said second stage includes a first circuit block receiving one of two voltages output from each of first to S'th circuit blocks of the first stage and selecting one voltage out of the S voltages received to output the selected voltage in accordance with the value of the second bit group and a second circuit block receiving another one of the two voltages output from each of S circuit blocks of the first stage and selecting one voltage out of the S voltages received to output the selected voltage in accordance with the value of the second bit group; and said third stage includes a circuit block receiving two voltages selected and output from said first and second circuit blocks of the second stage and performing control so as to supply the two voltages received to the first and second terminals or not to output the two voltages received to the first and second terminals in accordance with the value of the third bit group; and wherein any one voltage level out of (m²×S) voltage levels having respective different values is output from said output terminal in accordance with the signal values of said first, second and third bit groups. In the digital-to-analog converter or the output circuit according to the present invention, in case bits in the third bit group are included in the first bit group and/or the second bit group, the third stage circuit block is omitted and the outputs of two circuit blocks of the second stage are supplied to the first and second terminals.

A digital-to-analog converter or an output circuit according to another aspect of the present invention comprises:

a circuit for generating a plural number (m×S) of reference voltages having respective different voltage values, where m and S are predetermined positive integer;

an output terminal;

at least one decoder block, receiving said (m×S) reference voltages and an input digital data signal having plural bits, for selecting two voltages based on first to third bit groups each composing a predetermined bit field of the input digital data signal to supply selected voltages to first and second terminals; and an amplifier, receiving the voltages supplied to said first and second terminals, for extrapolating the voltages of said first and second terminals by a preset extrapolation ratio to output the resulting voltage at said output terminal;

said decoder block comprising first to third stages of circuit blocks; wherein said first stage includes first to m'th circuit blocks each receiving each S reference voltages and selecting one voltages to supply the selected voltage in accordance with the value of the first bit group;

said second stage includes a circuit block receiving m voltages output from each of first to m'th circuit blocks of the first stage and selecting two voltage out of the m voltages received to output the selected two voltage in accordance with the value of the second bit group; and said third stage includes a circuit block receiving two voltages output from said circuit block of the second stage and performing control so as to supply the two voltages received to the first and second terminals or not to output the two voltages received to the first and second terminals in accordance with the value of the third bit group; and wherein any one voltage level out of (m²×S) voltage levels having respective different values is output from the output terminal in accordance with the signal values of said first, second and third bit groups. The digital-to-analog converter or the output circuit according to the present invention, may comprises plurality of said decoder blocks having the common m or respectively different values of m, wherein in the decoder block having the maximum value of said m, in case bits in the third bit group are included in the first bit group and/or the second bit group, the third stage circuit block is omitted and the outputs of the second stage circuit block are supplied to the first and second terminals.

In a digital-to-analog converter or an output circuit according to another aspect of the present invention, in case m is set to $2^K$, where K is a preset positive integer; the selection circuit, which receives first to m ($=2^K$)'th reference voltages and outputs the selected voltages to said first and second terminals based on first to 2K signal constituting total 2K bits, includes first to K'th columns of circuit blocks, each comprising four input terminals for receiving voltage signals and two output terminals for outputting voltage signals selected based on two bit signals; wherein said first column includes (K−1)'th power of 2 pieces of said circuit blocks, each having each two input terminals tied together to compose two separate input ends and receiving each two reference voltages out of first to $2^K$'th reference voltages at said input ends, for selecting two voltage signals based on the first and second signals to output the selected two voltage signals to the two output terminals thereof respectively; and the F'th column (where F is any one of integers from 2 to K) includes (K−F)'th power of 2 pieces of said circuit blocks, each receiving output voltage signals of each two circuit blocks of (F−1)'th columns and selecting two voltages signals based on the (2F−1)'th and 2F'th signals to output the selected two voltages signals to the two terminals thereof respectively; the two output voltage signals output from the K'th column being supplied to said first and second terminals.

The meritorious effects of the present invention are summarized as follows.

According to the present invention, such a meritorious effect may be achieved that, in a DAC employing a differential amplifier capable of outputting a sum total of four levels, namely two input voltages and extrapolated voltages thereof, up to a maximum of a square of m of voltage levels may be output against m input voltages.

According to the present invention, such a meritorious effect may be achieved that, in a decoder outputting two voltages selectively supplied to two input terminals of the differential amplifier, not only the number of input voltages (grayscale voltage lines) and the number of transistors may drastically be diminished, but the space saving may be achieved.

According to the present invention, in which the differential amplifier and the decoder are used, it is possible to save the space and to lower the cost in the data driver LSI, or to reduce the cost and to narrow the margin of the frame in the display device including the data driver.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 7 shows the input/output level correspondence of a 2-bit DAC embodying the present invention.

FIG. 10 shows an example of input/output level correspondence for the number m of input voltages, allowed to be supplied to the amplifier 13 of FIG. 1, being 4 (M=4).

FIG. 11 shows another example of input/output level correspondence of a 4-bit DAC of the present invention.

FIG. 16 shows the input/output level correspondence of a 6-bit DAC of a modification of the present invention.

FIG. 19 shows an example of the correlation of the input and output levels for a case where the number of input voltages m=3.

FIG. 20 shows an example of the correlation of the input and output levels for a case where the number of input voltages m=3.

FIG. 21 shows an example of the correlation of the input and output levels for a 5-bit DAC according to a modification of the present invention.

FIG. 22 shows another example of the correlation of the input and output levels for a 5-bit DAC according to the modification of the present invention.

FIG. 34 shows the input/output correlation of a decoder 987 and a buffer circuit 988 of FIG. 28.

FIG. 42 shows an example of the input/output correspondence of a DAC according to another embodiment of the present invention.

PREFERRED EMBODIMENTS OF THE INVENTION

Figure 1:
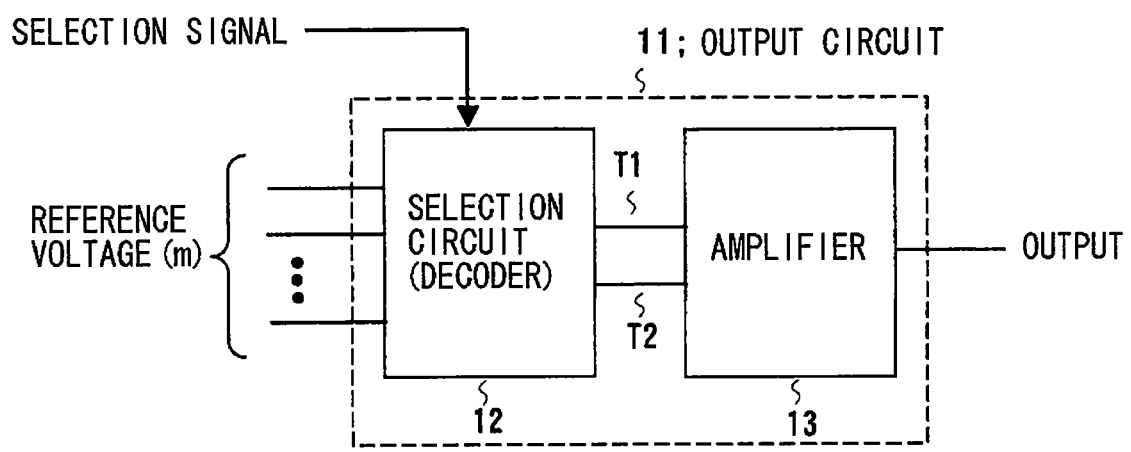
FIG. 1 shows a configuration of an output circuit embodying the present invention.

The preferred embodiments of the present invention are hereinafter described. An output circuit (11) according to a preferred embodiment of the present invention includes a selection circuit (12) which receives plural (m) reference voltages having respective different voltage values and selects two of the same or different reference voltages out of the m reference voltages, based on an input selection signal, to output the two selected reference voltages, and an amplifier (13) which has first and second input terminals for receiving the two selected reference voltages and extrapolates the voltages at the first and second terminals by a preset extrapolation ratio to output the resulting voltage. This circuit is used as a digital analog converter which uses a digital data signal as a selection signal, and which outputs a voltage of a level corresponding to the level of the digital data signal.

According to the present invention, any optional circuit configuration may be used for the amplifier (13) provided that the voltage across the first and second input terminals is extrapolated. For example, the amplifier may includes a capacitor having two terminals, across which the differential voltage of the first and second input terminals is applied, and a differential amplifier outputting a voltage which is the extrapolated voltage of the voltages of the first and second input terminals, based on one of the first and second input terminal voltages and the differential voltage across the capacitor terminals.

In an embodiment of the present invention, the amplifier (13) includes first and second input terminals (T1, T2), an output terminal (3), a differential stage connected to the first and second input terminals, and an amplifier stage (6) which has an input end connected to an output end of the differential stage and has an output end connected to the output terminal.

The differential stage at least includes a first differential pair (101, 102) having an input pair, one input of which is connected to the first input terminal and the other input of which is connected to the output terminal, a second differential pair (103, 104) having an input pair, one input of which is connected to the first input terminal (T1), and the other input of which is connected to the second input terminal (T2), a first current source (126) for supplying current to the first differential pair (101, 102), a second current source (127) for supplying current to the second differential pair (103, 104), and a load circuit (111, 112) connected to output pairs of the first and second differential pairs. One output of the output pair of the first differential pair (101, 102) and one output of the output pair of the second differential pair (103, 104) are connected in common and the common connecting node operates as an output end (4) of the differential stage.

The amplifier stage (6) may be constructed by a differential amplifier stage, the differential input ends of which may be connected to connection points of the output pair of the first differential pair (101, 102) and output pair of the second differential pair (103, 104).

In an embodiment of the present invention, the selection circuit 12 receives a first reference voltage (A) and a second reference voltage (B) having respective different voltage values.

The selection circuit (12) supplies one out of reference voltage pairs of first and second reference voltages (A, B), first and first reference voltages (A, A), second and second reference voltages (B, B) and second and first reference voltages (B, A) to the first and second terminals (T1, T2), based on the selection signal, whereby a number of respective different voltage levels equal to four at the maximum can be output from the output terminal.

This selection circuit (12) is configured so as to select the first and second reference voltages (A, B), based on a first signal (D0) and a second signal (D1), forming the selection signal, totaling at two bits, to send out the selected voltages to the first and second terminals.

More specifically, the selection circuit (12) preferably includes a first switch (302) connected across the first reference voltage (A) and the second terminal (T2) and having the first signal (D0) supplied to a control terminal thereof, a second switch (301) connected across the first reference voltage (A) and the first terminal (T1) and having a complementary signal (D1B) of the second signal supplied to a control terminal thereof, a third switch (303) connected across the second reference voltage (B) and the first terminal (T1) and having the second signal supplied to a control terminal thereof, and a fourth switch connected (304) across the second reference voltage (B) and the second terminal (T2) and having a complementary signal (D0B) of the first signal supplied to a control terminal thereof.

In an output circuit, according to an embodiment of the present invention, the extrapolation ratio is 1:2, and the sum of the output voltage Vout and the input voltage V(T2) supplied to the second terminal (T2) is twice as large as the input voltage V(T1) supplied to the first terminal (T1).

The first and second reference voltages (A, B) are the second and third levels, out of the first to fourth levels, spaced apart equally from one another.

A sum total of four levels of voltages, from the output voltage of the first level by the selection of the pair of the first and second reference voltages (A, B) to the output voltage of the fourth level by the selection of pair of the second and first reference voltages (B, A), is output.

In a further embodiment of the present invention, the selection circuit (12) receives first to fourth reference voltages (A to D) of respective different voltage values to send any of paired reference voltages of:

(1) first and fourth reference voltages (A and D);
(2) first and third reference voltages (A and C);
(3) second and fourth reference voltages (B and D);
(4) second and third reference voltages (B and C);
(5) first and second reference voltages (A and B);
(6) first and first reference voltages (A and A);
(7) second and second reference voltages (B and B);
(8) second and first reference voltages (B and A);
(9) third and fourth reference voltages (C and D);
(10) third and third reference voltages (C and C);
(11) fourth and fourth reference voltages (D and D);
(12) fourth and third reference voltages (D and C);
(13) third and second reference voltages (C and B);
(14) third and first reference voltages (C and A);
(15) fourth and second reference voltages (D and B); and
(16) fourth and first reference voltages (D and A);

to the first and second terminals, based on the selection signals, to enable a number equal to a second power of 4 at the maximum of respective different voltage levels to be output from the output terminal.

In the present embodiment, the selection circuit is configured for selecting the first to fourth reference voltages (A,B,C and D), based on first to fourth signals (D0, D1, D2 and D3), forming the selection signal, totaling at four bits, to send out the selected voltages to the first and second terminals (T1 and T2), in which the selection circuit comprises:

first and second switches (401 and 402) connected across the first terminal (T1) and a supply terminal of the first reference voltage (A) and supplied with a complementary signal (D1B) of the second signal and with a complementary signal (D3B) of the fourth signal;

third and fourth switches (403 and 404) connected across the second terminal (T2) and the supply terminal of the first reference voltage (A) and supplied with the first signal (D0) and the third signal (D2) at control terminals thereof;

fifth and sixth switches (405 and 406) connected across the first terminal (T1) and a supply terminal of the second reference voltage (B) and supplied with the second signal (D1) and with a complementary signal (D3B) of the fourth signal;

seventh and eighth switches (407 and 408) connected across the second terminal (T2) and the supply terminal of the second reference voltage (B) and supplied with a complementary signal (D0B) of the first signal and the third signal (D2) at control terminals thereof;

ninth and tenth switches (409 and 410) connected across the first terminal (T1) and a supply terminal of the third reference voltage (C) and supplied with a complementary signal (D1B) of the second signal and with the fourth signal (D3);

11th and 12th switches (411 and 412) connected across the second terminal (T2) and the supply terminal of the third reference voltage (C) and supplied with the first signal (D0) and with a complementary signal (D2B) of the third signal at control terminals thereof;

13th and 14th switches (413 and 414) connected across the first terminal (T1) and a supply terminal of the fourth reference voltage (D) and supplied with the second signal (D1) and the fourth signal (D3) at control terminals thereof; and 15th and 16th switches (415 and 416) connected across the second terminal (T2) and the supply terminal of the fourth reference voltage (D) and supplied with a complementary signal (D0B) of the first signal and with a complementary signal (D2B) of the third signal at control terminals thereof.

The third and the 11th switches (403 and 411), supplied with the first signal common at the control terminals thereof, are made up of a co-used sole switch or two switches.

The seventh and 15th switches (407 and 415), supplied common with the complementary signal of the first signal at the control terminals thereof, are made up of a co-used sole switch or two switches.

The fifth and the 13th switches (405 and 413), supplied common with the second signal at the control terminals thereof, are a co-used sole switch or two switches.

The ninth switches (401 and 409), supplied common with the complementary signal of the second signal at the control terminals thereof, are made up of a co-used sole switch or two switches.

Figure 12:
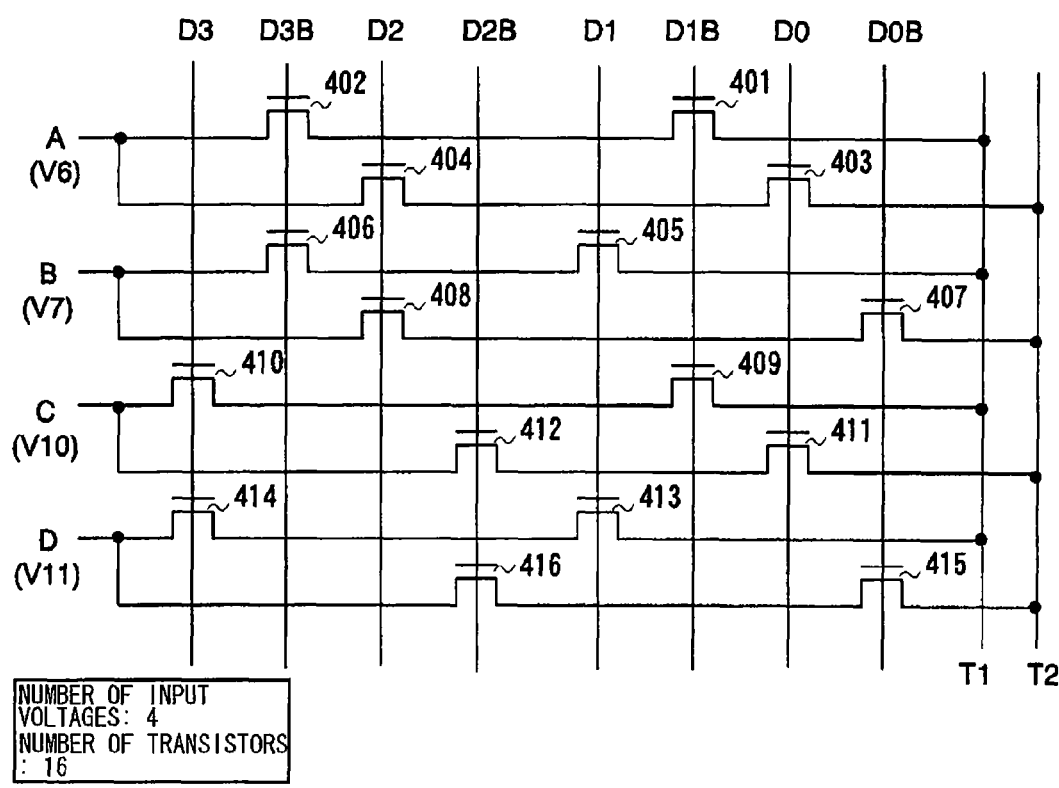
FIG. 12 shows an illustrative configuration of a 4-bit decoder (Nch) for implementing the correlation of FIG. 11.

If the third and the 11th switches (403 and 411), the seventh and the 15th switch (407 and 415), the fifth and 13th switch (405 and 413) and the first and ninth switch (407 and 415) are formed by respective two switches, the configuration is as shown in FIG. 12, with the number of the switch devices being 16.

Figure 13:
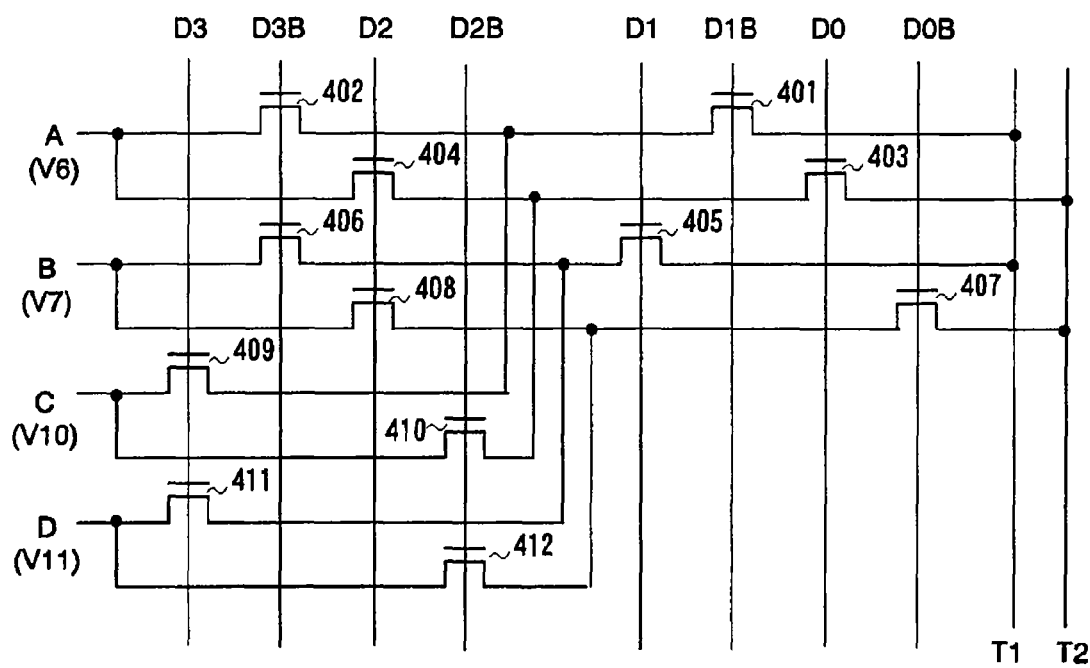
FIG. 13 shows a modification example of FIG. 12.

If the respective pairs are formed by respective sole switches, the configuration is as shown in FIG. 13, with the number of the switch devices being 12.

In the present embodiment, the extrapolation ratio is 1:2, with the sum of the output voltage and the input voltage to the second terminal being twice as large as the input voltage to the first terminal. The first to fourth reference voltages being sixth, seventh, tenth and eleventh levels out of first to 16th levels equally spaced apart from one another. A sum total of 16 voltage levels from an output voltage of the first level by the selection of the pair of the first and fourth reference voltages (A, D) in the selection circuit up to an output voltage of the 16th level by the selection of the pair of the fourth and first reference voltages (D, A) is output.

In a further embodiment of the present invention, an interval between at least a pair of neighboring output voltage levels, out of up to the maximum of a second power of m ($m^2$), may differ from an interval of another pair of neighboring output voltage levels, and exhibits non-linear input/output characteristics.

In a further embodiment of the present invention, a range of an output voltage, determined by the lower level to the upper level of an output voltage, that may be output, is divided into a plurality of sections that are not overlapped with one another. At least two reference voltages, different in voltage level from one another, are provided for each of the sections in association therewith, and up to a maximum of a second power of n of output voltages are output in each section by the plural (n) reference voltages. There may be provided at least one section which has a part of outputtable voltage levels overlapped with another section.

In an embodiment of the present invention, a number of output voltage levels up to a maximum of a fifth power of 2 are divided into first to fifth sections, also termed blocks.

The first to twelfth reference voltages (A1, B1, A2, B2, A3, B3, C3, D3, A4, B4, A5 and B5) are supplied to the selection circuit (12).

The first section is made up by first to fourth levels, which are output by selection of the first and second reference voltages (A1, B1) from the amplifier (13).

The second section is made up by fifth to eighth levels, which are output by selection of the third and fourth reference voltages (A2, B2) from the amplifier (13).

The third section is made up by ninth to 24th levels, which are output by selection of the fifth to eighth reference voltages (A3, B3, C3 and D3) from the amplifier (13).

The fourth section is made up by 25th to 28th levels, which are output by selection of the ninth and tenth reference voltages (A4, B4) from the amplifier (13).

The fifth section is made up by 29th to 32nd levels, which are output by selection of the 11th and 12th reference voltages (A5, B5) from the amplifier (13).

In the present embodiment, the desired input/output characteristics (such as non-linear input/output characteristics) may be obtained by increasing the number of the reference voltages.

In an embodiment of the display device, according to the present invention, the selection circuit (12) forms the decoder circuit. The decoder circuit receives plural voltage levels from the grayscale voltage generating circuit (14) which is adapted for generating plural voltage levels, and a digital video data signal as the selection signal. The amplifier (13) forms a driver circuit receiving an output of the decoder circuit to drive a data line.

Referring to the drawings, an embodiment of the present invention is explained in detail. FIG. 1 illustrates a configuration of an output circuit according to an embodiment of the present invention. Referring to FIG. 1, an output circuit 11 receives m different reference voltages, and is capable of outputting a number of voltage levels equal to a second power of m ($m^2$), at the maximum, based on a selection signal, and outputs a selected one of the voltage levels. The output circuit 11 includes a selection circuit 12 and an amplifier 13. The output circuit 11 is supplied with m different reference voltages, and is able to output, based on a selection signal, a number of combinational voltages up to a maximum of a second power of m ($m^2$) at two terminals T1 and T2.

The amplifier 13 outputs an extrapolated voltage corresponding to the voltage difference of two voltages V(T1) and V(T2), output to the terminals T1 and T2 respectively.

In case the selection signal is a digital data signal of plural bits, the output circuit 11 may be used as a DAC (Digital to Analog Converter). The output circuit may be of a reduced area with a small number of input voltages as compared to the number of the voltage levels that may be output. A plural number (m) of reference voltages are preferably obtained from taps of a voltage division resistor string, not shown, provided in series across first and second standard voltages, in which the reference voltages are directly obtained from the tap of the resistor string or from an output of e.g. a voltage follower receiving a voltage from the tap.

Figure 2:
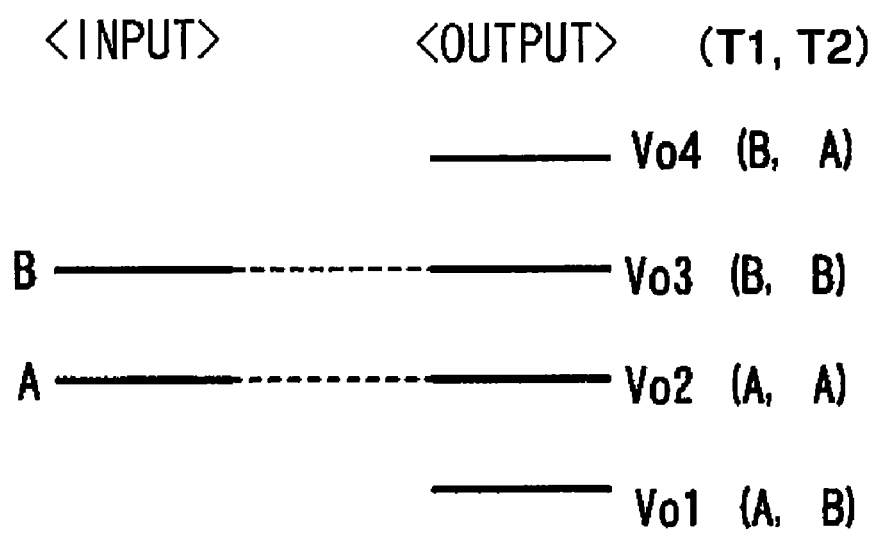
FIG. 2 illustrates the extrapolating operation of an amplifier embodying the present invention.

FIG. 2 shows the input/output level correspondence showing input/output characteristics of the amplifier circuit 13 shown in FIG. 1. When two input voltages are selectively supplied to the terminals T1 and T2, the amplifier 13 is able to output four voltages, that is, voltages equal to the two input voltages and voltages extrapolating the two input voltages.

Referring to FIG. 2, the amplifier 13 of FIG. 1 is able to output four voltage levels of Vo1 to Vo4, for two input voltages A and B. It is assumed that the voltages V(T1) and V(T2) are supplied to the input terminals T1 and T2, respectively.

If the voltages V(T1) and V(T2), supplied to the input terminals T1 and T2 differ from each other [(V(T1), V(T2)) =(A, B) or (B, A)], the output of the amplifier 13 of FIG. 1 is the extrapolated voltage (Vo1 or Vo4) of the input voltage (A, B), whereas, if the voltages V(T1) and V(T2), supplied to the input terminals T1 and T2, are equal to each other [(V(T1), V(T2))=(A, A) or (B, B)], the output of the amplifier 13 of FIG. 1 is equal to the input voltage (Vo2 or Vo3).

Meanwhile, in case the voltages supplied to the terminals T1, T2 are equal to each other, such that the output of the amplifier 13 is equal to the input voltage, the output voltage equal to the input voltage may be deemed to be an extrapolated voltage for the zero voltage difference, because the voltage difference between the two input voltages at this time is zero.

Figure 3:
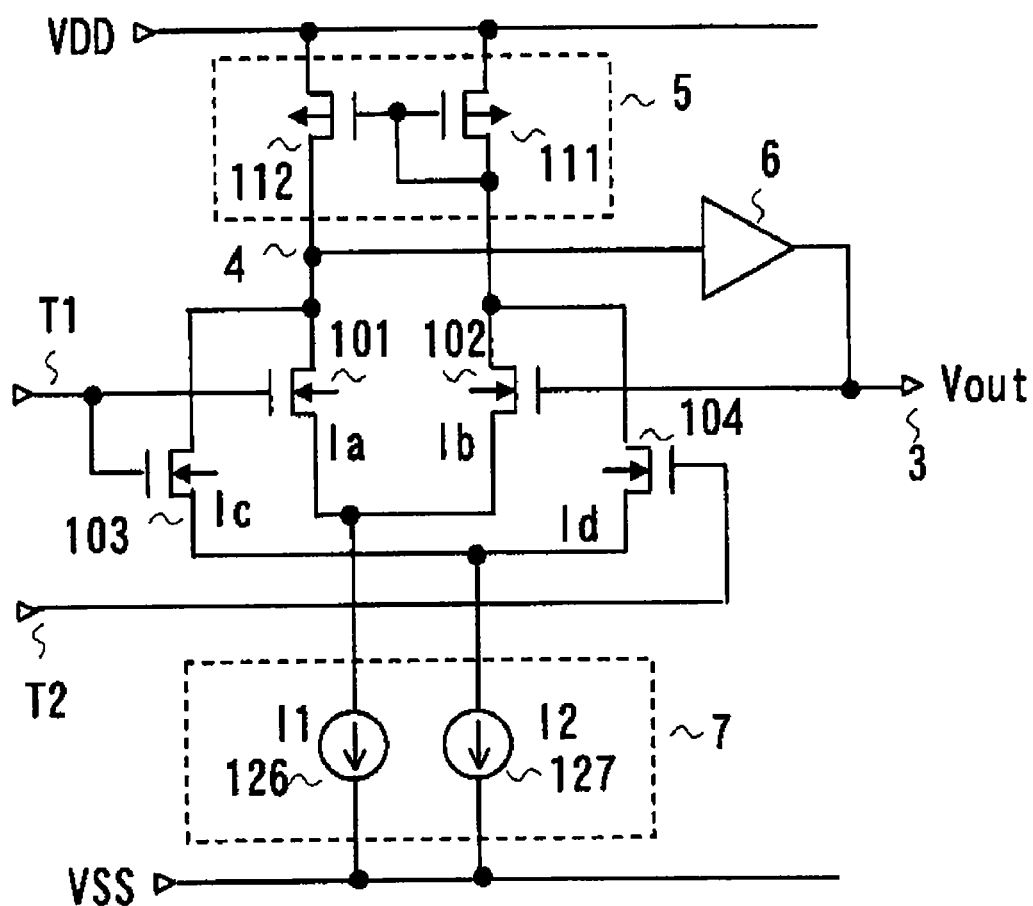
FIG. 3 shows an illustrative configuration of an amplifier embodying the present invention.

FIG. 3 shows a configuration of a differential amplifier, forming a concrete example of the amplifier 13 of FIG. 1 having the input/output characteristics of FIG. 2. The amplifier of the present embodiment is a differential amplifier capable of outputting the extrapolated voltage of the input voltages supplied to the input terminals T1 and T2 respectively.

The differential amplifier, shown in FIG. 3, includes a first differential pair, composed of two n-channel transistors 101 and 102, which have their sources connected in common, and are driven by a first current source 126, and a second differential pair, composed of two n-channel transistors 103 and 104 which have their sources connected in common, and are driven by a second current source 127. The drains of the transistors 102 and 104 are connected in common to an input end (drain of the p-channel transistor 111) of a current mirror circuit 5 formed by p-channel transistors 111 and 112, while the drains of the transistors 101 and 103 are connected in common to an output end (drain of the p-channel transistor 112) of the current mirror circuit 5.

The gate of the transistor 101 of the first differential pair is connected to the input terminal T1, while the gate of the other transistor 102 is connected to the output terminal 3. The gates of the transistors 101 and 102 compose a non-inverting input and an inverting input of an input pair of the differential circuit.

The gate of the transistor 103 of the second differential pair is connected to the input terminal T1, while the gate of the other transistor 104 is connected to the input terminal T2.

An amplifier stage 6 is connected across an output terminal (drain of the transistor 112) of a current mirror circuit forming a load circuit 5 and the output terminal 3, and receives an output signal of the current mirror circuit 5 to execute an amplifying operation. It is noted that the configuration shown in FIG. 3 is a differential amplifier having the output terminal 3 connected in a feedback configuration to the first differential pair (101, 102).

The current mirror circuit, forming the load circuit 5, may, of course, be of any suitable configuration, for example, a cascode type two-stage vertically stacked configuration.

The amplifier stage 6 may be of any suitable configuration which receives an output signal of the current mirror circuit 5 to perform an amplifying operation to send its output to the output terminal 3. The amplifier stage 6 may, of course, be composed by a differential amplifier, having a differential input pair connected to an input terminal and to an output terminal of a current mirror circuit forming the load circuit 5, and having an output end connected to the output terminal 3.

Meanwhile, it is assumed that no steady-state current flows across an output end (drain of the transistor 112) of the current mirror circuit forming the load circuit 5 and the amplifier stage 6.

When selectively supplied with two input voltages at the input terminals T1 and T2, the differential amplifier shown in FIG. 3 is able to output four voltages, that is, voltages equal to the two input voltages and voltages extrapolating the two input voltages.

The differential amplifier, shown in FIG. 3, selectively supplied with two input voltages at terminals T1 and T2, outputs the two input voltages and voltages extrapolating (exteriorly dividing) the two voltages, that is, four voltage levels. If, in FIG. 3, the transistors 101 to 104 are of the same size, and the currents I1 and I2, caused to flow through the two current sources, are set to equal values, the voltages of extrapolation (exterior division) are the voltages extrapolating the voltages V(T1) and V(T2), supplied to the terminals T1 and T2, at a ratio of 1:2.

Figure 4A:
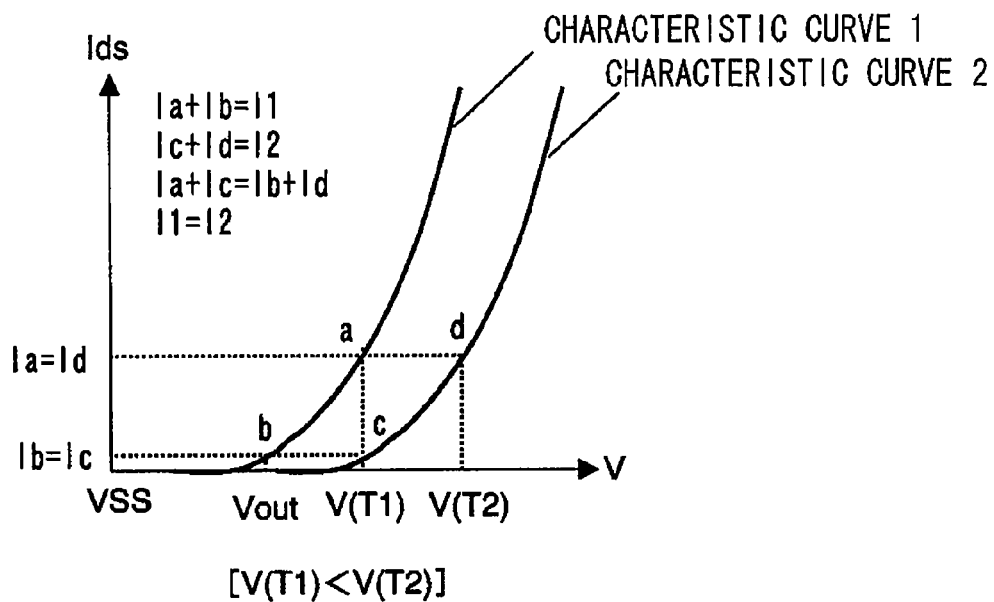
FIGS. 4A and 4B illustrate the operating principle of an amplifier embodying the present invention.
Figure 4B:
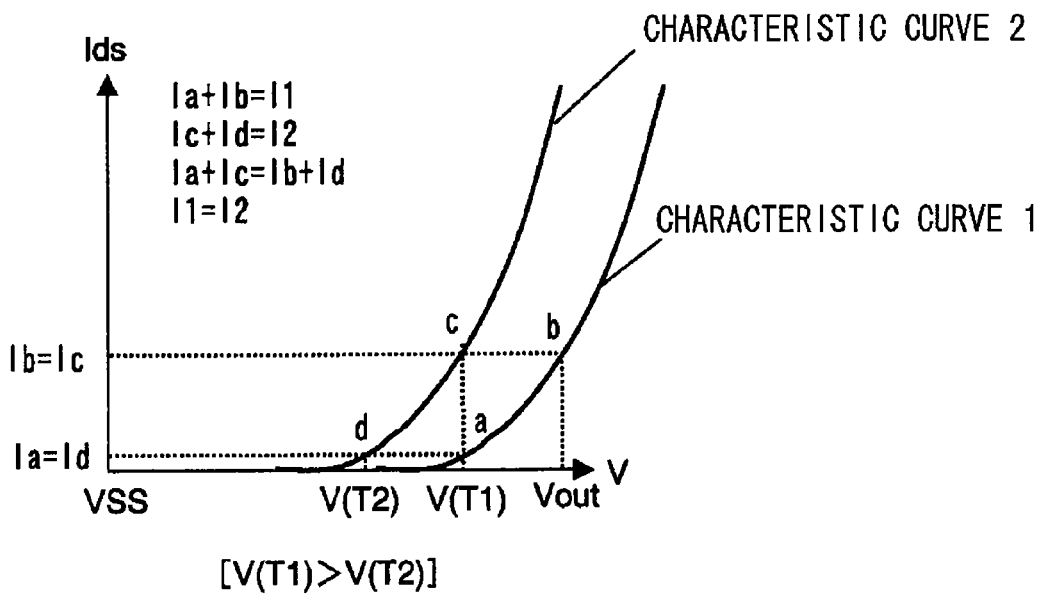

Referring to FIGS. 4A and 4B, the operation of the differential amplifier, shown in FIG. 3, is described. It is assumed that, in the following description of the operation of FIGS. 4A and 4B, the transistors 101 to 104 in FIG. 3 are of the same size (same characteristics), and that the currents I1 and I2, caused to flow through the two current sources 126 and 127, are set to the same values.

FIGS. 4A and 4B illustrate the operation for a case where V(T1)<V(T2) and V(T1)>V(T2). Specifically, FIGS. 4A and 4B show a characteristic curve 1 for the transistors 101 and 102 and a characteristic curve 2 for the transistors 103 and 104, by way of illustrating the relationship between the drain-to-source current Ids and the voltage V. The operating points of the respective transistors are on the respective characteristic curves. As the respective source potentials (voltages) of the two differential pairs are individually changed, the two characteristic curves are simply shifted along the transverse axis. With use of these drawings, it is easier to understand the principle of the circuit operation.

If the currents (drain-to-source currents), corresponding to operating points a to d of transistors 101 to 104, are denoted Ia, Ib, Ic and Id, respectively, the currents flowing through the respective transistors are denoted by Ia, Ib, Ic and Id, respectively. The relative magnitudes of the currents, flowing through the respective transistors of the two differential pairs (101, 102) and (103, 104) in the configuration of FIG. 3, are given by the following equations (3) and (4):

$$Ia+Ib=I1 \tag{3}$$

$$Ic+Id=I2 \tag{4}$$

Since the currents flowing through the input/output pairs of the current mirror circuits, forming the load circuit 5, are equal to each other, the following equation (5) is obtained.

$$Ia+Ic=Ib+Id \tag{5}$$

Meanwhile, it is assumed that an output end of the current mirror circuit 5 (drain of the transistor 112) imparts only a voltage signal to the amplifier stage 6, while no steady-state current flows across the output end and the amplifier stage 6.

The currents I1 and I2 of the current sources 106 and 107 are set to $$I1=I2 \tag{6}$$

Solving the above equations, the following equations (7) are obtained.

$$Ia=Id, Ib=Ic \tag{7}$$

In this case, the output voltage Vout of the differential amplifier of FIG. 3 becomes a voltage which exteriorly divides the voltages V(T1) and V(T2) at a ratio of 1:2 towards the low voltage side, in FIG. 4(A), and becomes a voltage which exteriorly divides the voltages V(T1) and V(T2) at a ratio of 1:2 towards the high voltage side, in FIG. 4B.

The ratio of extrapolation is defined to be the ratio of the absolute value |Vout−V(T1)| and the absolute value |Vout−V(T2)|. The following accounts for the reason of setting this definition of the ratio of extrapolation.

The operating points a and c of the transistors 101 and 103 have V=V(T1) in common on the transversal axis V of FIGS. 4A and 4B. Hence, a figure interconnecting the four operating points on the characteristic curve of the transistors 101 to 104 is a parallelogram. Since the sides ad and bc of the parallelogram are equal to each other, the output voltage Vout is the voltage of extrapolation (exterior division) for the voltages V(T1) and V(T2), such that a voltage intermediate between the output voltage Vout and the voltage V(T2) becomes a voltage V(T1), as shown by the following equation (8):

$$V(T1)=\{Vout+V(T2)\}/2 \tag{8}$$

That is, in FIGS. 4A and 4B, Vout becomes a voltage of extrapolation (exterior division), as defined by the following equation (9):

$$Vout=V(T1)+\{V(T1)-V(T2)\} \tag{9}$$

Meanwhile, this operation of extrapolation (exterior division) is valid, if, in the equations (3) to (6), the respective transistors 101 to 104 of the two differential pairs are of the relatively same size (same characteristics).

On the other hand, the voltage differential of the voltages V(T1) and V(T2), entered to the terminals T1, T2, is valid within a preset range, without regard to the voltage differential. However, there is an upper limit to the range of the potential difference. The possible range of the voltage difference between the voltages V(T1) and V(T2) is now described.

As may be seen from FIGS. 4A and 4B, if the voltages V(T1) and V(T2) differ from each other, the currents flowing through the respective paired transistors of each of the two differential pairs differ from each other, such that, if the voltage difference between V(T1) and V(T2) increases, the difference in the current flowing through the same differential pair also increases. However, the respective sum currents across the differential pair (101, 102) and the differential pair (103, 104) are respectively determined by I1 and I2, so that, if the voltage difference between V(T1) and V(T2) is increased further, one of the paired transistors of each differential pair is in an off-state, with no current flowing therein.

Thus, the transistors 102 and 103 at the operating points b and c are off in FIG. 4A, while the transistors 101 and 104 at the operating points a and d are off in FIG. 4B.

Hence, the current equations in the respective operating points, explained above, fail to hold, such that the differential amplifier of FIG. 3 is unable to output a correct voltage of extrapolation. That is, there is an upper limit in the range of the voltage differential of the voltages V(T1) and V(T2), which range depends on the characteristic curves of the transistors 101 to 104 or on the setting of the currents I1, I2.

The case in which V(T1)=V(T2) will now be described. If V(T1)=V(T2), the voltages supplied to the input pair of the differential pair (103, 104) in the differential amplifier of FIG. 3 are equal to each other. On the other hand, the voltages supplied to the input pair of the differential pair (101, 102) are V(T1) and Vout, and a stable state is reached with Vout=V(T1), under the differential amplifier operation. Thus, the output voltage Vout of the differential amplifier of FIG. 3 is equal to the input voltage V(T1) in case V(T1)=V(T2).

As described above, the differential amplifier of FIG. 3 is able to output the four voltages, namely the two input voltages and voltages extrapolating (exteriorly dividing) the two input voltages, by selectively supplying the two input voltages to the terminals T1 and T2, as shown in FIG. 2.

If, in the configuration of FIG. 3, the transistors 101 to 104 are of the same size, and the currents I1, I2, caused to flow through the two current sources, are set to equal values, the extrapolated (exteriorly divided) output voltage is the voltage which exteriorly divides voltages V(T1) and VT(2), supplied to the terminals T1 and T2, at a ratio of 1:2.

FIG. 3 shows a concrete example of the amplifier 13 of FIG. 1. However, the amplifier may be a voltage-follower amplifier made up by a first differential pair having an input pair one input of which forms an input terminal and the other input of which is connected in a feedback fashion to an output, and by a first current source driving the differential pair, with the outputs of the output pair being connected common, and with the voltage-follower amplifier further including a second differential pair and a second current source connected parallel to the first differential pair and the first current source. One input of the input pair of the second differential pair is connected to the input terminal to serve as a terminal, and the other input is connected to a second terminal. The first and second differential pairs are each formed by transistors of the same characteristics. The first and second current sources are caused to supply the same current. This amplifier may, similarly to the differential amplifier shown in FIG. 3, be used as the amplifier 13 of FIG. 1.

FIGS. 5 and 6 show further specified examples of the amplifier 13 of FIG. 1 having input/output characteristics of FIG. 2. These amplifiers are differential amplifiers for temporarily holding the potential difference of the voltage supplied to the terminals T1 and T2 in a capacitor C1 or C2 and for using the potential difference as an extrapolated voltage.

Figure 5A:
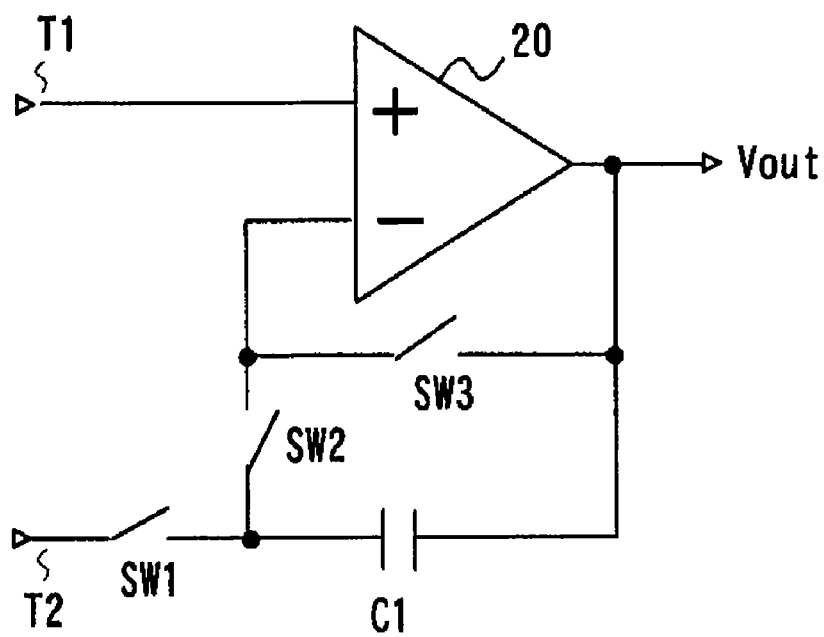
FIG. 5A shows a modification of an amplifier embodying the present invention and FIG. 5B shows on/off switch control.
Figure 5B:
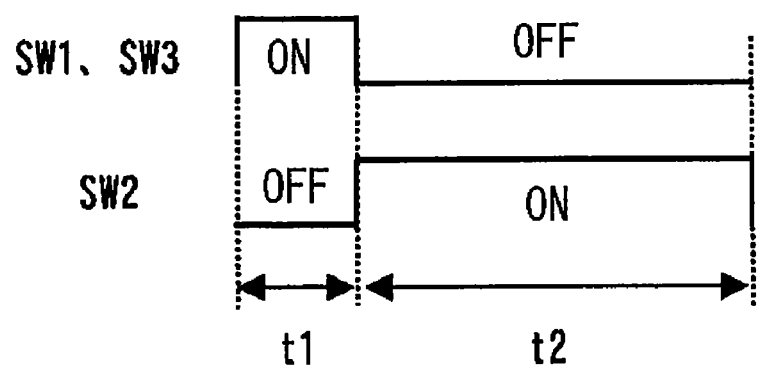

FIG. 5A shows an exemplary configuration of a differential amplifier. FIG. 5B shows an on/off control state during one outputting period of the first to third switches SW1, SW2 and SW3.

Referring to FIG. 5A, a first terminal T1 is connected to a non-inverting input terminal (+) of a differential amplifier 20, such as an operational amplifier, and the switch SW3 has its one end connected to the inverting input terminal (−) of the differential amplifier 20, while having its other terminal connected to an output terminal Vout. The switch SW2 has its one end connected to the inverting input terminal (−) of the differential amplifier 20, while having its other end connected to one end of the capacitor C1. The switch SW1 has its one end connected to a second terminal T2, while having its other end connected to a connection point of the capacitor C1 and the switch SW2. The capacitor C1 is connected across a connection point of the switches SW1 and SW2 and the output terminal Vout.

Referring to FIG. 5B, if the switch SW2 is turned off and the SW1 and SW3 are turned on, the output terminal voltage Vout of the differential amplifier 20 of the voltage follower configuration is the terminal voltage V(T1) of the non-inverting input terminal (+), and the voltage V(T1) is applied to one end of the capacitor connected to the output terminal.

Since the voltage V(T2) of the second terminal T2 is applied to the other end of the capacitor C1 (connection point of the switches SW1 and SW2), the voltage across the terminals of the capacitor C1, with the output terminal side as the reference, is given by $$\Delta V = V(T2) - V(T1) \quad (10).$$

If, during a period t2, the switch SW2 is turned on and the switches SW1 and SW3 are turned off, the resulting circuit configuration is such a one in which the capacitor C1 is connected across the inverting input terminal (−) and in which a voltage (Vout+ΔV) is applied to the inverting input terminal (−). Moreover, since the differential amplifier 20 of the voltage follower configuration is in a stable state when the voltages applied to the non-inverting input terminal (+) and the inverting input terminal (−) are equal to relationship of the following equation (11) holds.

$$V(T1) = (Vout + \Delta V) \quad (11)$$

By solving the equation (11) for V(T1), using the above relationship for ΔV, we have the equation (12):

$$V(T1) = \{Vout + V(T2)\}/2 \quad (12)$$

The voltage V(T1) is a voltage intermediate between the output voltage Vout and the voltage V(T2). That is, the output voltage Vout is the voltage exteriorly dividing the first terminal voltage V(T1) and the second terminal voltage V(T2) in a ratio of 1:2.

If the first terminal voltage is lower than the second terminal voltage (V(T1)<VT(2)), the output voltage Vout is extrapolated to a side of the lower voltage than the first terminal voltage V(T1).

If the first terminal voltage is higher than the second terminal voltage (V(T1)>VT(2)), the output voltage Vout of the output terminal is extrapolated to a side of the higher voltage than the first terminal voltage V(T1).

Figure 6A:
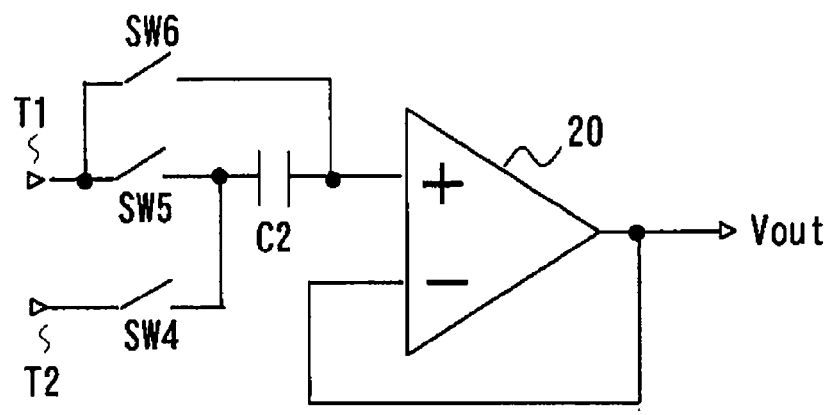
FIG. 6A shows another modification of an amplifier embodying the present invention and FIG. 6B shows on/off switch control.
Figure 6B:
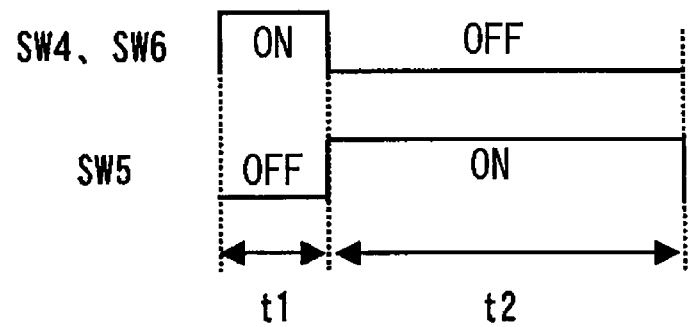

FIG. 6A shows a further example of a configuration of the differential amplifier, and FIG. 6B shows the on/off control state during one outputting period of the fourth to sixth switches SW4 to SW6.

Referring to FIG. 6A, the switch SW6 has its one end connected to the terminal T1 and has its other end connected to the non-inverting input terminal (+) of the differential amplifier 20, such as OP amplifier, while the switch SW5 has its one end connected to the terminal T1 and has its other end connected to one end of the capacitor C2, and the switch SW4 has its one end connected to the terminal T2 and has its other end connected to one end of the capacitor C2. The other end of the capacitor C2 is connected to the non-inverting input terminal (+), while the output terminal is connected to the inverting input terminal (−).

If the switch SW5 is turned off and the switches SW4, SW6 are turned on, during a period t1, as shown in FIG. 6B, the voltage V(T1) of the first terminal T1 is applied to the non-inverting input terminal (+), the voltage V(T2) of the second terminal T2 is applied to one end of the capacitor C2 (junction of the switches SW4 and SW5), and the voltage across the terminals of the capacitor C2, with the non-inverting input terminal (+) side as the reference, is given by $$\Delta V = V(T2) - V(T1) \quad (13).$$

If, during a term t2, the switch SW5 is turned on and the switches SW4 and SW6 are turned off, the resulting circuit configuration is such a one in which the capacitor C2 is connected across the terminal T1 and the inverting input terminal (−) and in which a voltage (V(T1)−ΔV) is applied to the non-inverting input terminal (+). Thus, the output terminal voltage Vout of the differential amplifier 20 of the voltage follower configuration outputs the voltage of the non-inverting input terminal (+). Then, the relationship of the following equation (14) holds.

$$Vout = (V(T1) - \Delta V) \quad (14)$$

By solving the equation (14) for V(T1), using the above relationship for ΔV, we have the equation (15):

$$V(T1) = \{Vout + V(T2)\}/2 \quad (15)$$

The voltage V(T1) is a voltage intermediate between the output voltage Vout and the voltage V(T2). That is, the output voltage Vout is the voltage exteriorly dividing the first terminal voltage V(T1) and the second terminal voltage V(T2) in a ratio of 1:2. If the first terminal voltage is lower than the second terminal voltage (V(T1)<VT(2)), the output terminal voltage Vout is extrapolated to a side of the lower voltage than the first terminal voltage V(T1) and, if the first terminal voltage is higher than the second terminal voltage (V(T1)>VT(2)), the output voltage Vout of the output terminal is extrapolated to a side of the higher voltage than the first terminal voltage V(T1).

In FIG. 5A and FIG. 6A, two input voltages and voltages extrapolating (exteriorly dividing) the two voltages, totaling at four voltages, may be output, by selectively inputting the two input voltages, thus satisfying the input/output characteristics of FIG. 2.

In the amplifiers, configured as shown in FIG. 5A and FIG. 6A, the extrapolated (exteriorly divided) output voltage is a voltage extrapolating the voltages V(T1), V(T2), input to the terminals T1, T2, in a ratio of 1:2.

A DAC (Digital to Analog Converter), employing the amplifier 13, having input/output characteristics of FIG. 2, is now described. The amplifier 13 is not limited to the configuration shown in FIG. 3, 5A or 6A, but any optional amplifier, having input/output characteristics of FIG. 2 for a sufficiently broad input/output range, may also be used.

First, a DAC, having first and second input terminals T1 and T2 selectively supplied with two input voltages A and B, and which outputs four voltage levels (Vo1 to Vo4), is now explained.

FIG. 7 shows the relationship of the input/output correspondence of a 2 bit data input DAC in which supply control (selection) of four combinations of two input voltages (A, B) to the terminals T1 and T2 is controlled by 2-bit data. The input voltages A and B are respectively set to second and third voltage levels among the first to fourth voltage levels which are equally spaced.

Figure 8:
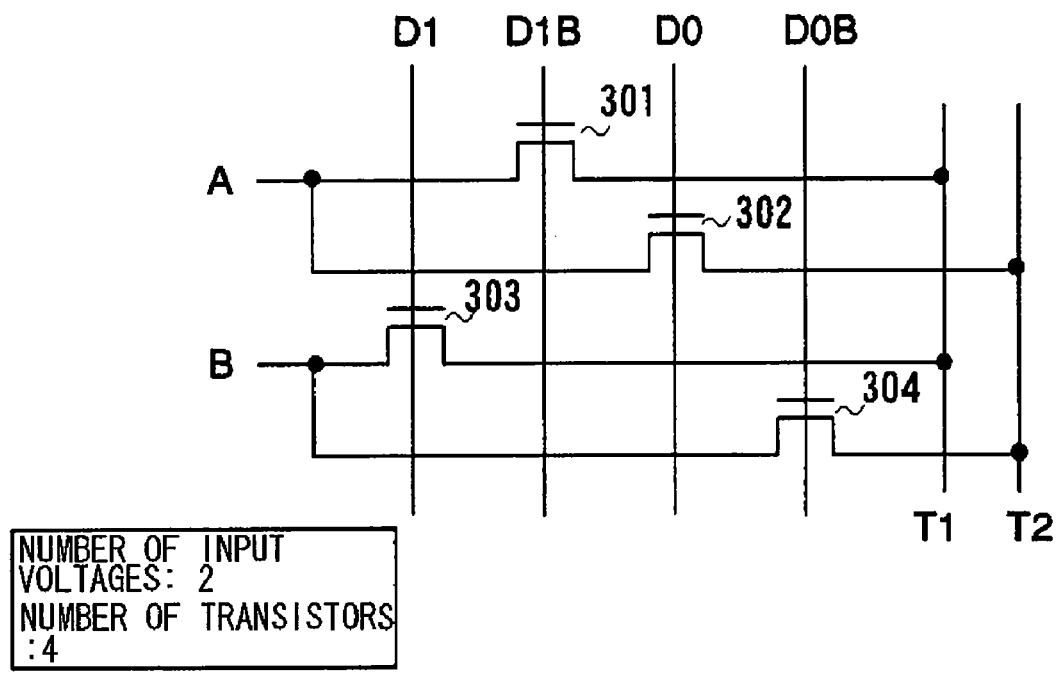
FIG. 8 shows an illustrative configuration of a 2-bit decoder (Nch) for implementing the correlation of FIG. 7.

FIG. 8 shows an example of the circuit configuration of a two-bit decoder (made up of n-channel transistors) for implementing the control of FIG. 7.

Referring to FIG. 8, the decoder circuit includes transistor switches 301 and 302, connected across a voltage A (a terminal for supplying the voltage A) and the terminals T1 and T2 and receiving data bit signals D1B and D0 at the control terminals thereof, and transistor switches 303 and 304, connected across a voltage B (a terminal for supplying the voltage B) and the terminals T1 and T2 and receiving data bit signals D1 and D0B at control terminals thereof.

It is transistor pairs (301, 304), (301, 302), (303, 304) and (302, 303) that are turned on for (D1, D0)=(0,0), (0,1), (1,0) and (1,1) and, as shown in FIG. 7, (A,B), (A,A), (B,B) and (B,A) are transmitted to the terminals T1 and T2.

The decoder shown in FIG. 8 is made up by two input voltages and four transistors. Since the general two-bit decoder (made up of n-channel transistors) is in need of four input voltages and at least six transistors, the decoder of FIG. 8 is of a highly simplified configuration.

The sequence of the bit signals (D1, D0) and inverted versions thereof is arbitrary. The p-channel decoder may readily be implemented by a configuration in which digital data from the n-channel decoder is inverted (by inverting DX to DXB and by inverting DXB to DX, with X=0, 1 in FIG. 7) and is input in this inverted form to the p-channel decoder.

Figure 9:
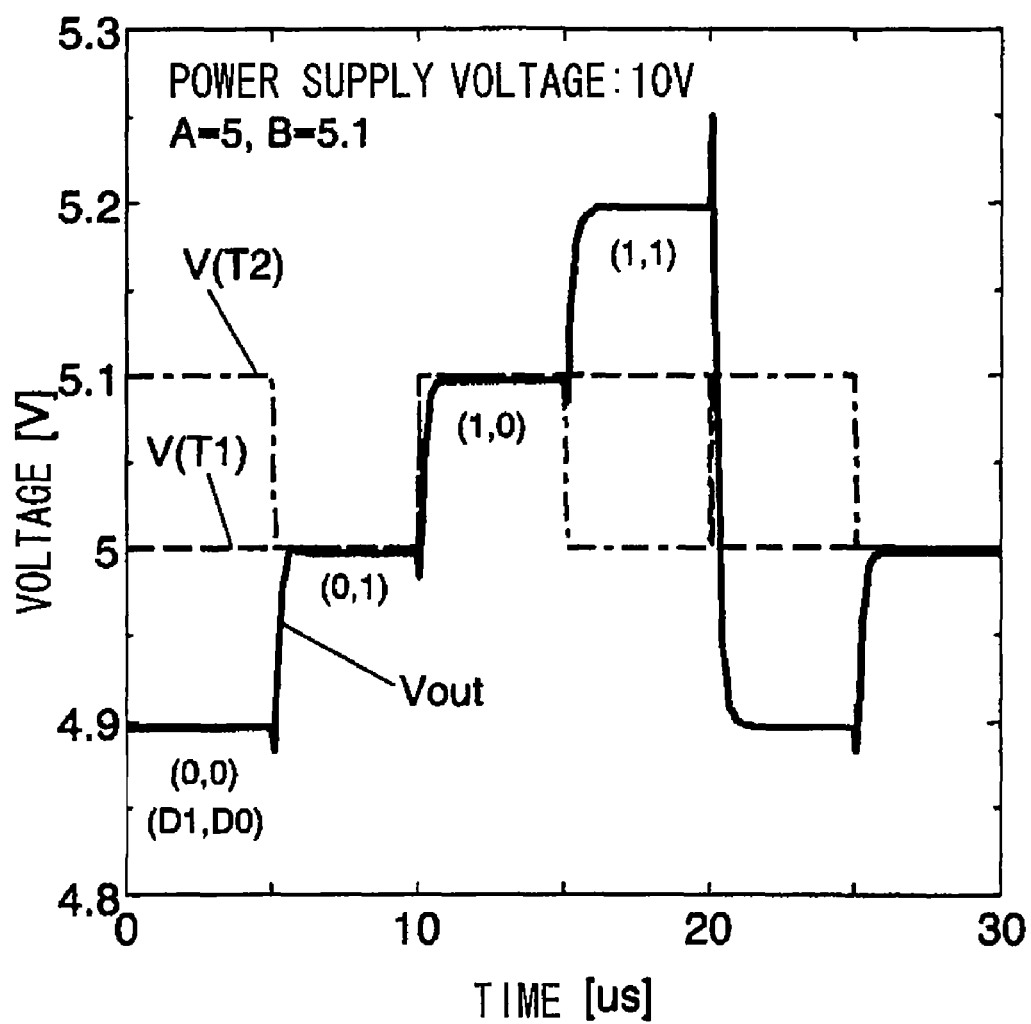
FIG. 9 shows an output voltage waveform of a DAC embodying the present invention.

FIG. 9 is an output waveform diagram of the two-bit DAC employing the differential amplifier of FIG. 3. FIG. 9 depicts the respective voltages V(T1) and V(T2) of the terminals T1 and T2 and an output waveform of the output voltage Vout of the differential amplifier. The input voltages (A, B) were set so that A=5V and B=5.1V, with the voltage difference being 0.1V. It may be ascertained from FIG. 9 that four levels equally spaced by 0.1V (4.9V, 5.0V, 5.1V and 5.2V) could be output to high precision responsive to 2-bit data.

The four-bit DAC according to the present invention is hereinafter described. In case the amplifier 13 is able to output voltages to high precision despite marked voltage difference of two input voltages supplied to the terminals T1 and T2, the output level can be extended not only by extrapolation of input voltages between adjacent levels, but also by extrapolation of input voltages spaced apart from each other by two or three input voltages.

With use of this principle, a number of output voltages equal to a second power of the number of input voltages at the maximum can be output. It is noted however that the amplifier 13 is preferably able to output voltages of extrapolation (exterior division) which exteriorly divides the voltages V(T1) and V(T2), supplied to the terminals T1 and T2 respectively, at a ratio of 1:2.

FIG. 10 shows an example of the input/output level correspondence for a case where the number m of input voltages that can be input to the input terminals (T1 and T2) is four (m=4).

By selective inputting of four input voltages (A, B, C and D) to the input terminals (T1 and T2), as shown in FIG. 10, it is possible to output up to a maximum of 16 voltage levels (Vo1 to Vo16) (a second power of the number m of the input voltages=4). In case the amplifier 13 is configured to output a voltage of extrapolation (exterior division) which exteriorly divides the voltages V(T1) and V(T2), supplied to the terminals T1 and T2, at a ratio of 1:2, the 16 output voltages may be equally spaced. It is noted that the input voltages (A, B, C and D) are set to sixth (Vo6), seventh (Vo7), tenth (Vo10) and eleventh (Vo11) voltage levels, respectively.

FIG. 11 shows input/output level correspondence, indicating input/output characteristics of a 4-bit DAC. Referring to FIG. 11, a DAC, selectively supplied with four input voltages (A, B, C and D) at input terminals (T1 and T2) to output a 16 voltage levels, is now described (16 being second power of four which is the number of the input voltages). The selection of the 16 combinations of the four input voltages (A, B, C and D) to the input terminals T1 and T2 is controlled by 4-bit data (D3, D2, D1, and D0). Meanwhile, the level signals of FIG. 11 may be associated with the voltage levels (Vo1 to Vo16) of FIG. 10. The amplifier 13 outputs a voltage of extrapolation (exterior division) which exteriorly divides the voltages V(T1) and V(T2), supplied to the terminals T1 and T2 respectively, at a ratio of 1:2, and provides for an equal interval between neighboring ones of 16 output voltages.

The first to fourth reference voltages (A to D) are set to the sixth, seventh, tenth and eleventh levels. Based on the 4-bit selection signals (D3, D2, D1 and D0), the selection circuit 12 is able to send, to the terminals T1 and T2 of the amplifier 13, any of the reference voltage pairs of:

(1) first and fourth reference voltages (A and D);
(2) first and third reference voltages (A and C);
(3) second and fourth reference voltages (B and D);
(4) second and third reference voltages (B and C);
(5) first and second reference voltages (A and B);
(6) first and first reference voltages (A and A);
(7) second and second reference voltages (B and B);
(8) second and first reference voltages (B and A);
(9) third and fourth reference voltages (C and D);
(10) third and third reference voltages (C and C);
(11) fourth and fourth reference voltages (D and D);
(12) fourth and third reference voltages (D and C);
(13) third and second reference voltages (C and B);
(14) third and first reference voltages (C and A);
(15) fourth and second reference voltages (D and B); and

(16) fourth and first reference voltages (D and A).

When the ratio of extrapolation of the amplifier 13 is 1:2, a voltage twice as large as the first terminal voltage V(T1) is equal to the sum of the second terminal voltage V(T2) and the output voltage Vout, such that first to sixteenth voltage levels can be output.

FIG. 12 shows an exemplary configuration of a 4-bit decoder (made up of n-channel transistors) for implementing the control, shown for example in FIG. 11.

More specifically, the 4-bit decoder includes: first and second switches 401 and 402, connected across a first reference voltage (A; level 6) and the first terminal T1 to receive a complementary signal D1B of D1 and a complementary signal D3B of D3 at control terminals thereof.

The 4-bit decoder also includes: third and fourth switches 403 and 404, connected across the first reference voltage A and the second terminal T2 to receive D0 and D2 at control terminals thereof;

fifth and sixth switches 405 and 406, connected across the second reference voltage (B; level 7) and the first terminal T1 to receive D1 and D3B at control terminals thereof;

seventh and eighth switches 407 and 408, connected across the second reference voltage B and the second terminal T2 to receive a complementary signal D0B of D0 and D2 at control terminals thereof;

ninth and tenth switches 409 and 410, connected across the third reference voltage C and the second terminal T1 to receive D1B and D3 at control terminals thereof;

eleventh and twelfth switches 411 and 412, connected across the third reference voltage C and the second terminal T2 to receive D0 and a complementary signal D2B of D2 at control terminals thereof;

thirteenth and fourteenth switches 413 and 414, connected across the fourth reference voltage (D; level 11) and the first terminal T1 to receive D1 and D3 at control terminals thereof; and fifteenth and sixteenth switches 415 and 416, connected across the fourth reference voltage (D: level 11) and the second terminal T2 to receive D0B and D2B at control terminals thereof.

The configuration of FIG. 12 may be formed by four input voltages and 16 transistors 401 to 416. The sequence of the bit signals D3, D2, D1 and D0 and inverted versions thereof may be arbitrary.

FIG. 13 shows a modification example of FIG. 12. Referring to FIG. 13, the decoder is of such a configuration in which the bits are divided into upper two bits (D3, D2) and lower two bits (D1, D0) and the lower two-bits are co-used by the upper two bits to reduce the number of the transistors.

Referring to FIG. 13, the decoder circuit (selection circuit) includes: first and second switches 401 and 402, connected across the first reference voltage A and the first terminal to receive D1B and D3B at control terminals thereof;

third and fourth switches 403 and 404, connected across the first reference voltage A and the second terminal T2 to receive D0 and D2 at control terminals thereof;

fifth and sixth switches 405 and 406, connected across the second reference voltage B and the first terminal T1 to receive D1 and D3B at control terminals thereof;

seventh and eighth switches 407 and 408, connected across the second reference voltage B and the second terminal T2 to receive D0B and D2 at control terminals thereof;

a ninth switch 409 connected across the third reference voltage C and a connection node of the first and second switches 401 and 402 and supplied with D3 at a control terminal thereof;

a tenth switch 410 connected across the third reference voltage C and a connection node of the third and fourth switches 403 and 404 and supplied with D2B at a control terminal thereof;

an eleventh switch 411 connected across the fourth reference voltage D and a connection node of the fifth and sixth switches 405 and 406 and supplied with D3 at a control terminal thereof; and a twelfth switch 412 connected across the fourth reference voltage D and a connection node of the seventh and eighth switches 407 and 408 and supplied with D2B at a control terminal thereof.

In this case, the transistors 401 to 412 are used, with the number of the transistors being 12.

Figure 14:
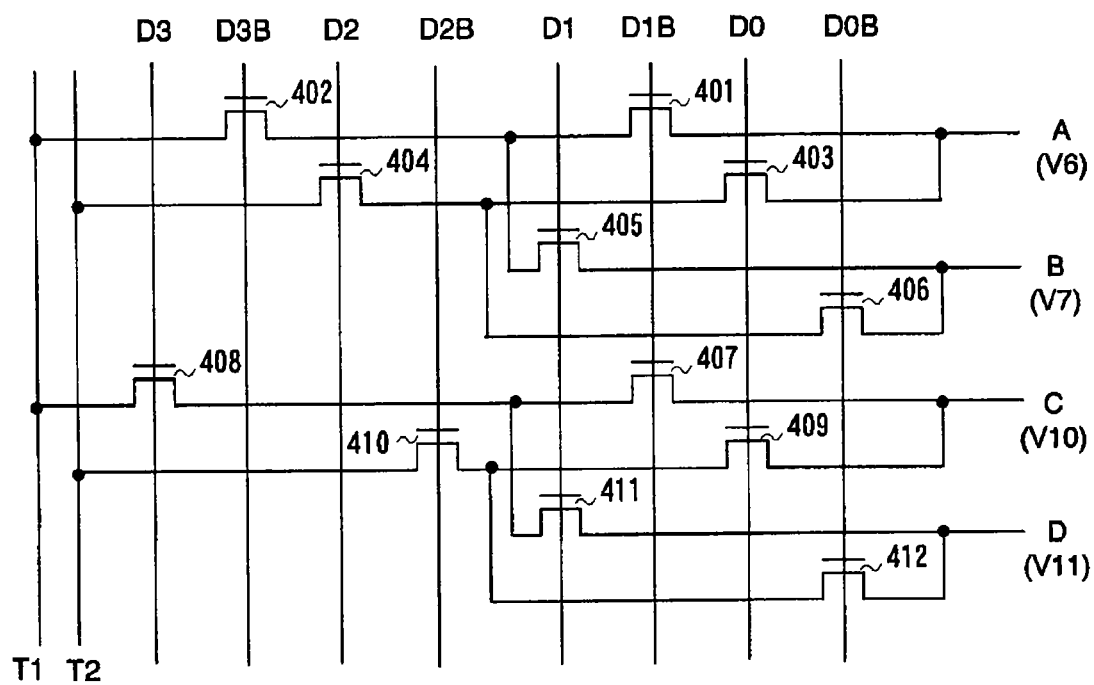
FIG. 14 shows another modification example of FIG. 12.

FIG. 14 shows a further modification example of FIG. 12, in which the bits are divided into upper two bits (D3, D2) and lower two bits (D1, D0), with the upper two-bits being co-used with the lower two bits to reduce the number of the transistors.

Referring to FIG. 14, this decoder circuit (selection circuit) includes: first and second switches 401 and 402, connected across the first reference voltage A and the first terminal T1 and supplied with D1B and D3B at control terminals thereof; and third and fourth switches 403 and 404, connected across the first reference voltage A and the second terminal T2 and supplied with D0 and D2 at control terminals thereof;

a fifth switch 405, connected across the second reference voltage B and a connection node between the first and second switches 401 and 402 and supplied with D1 at a control terminal thereof; and a sixth switch 406, connected across the second reference voltage B and a connection node between the third and fourth switches 403 and 404 and supplied with D0B at a control terminal thereof.

The decoder circuit further includes:

seventh and eighth switches 407 and 408, connected across the third reference voltage C and the first terminal T1 and supplied with D1B and D3 at control terminals thereof;

ninth and tenth switches 409 and 410, connected across the third reference voltage C and the second terminal T2 and supplied with D0 and D2B at control terminals thereof;

an eleventh switch 411, connected across the fourth reference voltage D and a connection node between the seventh and eighth switches 407 and 408 and supplied with D1 at control terminals thereof; and a twelfth switch 412, connected across the fourth reference voltage D and a connection node between the ninth and tenth switches 409 and 410 and supplied with D0B at control terminals thereof. The number of the transistors is again 12.

The decoder circuit configurations may be variable, as described above, and the number of the transistors differs slightly from one circuit configuration to another. However, in any of these decoder circuit configurations, the first reference voltage A (terminal supplying the voltage A) and the first terminal T1 are interconnected by two switches, the control terminals of which are supplied with D1B and D3B, the first reference voltage A and the second terminal T2 are interconnected by two switches, the control terminals of which are supplied with D0 and D2, the second reference voltage B and the first terminal T1 are interconnected by two switches, the control terminals of which are supplied with D1 and D3B, the second reference voltage B and the second terminal T2 are interconnected by two switches, the control terminals of which are supplied with D0B and D2, the third reference voltage C and the first terminal T1 are interconnected by two switches, the control terminals of which are supplied with D1B and D3, the third reference voltage C and the second terminal T2 are interconnected by two switches, the control terminals of which are supplied with D0 and D2B, the fourth reference voltage D and the second terminal T1 are interconnected by two switches, the control terminals of which are supplied with D1 and D3, and the fourth reference voltage D and the second terminal T2 are interconnected by two switches, the control terminals of which are supplied with D0B and D2B.

In the following description on the decoder, a typical configuration with a relatively small number of transistors is taken as an example. In the typical configuration of the multi-bit decoder of the present invention, as now explained, as in the modification of the 4-bit decoder, described above, such a modification is possible in which a preset reference voltage and a preset terminal (T1 or T2) are interconnected via plural switches, the control terminals of which are supplied with signals for selection.

Figure 35:
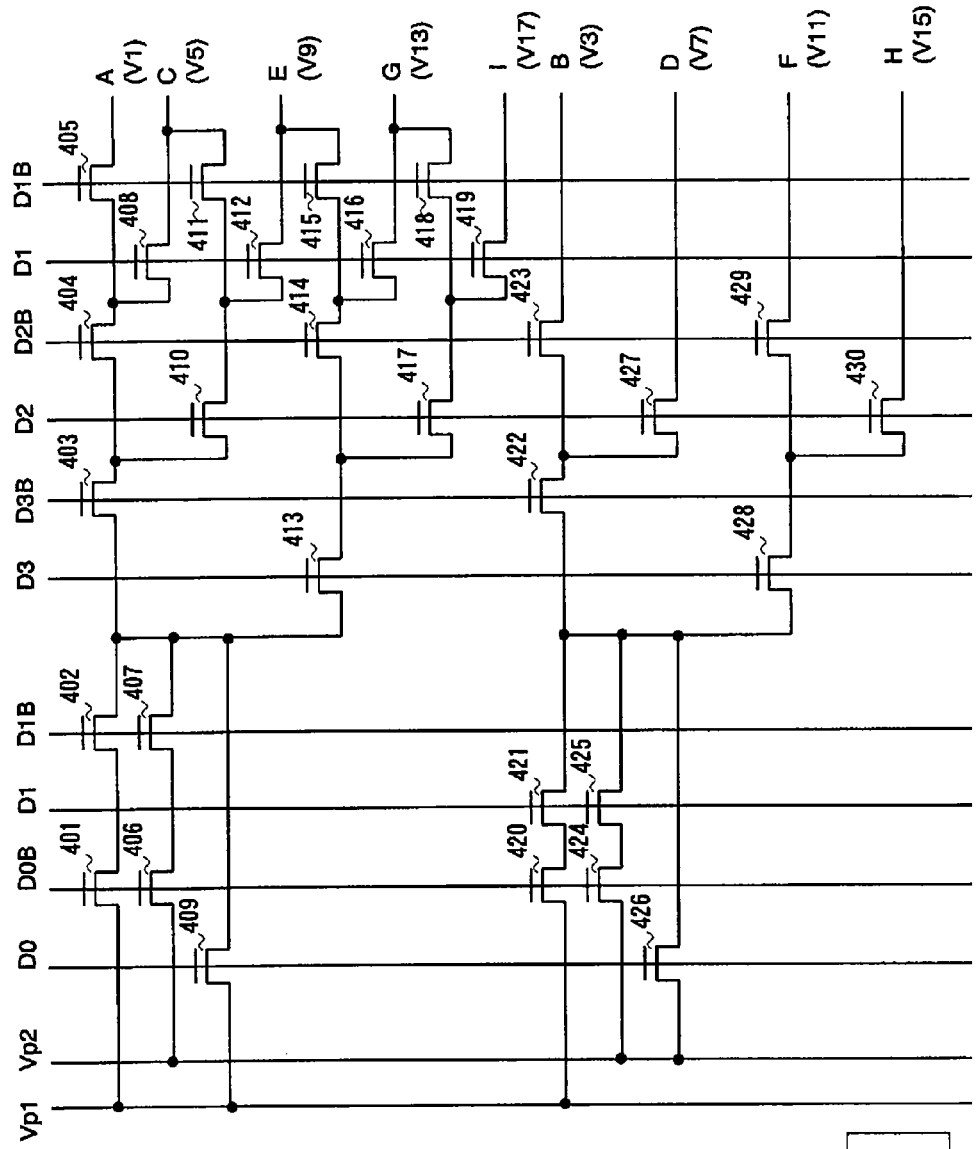
FIG. 35 shows a configuration of the decoder 987 of FIG. 28.
Figure 36:
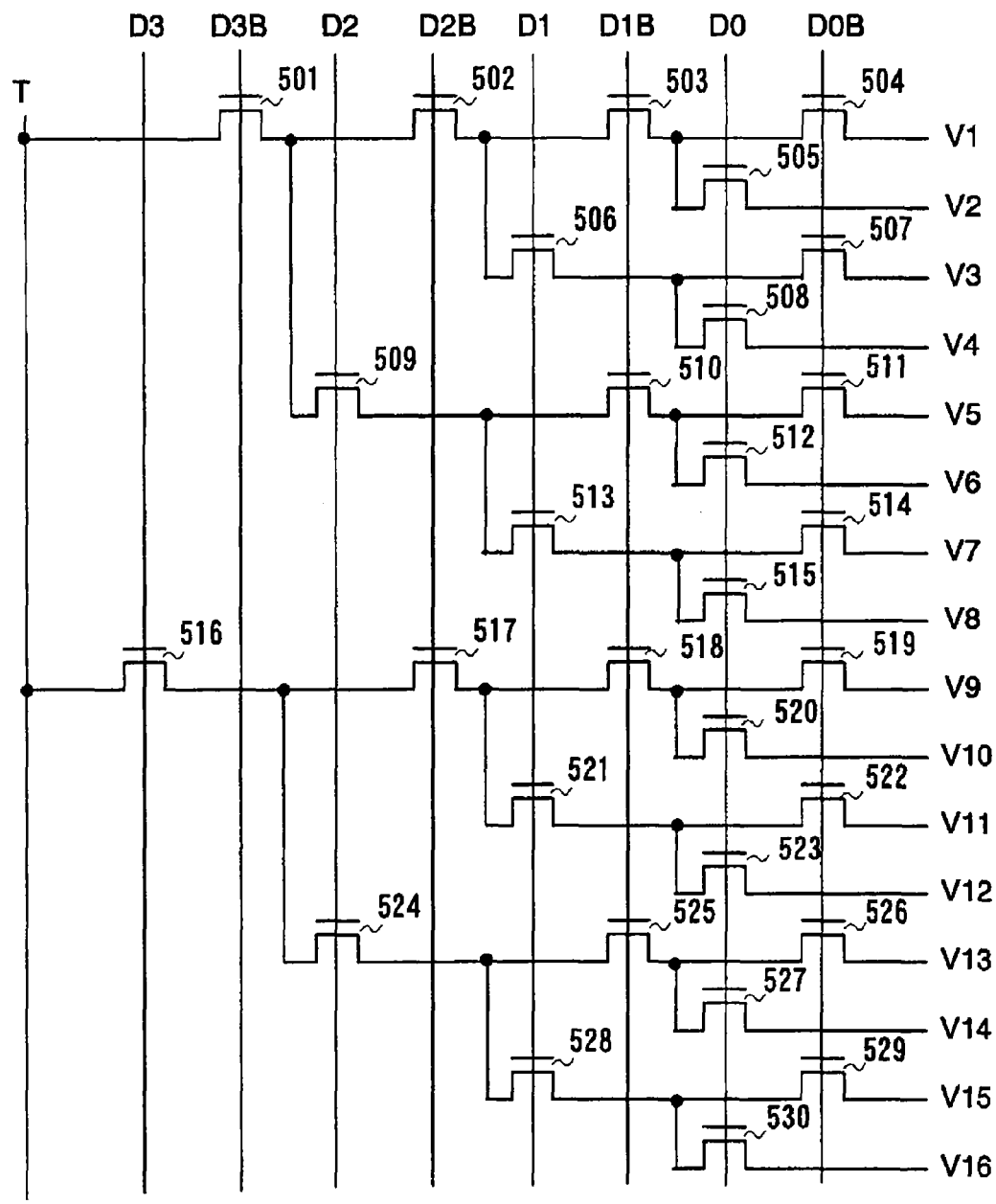
FIG. 36 shows a configuration of a decoder 984 of FIG. 27.

Comparison of the 4-bit decoder with the same 4-bit decoders, shown in FIGS. 35 and 36, indicates that, with the decoder of FIGS. 12 to 14, not only can the number of input voltages (number of the reference voltages) be decreased but also the number of transistors may be reduced from 30 of FIGS. 35 and 36 to only 12 with the configuration shown in FIGS. 13 and 14, such that the space saving effect is higher than in the configuration shown in FIG. 35 or 36.

The space saving effect may be similarly high with the decoder having data inputs of 4 or more bits. Hence, the decoder may be simplified in configuration with saving in space by the application of the present invention.

Figure 15:
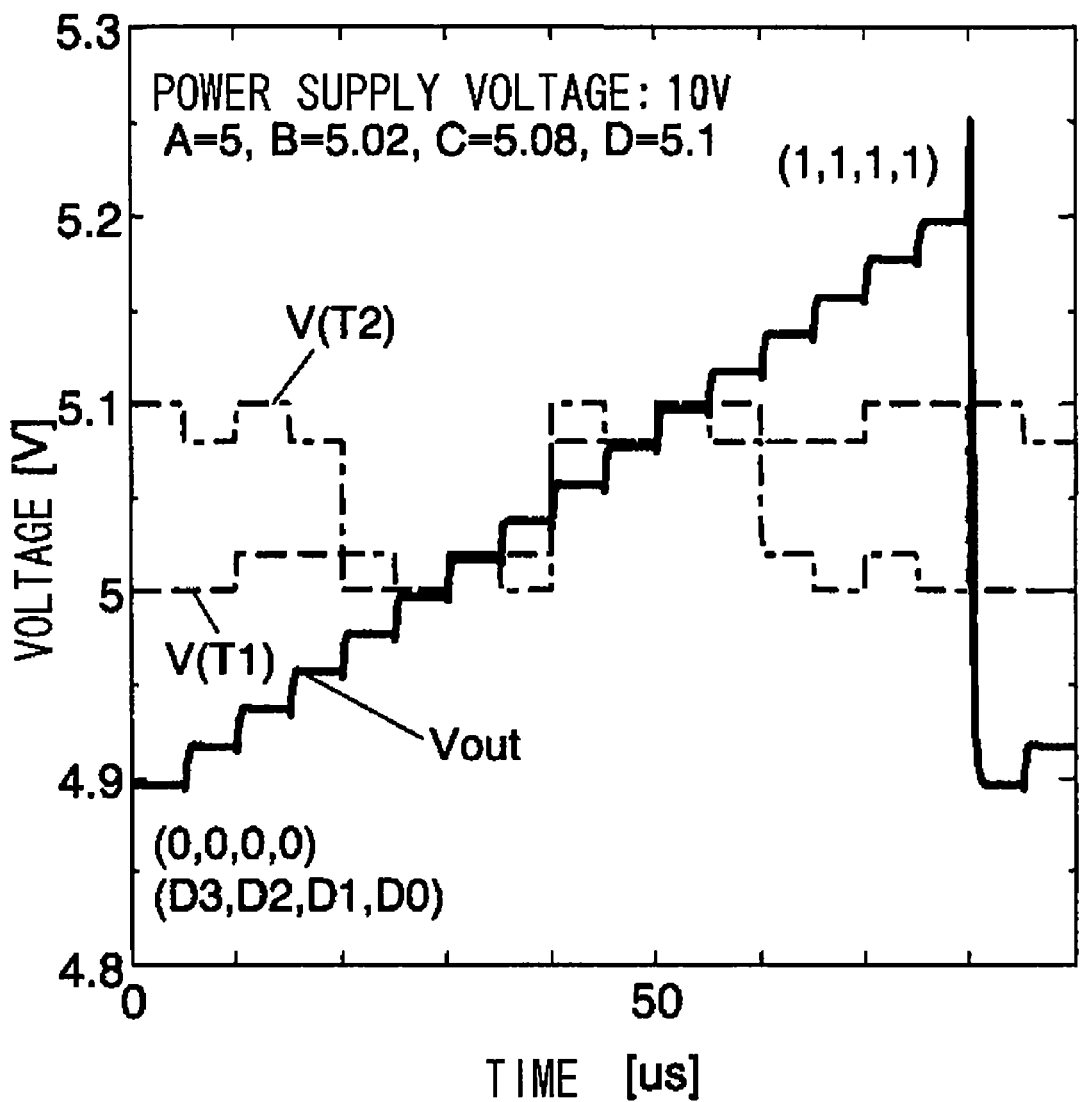
FIG. 15 shows an output waveform of a 4-bit DAC employing a differential amplifier of FIG. 3.

FIG. 15 shows an output waveform of a 4-bit DAC, employing a decoder circuit shown in FIGS. 12 to 14, as the selection circuit 12 of FIG. 1, and differential amplifier shown in FIG. 3 as the amplifier 13 of FIG. 1. Specifically, FIG. 15 depicts output waveforms of the voltages V(T1) and V(T2) of the terminals T1 and T2 and the amplifier output voltage Vout in case the 4-bit data (D3, D2, D1 and D0) are sequentially changed at a preset interval. The input voltages A to D have been set to 5V, 5.02V, 5.08V and 5.1V, whilst the voltage difference between neighboring levels was set to 20 mV. It may be verified from FIG. 15 that 16 levels of from 4.9V to 5.2V may be output to high precision, with the interval of 20 mV, responsive to the 4-bit data from (0,0,0,0) to (1,1,1,1).

As a further modification of the present invention, the configuration of a 6-bit DAC is now described. FIG. 16 depicts the relationship of the input/output level correspondence for showing input/output characteristics of the 6-bit DAC according to the present embodiment. In the present embodiment, a DAC which is selectively supplied with two of the eight input voltages A to H to the terminals T1 and T2 to output 64 voltage levels equal to a second power of 8, is now described. It is noted that the two selected voltages may be equal to or different from each other. The supply selection of the 64 combinations of the eight input voltages A to H to the terminals T1 and T2 is controlled by 6-bit data (D5, D4, D3, D2, D1 and D0).

Meanwhile, when the amplifier 13 is able to output extrapolated (exteriorly divided) voltages, extrapolating the voltages V(T1) and V(T2), supplied to the terminals T1 and T2 respectively, the 64 output voltages may be equally spaced apart from each other. It is noted that the input voltages A to H are set to 22nd, 23rd, 26th, 27th, 38th, 39th, 42nd and 43rd voltage levels.

By setting the eight reference voltages A to H to the 22nd, 23rd, 26th, 27th, 38th, 39th, 42nd and 43rd voltage levels, the selection circuit 12 (decoder circuit) is able to supply, by the 6-bit data signals (selection signals), any of the pairs of:

(1) first and eighth reference voltages (A and H);
(2) first and seventh reference voltages (A and G);
(3) second and eighth reference voltages (B and H);
(4) second and seventh reference voltages (B and G);
(5) first and sixth reference voltages (A and F);
(6) first and fifth reference voltages (A and E);
(7) second and sixth reference voltages (B and F);
(8) second and fifth reference voltages (B and E);
(9) third and eighth reference voltages (C and H);
(10) third and seventh reference voltages (C and G);
(11) fourth and eighth reference voltages (D and H);
(12) fourth and seventh reference voltages (D and G);
(13) third and sixth reference voltages (C and F);
(14) third and fifth reference voltages (C and E);
(15) fourth and sixth reference voltages (D and F);
(16) fourth and fifth reference voltages (D and E);
(17) first and fourth reference voltages (A and D);
(18) first and third reference voltages (A and C);
(19) second and fourth reference voltages (B and D);
(20) second and third reference voltages (B and C);
(21) first and second reference voltages (A and B);
(22) first and first reference voltages (A and A);
(23) second and second reference voltages (B and B);
(24) second and first reference voltages (B and A);
(25) third and fourth reference voltages (C and D);
(26) third and third reference voltages (C and C);
(27) fourth and fourth reference voltages (D and D);
(28) fourth and third reference voltages (D and C);
(29) third and second reference voltages (C and B);
(30) third and first reference voltages (C and A);
(31) fourth and second reference voltages (D and B);
(32) fourth and first reference voltages (D and A);
(33) fifth and eighth reference voltages (E and H);
(34) fifth and seventh reference voltages (E and G);
(35) sixth and eighth reference voltages (F and H);
(36) sixth and seventh reference voltages (F and G);
(37) fifth and sixth reference voltages (E and F);
(38) fifth and fifth reference voltages (E and E);
(39) sixth and sixth reference voltages (F and F);
(40) sixth and fifth reference voltages (F and E);
(41) seventh and eighth reference voltages (G and H);
(42) seventh and seventh reference voltages (G and G);
(43) eighth and eighth reference voltages (H and H);
(44) eighth and seventh reference voltages (H and G);
(45) seventh and sixth reference voltages (G and F);
(46) seventh and fifth reference voltages (G and E);
(47) eighth and sixth reference voltages (H and F);
(48) eighth and fifth reference voltages (H and E);
(49) fifth and fourth reference voltages (E and D);
(50) fifth and third reference voltages (E and C);
(51) sixth and fourth reference voltages (F and D);
(52) sixth and third reference voltages (F and C);
(53) fifth and second reference voltages (E and B);
(54) fifth and first reference voltages (E and A);
(55) sixth and second reference voltages (F and B);
(56) sixth and first reference voltages (F and A);
(57) seventh and fourth reference voltages (G and D);
(58) seventh and third reference voltages (G and C);
(59) eighth and fourth reference voltages (H and D);
(60) eighth and third reference voltages (H and C);
(61) seventh and second reference voltages (G and B);
(62) seventh and first reference voltages (G and A);
(63) eighth and second reference voltages (H and B); and
(64) eighth and first reference voltages (H and A);

to the first and second terminals T1 and T2 of the amplifier 13. When the ratio of extrapolation of the amplifier 13 is 1:2, a voltage twice as large as the first terminal voltage V(T1) is equal to the sum of the second terminal voltage V(T2) and the output voltage Vout, such that first to sixty-fourth voltage levels can be output.

Figure 17:
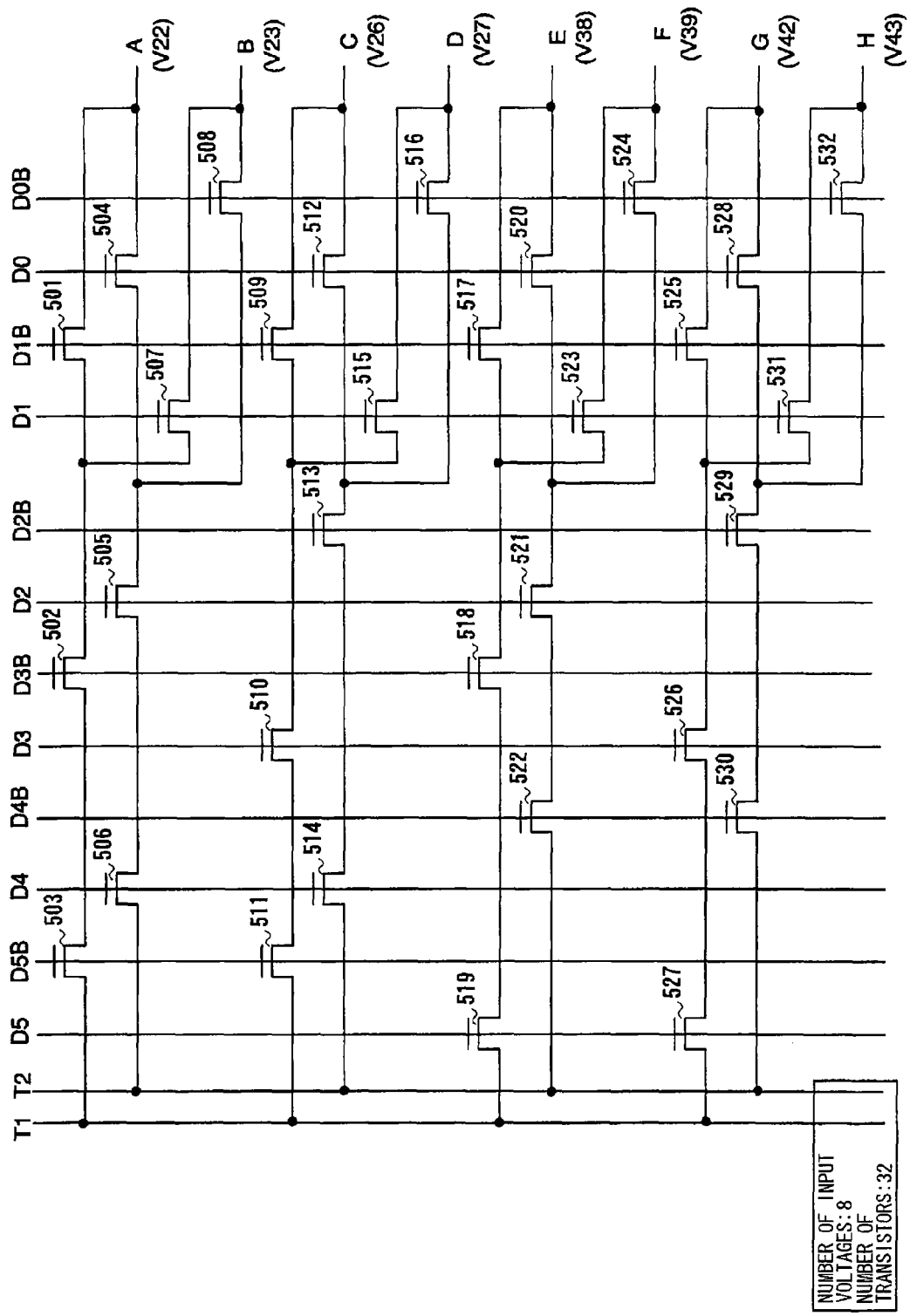
FIG. 17 shows an illustrative configuration of a 6-bit decoder (Nch) for implementing the correlation of FIG. 16.

FIG. 17 shows an exemplary configuration of a 6-bit decoder (made up of n-channel transistors) for implementing the control, shown for example in FIG. 16. FIG. 17 shows a configuration in which the bits are divided into upper four bits (D5, D4, D3 and D2) and lower two bits (D1, D0), and the upper four bits are co-used by the lower two bits to reduce the number of the transistors.

Referring to FIG. 17, this decoder circuit includes first to third switches 501 to 503, connected across the first reference voltage A (terminal supplying the voltage A) and the first terminal T1 and supplied with D1B, D3B and D5B at control terminals thereof, and fourth to sixth switches 504 to 506, connected across the first reference voltage A and the second terminal T2 and supplied with D0, D2 and D4 at control terminals thereof.

The decoder circuit also includes a seventh switch 507, connected across the second reference voltage B (terminal supplying the voltage B) and the first and second switches 501 and 502, and supplied with D1 at a control terminal thereof, and an eighth switch 508, connected across the second reference voltage B and a connection node of the fourth and fifth switches 504 and 505, and supplied with D0B at a control terminal thereof.

The decoder circuit also includes ninth to 11th switches 509 to 511, connected across the third reference voltage C (terminal supplying the voltage C) and the first terminal T1 and supplied with D1B, D3 and D5B at control terminals thereof, and 12th to 14th switches 512 to 514, connected across the third reference voltage C and the second terminal T2 and supplied with D0, D2B and D4 at control terminals thereof.

The decoder circuit also includes a 15th switch 515, connected across the fourth reference voltage D (terminal supplying the voltage D) and a connection node of the ninth and tenth switches 509 and 510, and supplied with D1 at a control terminal thereof, and a 16th switch 516, connected across the second reference voltage D and a connection node of the 12th and 13th switches 512 and 513, and supplied with D0B at a control terminal thereof.

The decoder circuit also includes 17th to 19th switches 517 to 519, connected across the fifth reference voltage E (terminal supplying the voltage E) and the first terminal T1 and supplied with D1B, D3B and D5 at control terminals thereof, and 20th to 22nd switches 520 to 522, connected across the fifth reference voltage E and the second terminal T2 and supplied with D0, D2 and D4B at control terminals thereof.

The decoder circuit also includes a 23rd switch 523, connected across the sixth reference voltage F (terminal supplying the voltage F) and a connection node of the 17th and 18th switches 517 and 518, and supplied with D1 at a control terminal thereof, and a 24th switch 524, connected across the sixth reference voltage F and a connection node of the 20th and 21st switches 520, 521, and supplied with D0B at a control terminal thereof.

The decoder circuit also includes 25th to 27th switches 525 to 527, connected across the seventh reference voltage G (terminal supplying the voltage G) and the first terminal T1 and supplied with D1B, D3 and D5 at control terminals thereof, and 28th to 30th switches 528 to 530, connected across the seventh reference voltage G and the second terminal T2 and supplied with D0, D2 and D4B at control terminals thereof.

The decoder circuit also includes a 31st switch 531, connected across the eighth reference voltage H (terminal supplying the voltage H) and a connection node of the 25th and 26th switches 525 and 526, and supplied with D1 at a control terminal thereof, and a 32nd switch 532, connected across the eighth reference voltage H and a connection node of the 28th and 29th switches 528 and 529, and supplied with D0B at a control terminal thereof.

The configuration of FIG. 17 may be formed by eight input voltages and 32 transistors 501 to 532. Thus, with use of the present invention, the decoder may appreciably be simplified to save the space. The sequence of the bit signals D5, D4, D3, D2 and D1 may be arbitrary. The configuration of FIG. 17 may optionally be changed provided that the configuration in which a preset reference voltage and a preset terminal (T1 or T2) are interconnected via plural switches supplied with a preset signal at control terminal thereof is similar to that shown in FIG. 17.

Figure 18:
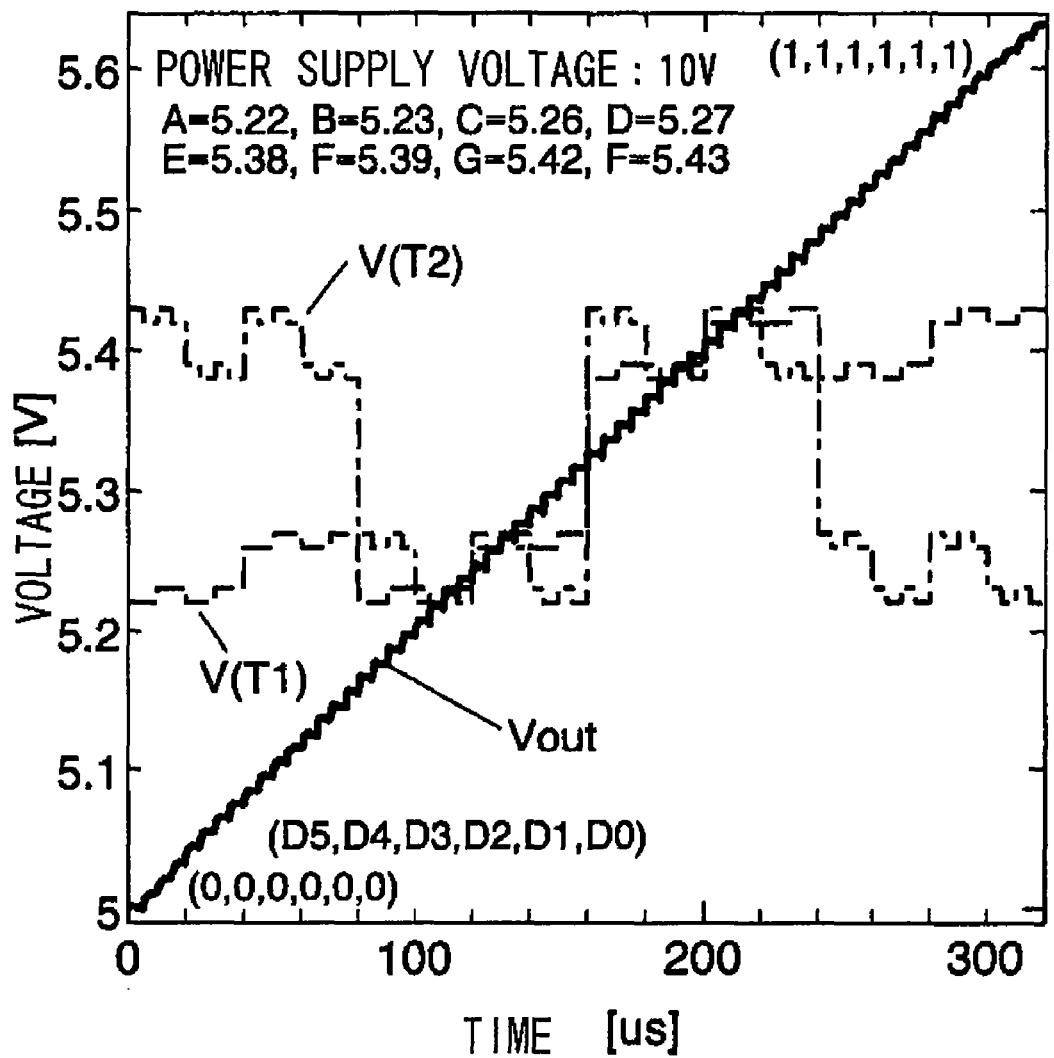
FIG. 18 shows an output waveform of a 6-bit DAC employing a decoder of FIG. 17 and a differential amplifier of FIG. 3.

FIG. 18 depicts an output waveform of a 6-bit DAC employing the decoder circuit shown in FIG. 17 as the selection circuit 12 of FIG. 1 and also employing a differential amplifier of FIG. 3 as the amplifier 13 of FIG. 1. FIG. 18 depicts the voltages V(T1) and V(T2), at the terminals T1 and T2 and the amplifier output voltage Vout, in case the 6-bit data D5, D4, D3, D2, D1 and D0 have been sequentially changed at a preset interval. The input voltages A to H were set to 5.22V, 5.23V, 5.26V, 5.27V, 5.38V, 5.39V, 5.42V and 5.43V, respectively, while the voltage difference between neighboring levels was set to 10 mV. It may be verified from FIG. 18 that 64 levels from 5.01V to 5.64V, spaced apart from each other by 10 mV, can be output to a high accuracy.

The case of outputting a number of voltage levels, equal to a second power of the number of input voltages, in the DACs having 2, 4 and 6 bit data input, has been explained above. Although the number of the input voltages is optional, the number of the input voltages m is preferably set to a power of 2, that is, a K'th power of 2, K being an integer not less than 1, such that m=2, 4, 8, in case equally spaced apart voltage levels are output. In this case, for consecutive output levels (first to $4^K$'th levels), the number of which is equal to a square ($=4^K$) of the number of the input voltages ($=2^K$), each input voltage is set to a level of the rank given by the following equation (16):

$$\{1+a\times 4^{(K-1)}+b\times 4^{(K-2)}+c\times 4^{(K-3)}+\ldots\} \quad (16)$$

In the equation (16), the coefficients a, b, c, . . . , are 1 or 2, and a term of the power of 4 is set to 0 if the value of the term is less than unity (that is, $4^{(K-X)}<1$, X being a positive number).

For example, with K=1, the number of the input voltages m is such that m=$2^K$=2, with the two input voltages being a {1+a} level (a=1 or 2). That is, the input voltages A and B are levels 2 and 3, as shown FIG. 7.

In case K=2, the number of the input voltages m is such that m=$2^K$=4, with the four input voltages being {1+a×4+b} levels (a, b=1, 2). That is, the four input voltages A, B, C and D are level 6 (a=b=1), level 7 (a=1, b=2), level 10 (a=2, b=1) and level 11 (a=2, b=2), as shown in FIG. 11.

With K=3, the number of input voltages m is such that m=$2^K$=8. The eight input voltages, from among 64 consecutive output levels, are $$\{1+a\times 4^2+b\times 4+c\} \text{ levels (a,b,c=1,2)}$$

and the levels 22, 23, 26, 27, 38, 39, 42 and 43, corresponding to triplets of coefficients (a, b, c)=(1,1,1), (1,1,2), (1,2,1), (1,2,2), (2,1,1), (2,1,2), (2,2,1) and (2,2,2), respectively, become input voltages A to H shown in FIG. 16.

The setting of these input voltages coincides with that of the DACs with data inputs of 2, 4 and 6 bits (FIGS. 7, 11 and 16).

It is possible to output a square of a number of input voltages different than K'th power of 2. However, it is then more or less difficult to set regular output levels. A specified example for this case is now explained for the number of input voltages m=3.

FIGS. 19 and 20 show an embodiment for the number of input voltages m=3, and depict two sorts of the input/output level correspondence. In FIG. 19, the input voltages are set so that a number of output levels equal to the square of the number of input voltages of 3, that is, 9 output levels, are obtained for three input voltages (A, B and C).

If the first to third reference voltages (A, B and C) are labeled (Vo4, Vo5 and Vo7), the selection circuit is able to supply any one of the following reference voltage pairs of:
 (1) first and third reference voltages (A and C);
 (2) second and third reference voltages (B and C);
 (3) first and second reference voltages (A and B);
 (4) first and first reference voltages (A and A);
 (5) second and second reference voltages (B and B);
 (6) second and first reference voltages (B and A);
 (7) third and third reference voltages (C and C);
 (8) third and second reference voltages (C and B); and
 (9) third and first reference voltages (C and A)
to the first and second terminals T1 and T2 of the amplifier 13, based on the selection signal.

The nine output voltages Vo1 to Vo9 correspond to levels 1, 3, 5, 6, 7, 9, 12 and 13, out of equally spaced apart 13 levels. That is, the interval of a certain pair or pairs of neighboring voltage levels differs from that of other pairs of neighboring voltage levels, such that the nine voltage levels are not equally spaced apart from one another. That is, in the present case, the input/output characteristics are not linear. Meanwhile, the settings of the three input voltages (A, B and C) which will give nine different output levels Vo1 to Vo9, and which differ from that shown in FIG. 19, are possible, however, none of these settings gives equally spaced apart output levels.

In FIG. 20, the three input levels are set so that, for the input voltages (A, B and C), the output levels will be spaced apart equally from one another. For the input voltages (A, B and C) of (Vo3, Vo4 and Vo5), the selection circuit 12 is able to supply reference voltage pairs, that is,
 (1) first and third reference voltages (A and C);
 (2) first and second reference voltages (A and B);
 (3) first and first reference voltages (A and A) or second and third reference voltages (B and C);
 (4) second and second reference voltages (B and B);
 (5) third and third reference voltages (C and C) or second and first reference voltages (B and A);
 (6) third and second reference voltages (C and B); and
 (7) third and first reference voltages (C and A)
to the first and second terminals T1 and T2, based on the selection signal.

By the overlap between two sets of the V(T1) and V(T2), corresponding to the output levels Vo3 and Vo5, overlap with each other, it is only possible to produce seven output levels lesser by 2 than the square of the number 3 of the input voltages, that is, nine. In this manner, if, in case the number of the input voltages m is not the power of 2, an attempt is made to produce the equally spaced output voltage levels, the number of the output voltage levels is lesser than the square of the number of the input voltages.

As a further modification of the present invention, the DAC (digital analog converter), used in a driver for a liquid crystal display device is explained. With the DAC used in the driver, the grayscale voltage interval must be adjusted in dependence upon a gamma curve of the liquid crystal.

Figure 25:
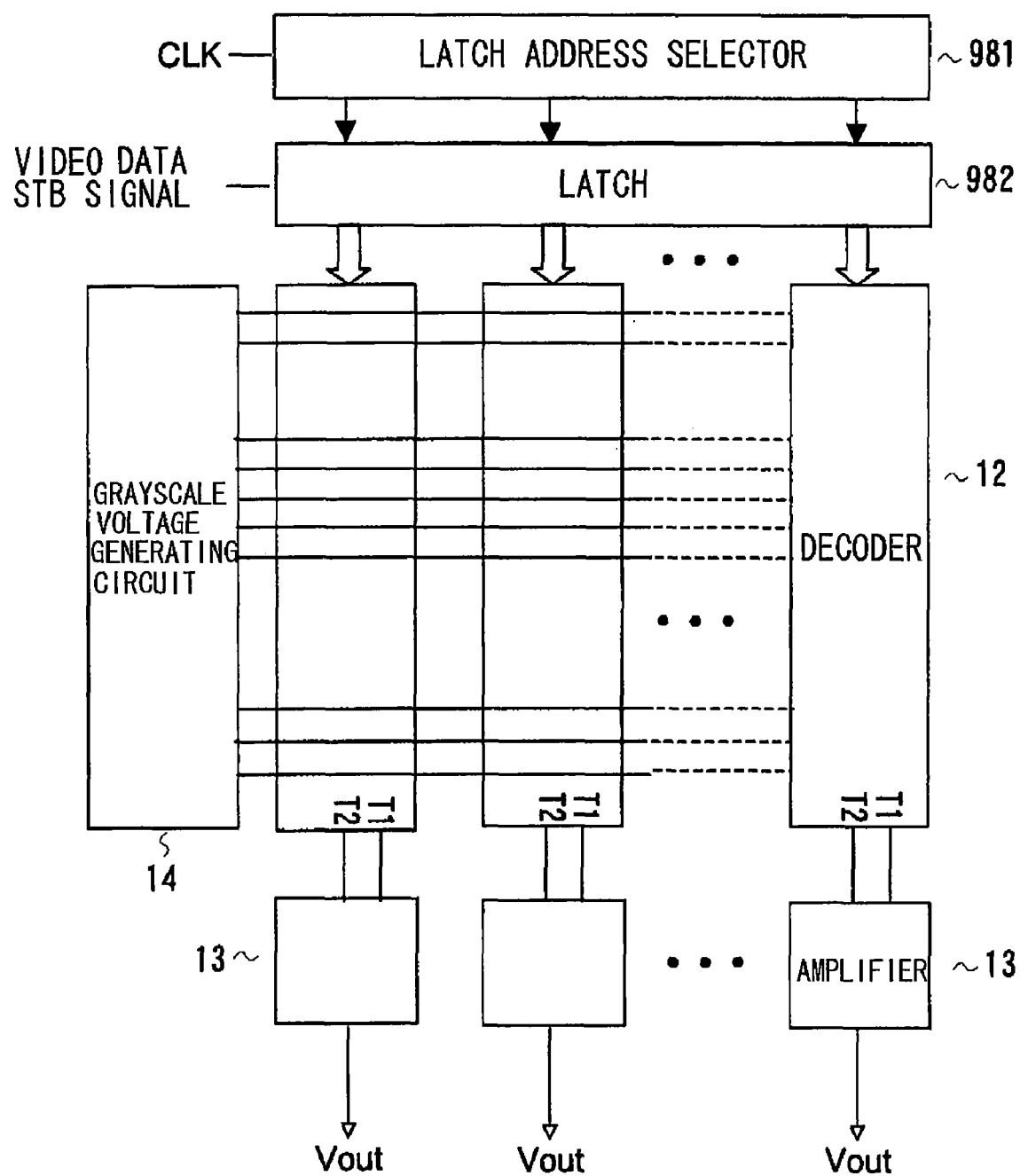
FIG. 25 shows a configuration of a data driver embodying the present invention.

The gamma curve, approximately linear for a half tone, is changed in gradient in the vicinity of the maximum grayscale position or the minimum grayscale position (see the explanation for FIG. 25). Thus, with the DAC in the driver, it is desirable to use the combination of the decoders, with the number of the input voltages of 2, 4 or 8, described above. The DAC having a 5-bit data input and a 32-level output, as a practical example, is hereinafter explained.

FIG. 21 depicts the input/output correspondence of the DAC according to the present embodiment, and more specifically, the relationship of the input/output correspondence of the DAC, supplied with 5-bit data (D4, D3, D2, D1 and D0) to output 32 voltage levels. In the present embodiment, the first to 32nd voltage levels (output range) are separated into first to fourth voltage levels (first section), fifth to eighth voltage levels (second section), ninth to 24th voltage levels (third section), 25th to 28th voltage levels (fourth section) and 29th to 32nd voltage levels (fifth section).

In the respective sections, the voltage difference between neighboring grayscale levels, which is equal insofar as each section is concerned, may be set individually. With the present embodiment, twelve reference voltages are supplied to the selection circuit 12, and the first to twelfth reference voltages (A1, B1, A2, B2, A3, B3, C3, D3, A4, B4, A5 and B5) are set to the second, third, sixth, seventh, 14th, 15th, 18th, 19th, 26th, 27th, 30th and 31st levels, respectively, as shown in FIG. 21.

The selection circuit 12 of FIG. 1 is able to output any of the following reference voltage pairs of:
 (1) first and second reference voltages (A1 and B1);
 (2) first and first reference voltages (A1 and A1);
 (3) second and second reference voltages (B1 and B1);
 (4) second and first reference voltages (B1 and A1);
 (5) third and fourth reference voltages (A2 and B2);
 (6) third and third reference voltages (A2 and B2);
 (7) fourth and fourth reference voltages (B2 and B2);
 (8) fourth and third reference voltages (B2 and A2);
 (9) fifth and eighth reference voltages (A3 and D3);
 (10) fifth and seventh reference voltages (A3 and C3);
 (11) sixth and eighth reference voltages (B3 and D3);
 (12) sixth and seventh reference voltages (B3 and C3);
 (13) fifth and sixth reference voltages (A3 and B3);
 (14) fifth and fifth reference voltages (A3 and A3);
 (15) sixth and sixth reference voltages (B3 and B3);
 (16) sixth and fifth reference voltages (B3 and A3);
 (17) seventh and eighth reference voltages (C3 and D3);
 (18) seventh and seventh reference voltages (C3 and C3);
 (19) eighth and eighth reference voltages (D3 and D3);
 (20) eighth and seventh reference voltages (D3 and C3);
 (21) seventh and sixth reference voltages (C3 and B3);
 (22) seventh and fifth reference voltages (C3 and A3);
 (23) eighth and sixth reference voltages (D3 and B3);
 (24) eighth and fifth reference voltages (D3 and A3);
 (25) ninth and tenth reference voltages (A4 and B4);
 (26) ninth and ninth reference voltages (A4 and A4);
 (27) tenth and tenth reference voltages (B4 and B4);
 (28) tenth and ninth reference voltages (B4 and A4);
 (29) 11th and 12th reference voltages (A5 and B5);
 (30) 11th and 11th reference voltages (A5 and A5);
 (31) 12th and 12th reference voltages (B5 and B5); and
 (32) 12th and 11th reference voltages (B5 and A5)
to the first and second terminals T1 and T2 of the amplifier 13, based on the 5-bit selection signal.

If the ratio of extrapolation of the amplifier 13 is 1:2, the voltage twice as large as the first terminal voltage V(T1) is equal to the sum of the second terminal voltage V(T2) and the output voltage Vout, thus enabling the first to 32nd voltage levels to be output.

Thus, the DAC, the input/output conversion characteristics of which are shown in FIG. 21, is of such a configuration that four voltage levels of the first to fourth voltage levels (first section) are output by supply control of the input voltages (A1 and B1) for the terminals (T1 and T2), four voltage levels of the fifth to eighth voltage levels (second section) are output by supply control of the input voltages (A2 and B2), 16 voltage levels of the ninth to 24th voltage levels (third section) are output by supply control of the input voltages (A3, B3, C3 and D3), four voltage levels of the 25th to 28th voltage levels (fourth section) are output by supply control of the input voltages (A4, B4) and four voltage levels of the 29th to 32nd voltage levels (fifth section) are output by supply control of the input voltages (A5 and B5).

That is, the configuration of FIG. 21 is a DAC obtained on combining supply control with the number of the input voltages (reference voltages) being two and supply control with the number of the input voltages (reference voltages) being four.

FIG. 22 shows a modification example of FIG. 21 and, similarly to FIG. 20, depicts the input/output correspondence of the DAC outputting 32 voltage levels. Here, the voltage levels are divided into four sections, that is, a first section comprised of the first to fourth levels, a second section comprised of the fifth to 16th levels, a third section of 17th to 28th levels and a fourth section of the 29th to 32nd levels. In each section, the voltage difference between neighboring grayscale levels may be individually set, with the proviso that the grayscale levels are equally spaced apart in each section.

In the present embodiment, 12 reference voltages are supplied to the selection circuit 12, and the first to twelfth reference voltages (A1, B1, A2, B2, C2, D2, A3, B3, C3, D3, A4 and B4) are set to the second, third, sixth, seventh, tenth, eleventh, 22nd, 23rd, 26th, 27th, 30th and 31st levels, respectively.

The selection circuit 12 of FIG. 1 is able to output any of reference voltage pairs of:
  (1) first and second reference voltages (A1 and B1);
  (2) first and first reference voltages (A1 and A1);
  (3) second and second reference voltages (B1 and B1);
  (4) second and first reference voltages (B1 and A1);
  (5) third and fourth reference voltages (A2 and B2);
  (6) third and third reference voltages (A2 and A2);
  (7) fourth and fourth reference voltages (B2 and B2);
  (8) fourth and third reference voltages (B2 and A2);
  (9) fifth and sixth reference voltages (C2 and D2);
  (10) fifth and fifth reference voltages (C2 and C2);
  (11) sixth and sixth reference voltages (D2 and D2);
  (12) sixth and fifth reference voltages (D2 and C2);
  (13) fifth and fourth reference voltages (C2 and B2);
  (14) fifth and third reference voltages (C2 and A2);
  (15) sixth and fourth reference voltages (D2 and B2);
  (16) sixth and third reference voltages (D2 and A2);
  (17) seventh and tenth reference voltages (A3 and D3);
  (18) seventh and ninth reference voltages (A3 and C3);
  (19) eighth and tenth reference voltages (B3 and D3);
  (20) eighth and ninth reference voltages (B3 and C3);
  (21) seventh and eighth reference voltages (A3 and B3);
  (22) seventh and seventh reference voltages (A3 and A3);
  (23) eighth and eighth reference voltages (B3 and B3);
  (24) eighth and seventh reference voltages (B3 and A3);
  (25) ninth and tenth reference voltages (C3 and D3);
  (26) ninth and ninth reference voltages (C3 and C3);
  (27) tenth and tenth reference voltages (D3 and D3);
  (28) tenth and ninth reference voltages (D3 and C3);
  (29) 11th and 12th reference voltages (A4 and B4);
  (30) 11th and 11th reference voltages (A4 and A4);
  (31) 12th and 12th reference voltages (B4 and B4); and
  (32) 12th and 11th reference voltages (B4 and A4)
to the first and second terminals T1 and T2 of the amplifier 13, based on the 5-bit selection signal.

When the ratio of extrapolation of the amplifier 13 is 1:2, the voltage twice as large as the first terminal voltage V(T1) is equal to the sum of the second terminal voltage V(T2) and the output voltage Vout, thus enabling the first to 32nd voltage levels to be output.

Thus, the DAC, the input/output conversion characteristics of which are shown in FIG. 22, is of such a configuration that, for the terminals (T1 and T2), four voltage levels of the first to fourth voltage levels (first section) are output by performing supply control of the input voltages (A1 and B1), 12 voltage levels of the fifth to 16th voltage levels (second section) are output by performing supply control of the input voltages (A2, B2, C2 and D2), 12 voltage levels of the 17th to 28th voltage levels (third section) are output by performing supply control of the input voltages (A3, B3, C3 and D3), and four voltage levels of the 29th to 32nd voltage levels (fourth section) are output by performing supply control of the input voltages (A4, B4).

That is, the configuration of FIG. 22 is again a DAC obtained on combining supply control with the number of the input voltages (reference voltages) being two and supply control with the number of the input voltages (reference voltages) being four.

Meanwhile, in the example shown in FIG. 22, the first to fourth voltage levels are selected by supply control of the first and second reference voltages (A1, B1). Alternatively, these voltage levels may also be selected by supply control of the third to sixth reference voltages (A2, B2, C2 and D2).

However, in the present embodiment, shown in FIG. 22, the first and second reference voltages (A1, B1) are provided for the first to fourth voltage levels (first section) and for the fifth to 16th voltage levels (second section), so that the voltage differences between neighboring grayscale levels may be individually set, and the first to fourth voltages are output accordingly.

Thus, if, in the present embodiment, plural supply controls are formed in combination, the output voltage levels of the supply controls may partially be overlapped depending on the setting of the voltage differences between the neighboring grayscale levels.

In the foregoing, a certain preferred example of the 5-bit data input DAC, capable of adjusting the voltage differences between output voltage levels, has been shown. The specified example, shown in FIGS. 21 and 22, is merely illustrative, and optimum configurations may be implemented by a variety of combinations of the plural supply controls.

Figure 23:
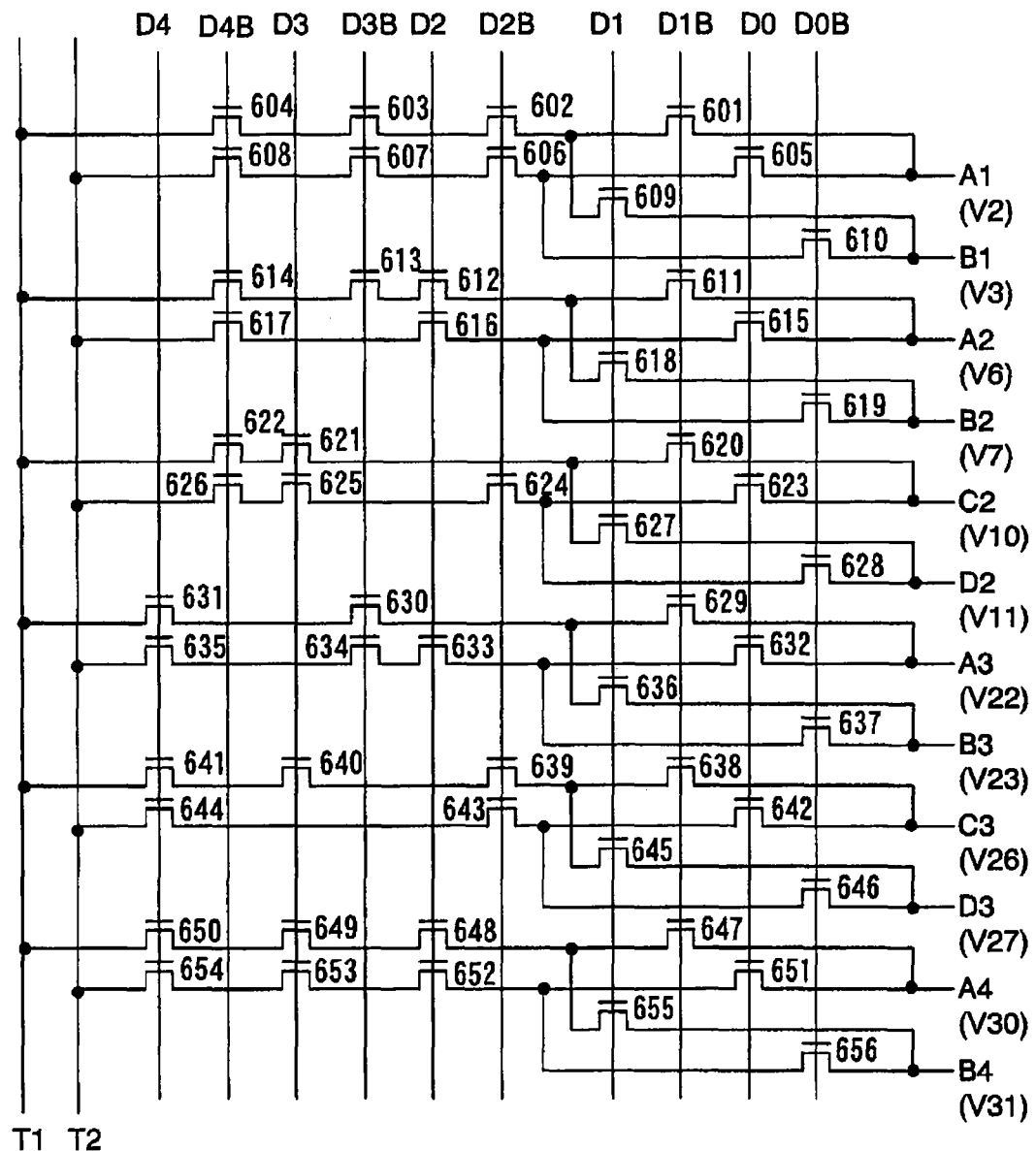
FIG. 23 shows an illustrative configuration of a 5-bit decoder (Nch) for the correlation of FIG. 22.

FIG. 23 depicts an illustrative configuration of the 5-bit decoder (made up of n-channel transistors) capable of implementing the control of FIG. 22. FIG. 23 shows a configuration in which the bits are divided into upper three bits (D4, D3 and D2) and lower two bits (D1, D0) and the upper three bits are co-used with respect to the lower two bits to reduce the number of the transistors.

Referring to FIG. 23, this decoder circuit includes first to fourth switches 601 to 604, connected across the first reference voltage A1 and the first terminal T1, and supplied with D1B, D2B, D3B and D4B at control terminals thereof, and fifth to eighth switches 605 to 608, connected across the first reference voltage A1 and the second terminal T2, and supplied with D0, D2B, D3B and D4B at control terminals thereof.

The decoder circuit also includes a ninth switch 609, connected across the second reference voltage B1 and the connection node of the first and second switches 601 and 602, and supplied with D1 at a control terminal thereof, and a tenth switch 610, connected across the second reference voltage B1 and the connection node of the fifth and sixth switches 605 and 606, and supplied with D0B at a control terminal thereof.

The decoder circuit also includes 11th to 15th switches 611 to 615, connected across the third reference voltage A2 and the first terminal T1, and supplied with D1B, D2, D3B and D4B at control terminals thereof, and 15th to 17th switches 615 to 617, connected across the third reference voltage A2 and the second terminal T2, and supplied with D0, D2 and D4B at control terminals thereof.

The decoder circuit also includes an 18th switch 618, connected across the fourth reference voltage B2 and the connection node of the 11th and 12th switches 611 and 612, and supplied with a second signal D1 at a control terminal thereof, and a 19th switch 619, connected across the fourth reference voltage B2 and the connection node of the 15th and 16th switches 615 and 616, and supplied with D0B at a control terminal thereof.

The decoder circuit also includes 20th to 22nd switches 620 to 622, connected across the fifth reference voltage C2 and the first terminal T1, and supplied with D1B, D3 and D4B at control terminals thereof, and 23rd to 26th switches 623 to 626, connected across the fifth reference voltage C2 and the second terminal T2, and supplied with D0, D2B, D3 and D4B at control terminals thereof.

The decoder circuit also includes a 27th switch 627, connected across the sixth reference voltage D2 and the connection node of the 20th and 21st switches 620 and 621, and supplied with D1 at a control terminal thereof, and a 28th switch 628, connected across the sixth reference voltage D2 and the connection node of the 23rd and 24th switches 623 and 624, and supplied with D0B at a control terminal thereof.

The decoder circuit also includes 29th to 31st switches 629 to 631, connected across the seventh reference voltage A3 and the first terminal T1, and supplied with D1B, D3B and D4 at control terminals thereof, and 32nd to 35th switches 632 to 635, connected across the seventh reference voltage A3 and the second terminal T2, and supplied with D0, D2, D3B and D4 at control terminals thereof.

The decoder circuit also includes a 36th switch 636, connected across the eighth reference voltage B3 and the connection node of the 29th and 30th switches 629 and 630, and supplied with D1 at a control terminal thereof, and a 37th switch 637, connected across the eighth reference voltage B3 and the connection node of the 32nd and 33rd switches 632 and 633, and supplied with D0B at a control terminal thereof.

The decoder circuit also includes 38th to 41st switches 638 to 641, connected across the ninth reference voltage C3 and the first terminal T1, and supplied with D1B, D2B, D3 and D4 at control terminals thereof, and 42nd to 44th switches 642 to 644, connected across the ninth reference voltage C3 and the second terminal T2, and supplied with D0, D2B and D4 at control terminals thereof.

The decoder circuit also includes a 45th switch 645, connected across the tenth reference voltage D3 and the connection node of the 38th and 39th switches 638 and 639, and supplied with D1 at a control terminal thereof, and a 46th switch 646, connected across the tenth reference voltage D3 and the connection node of the 42nd and 43rd switches 642, 643, and supplied with D0B at a control terminal thereof.

The decoder circuit also includes 47th to 50th switches 647 to 650, connected across the 11th reference voltage A4 and the first terminal T1, and supplied with D1B, D2, D3 and D4 at control terminals thereof, and 51st to 54th switches 651 to 654, connected across the 11th reference voltage A4 and the second terminal T2, and supplied with D0, D2, D3 and D4 at control terminals thereof.

The decoder circuit also includes a 55th switch 655, connected across the 12th reference voltage B4 and the connection node of the 47th and 48th switches 647 and 648, and supplied with D1 at a control terminal thereof, and a 56th switch 656, connected across the 12th reference voltage B4 and the connection node of the 51st and 52nd switches 651 and 652, and supplied with D0B at a control terminal thereof.

That is, the decoder shown in FIG. 23 may be made up of 12 input voltages and 56 transistors.

With use of the present invention, a decoder conforming to the input/output characteristic such as a gamma curve may be constructed with a relatively simplified configuration, while space saving may be achieved. The order of the bit signals (D4, D3, D2, D1 and D0) and the inverted versions thereof is arbitrary. The decoder configuration may also be optionally changed provided that the configuration in which the preset reference voltage and the preset terminal (T1 or T2) are interconnected by plural switches, the control terminals of which are supplied with preset signals.

Figure 24:
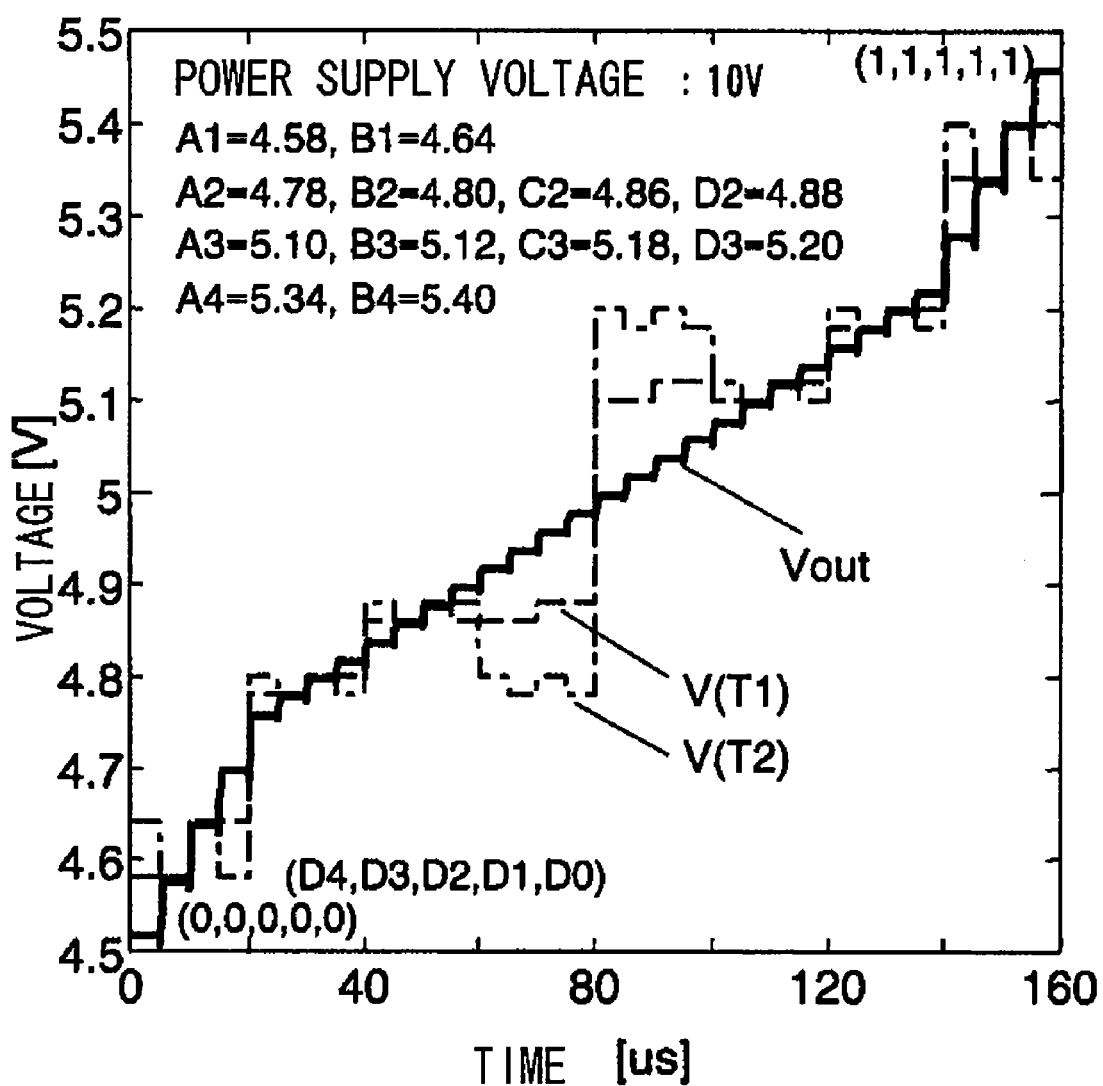
FIG. 24 shows an output waveform of a 5-bit decoder (Nch) for implementing the correlation of FIG. 22.

FIG. 24 shows an output waveform of a 5-bit DAC employing the decoder configuration of FIG. 23 as the selection circuit 12 of FIG. 1 and also employing the differential amplifier of FIG. 3 as the amplifier 13. FIG. 24 shows the output voltage waveform of the amplifier output voltage Vout and the voltages V(T1) and V(T2) at the terminals T1 and T2 in case the 5-bit data (D4, D3, D2, D1 and D0) have been changed at a preset interval.

As for the input voltages (A1, B1, A2, B2, C2, D2, A3, B3, C3, D3, A4 and B4), A1=4.58V, B1=4.64V, A4=5.34V and B4=5.4V with the voltage difference between neighboring grayscale levels for the first to fourth voltage levels (first section) and for the 29th to 32nd voltage levels (fourth section) set to 60 mV. A2=4.7V, B2=4.8V, C2=4.86V, D2=4.88V, A3=5.1V, B3=5.12V, C3=5.18V and D3=5.2V with the voltage difference between neighboring grayscale levels for the fifth to 16th voltage levels (second section) and for the 17th to 28th voltage levels (third section) set to 20 mV.

It may be ascertained from FIG. 24 that the interval between the grayscale voltages is changed between the fourth and the fifth voltage levels (boundary between the first and second sections) and between the 28th and 29th voltage levels (boundary between the third and the fourth sections), and that the distance between the grayscale voltages may be adjusted.

By employing plural supply controls in combinations, it is possible to optimize the designing of the DAC in keeping with the gamma curve. Thus, with the DAC of the present invention, the configuration may be made to conform to the gamma curve, while the numbers of the input voltages (grayscale voltages) and the transistors making up the decoder are small, thus achieving the DAC with space saving.

Figure 28:
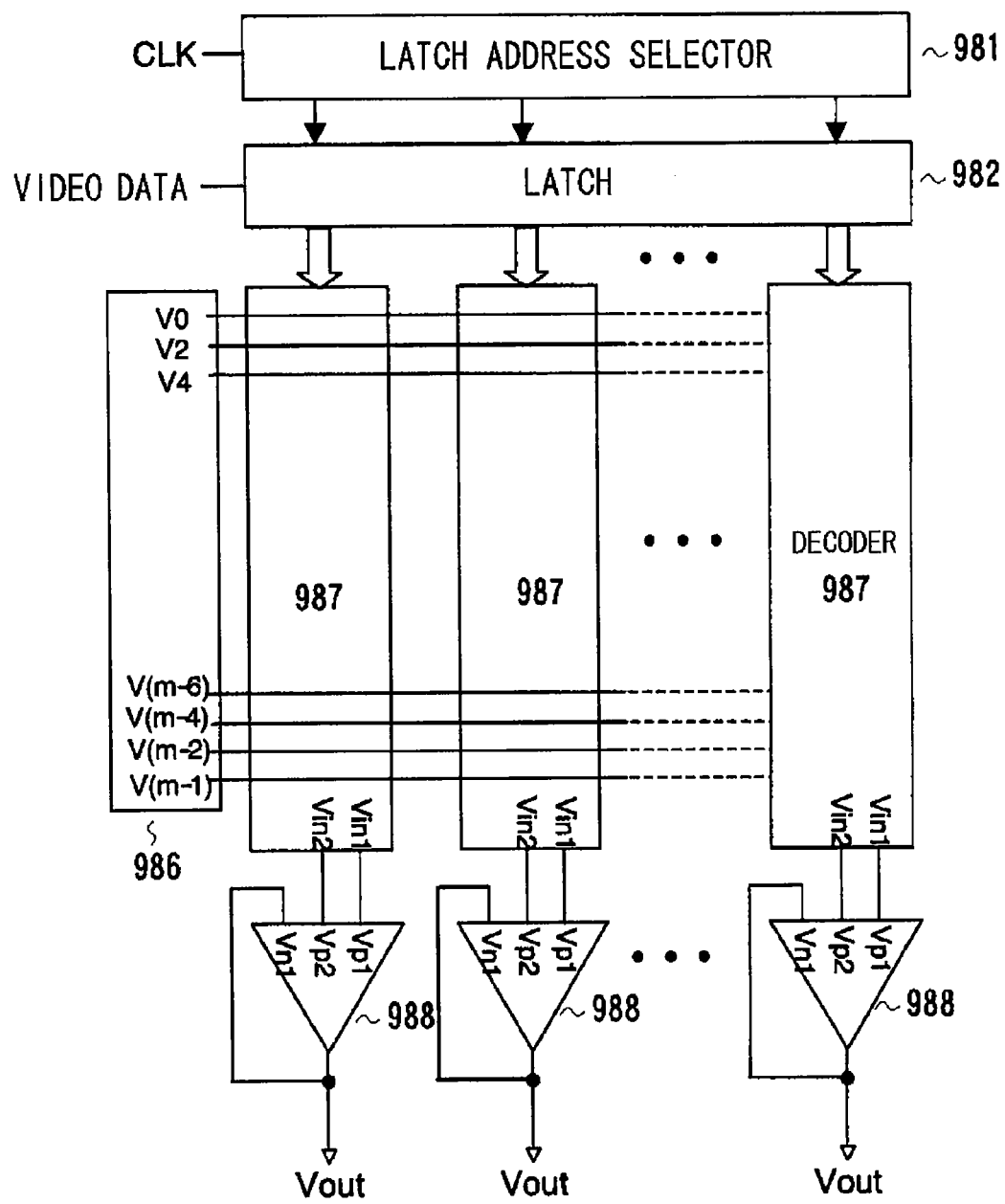
FIG. 28 shows a configuration of a data driver stated in the Patent Document1.
Figure 29:
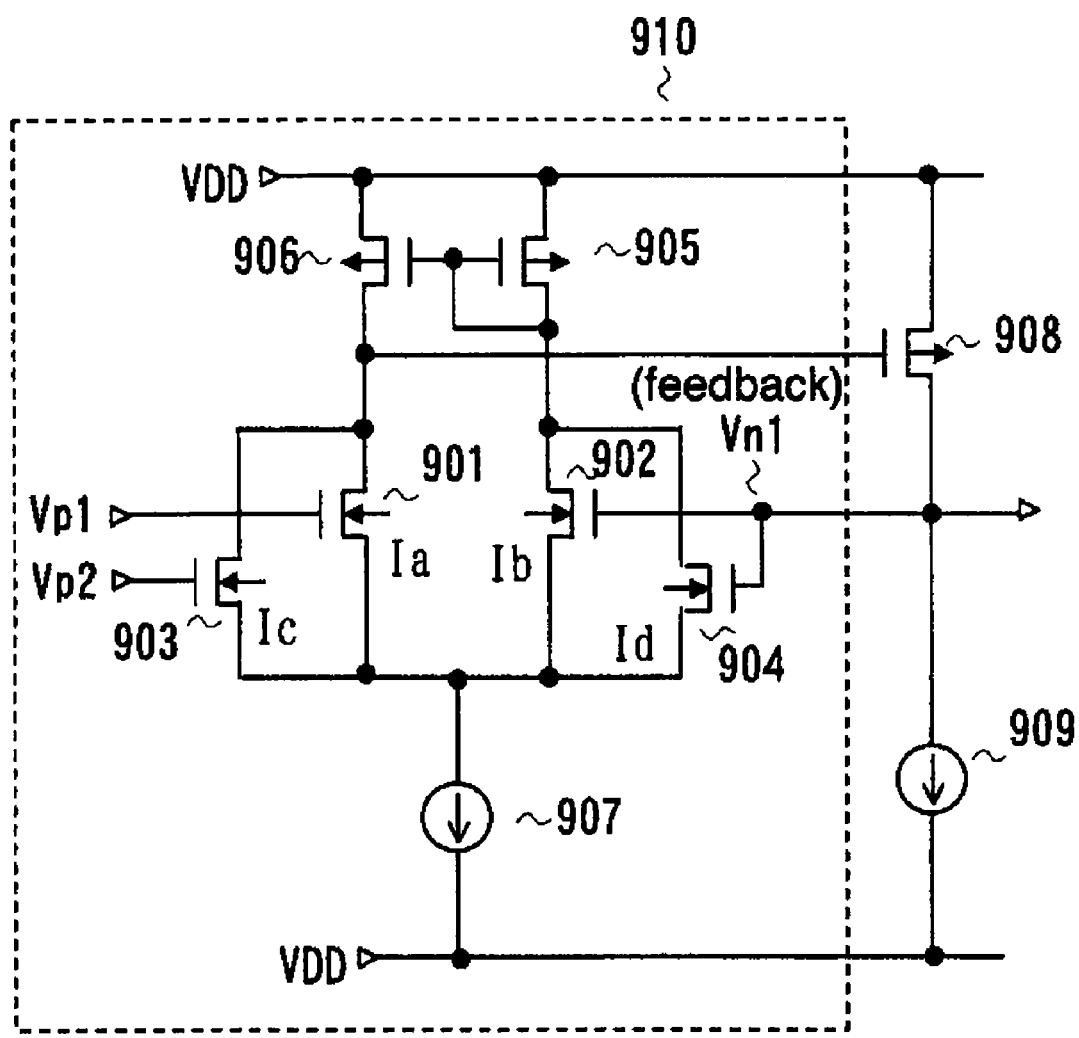
FIG. 29 shows a configuration of a data differential amplifier, stated in the Publication 1, as presumed by the present inventors.
Figure 30:
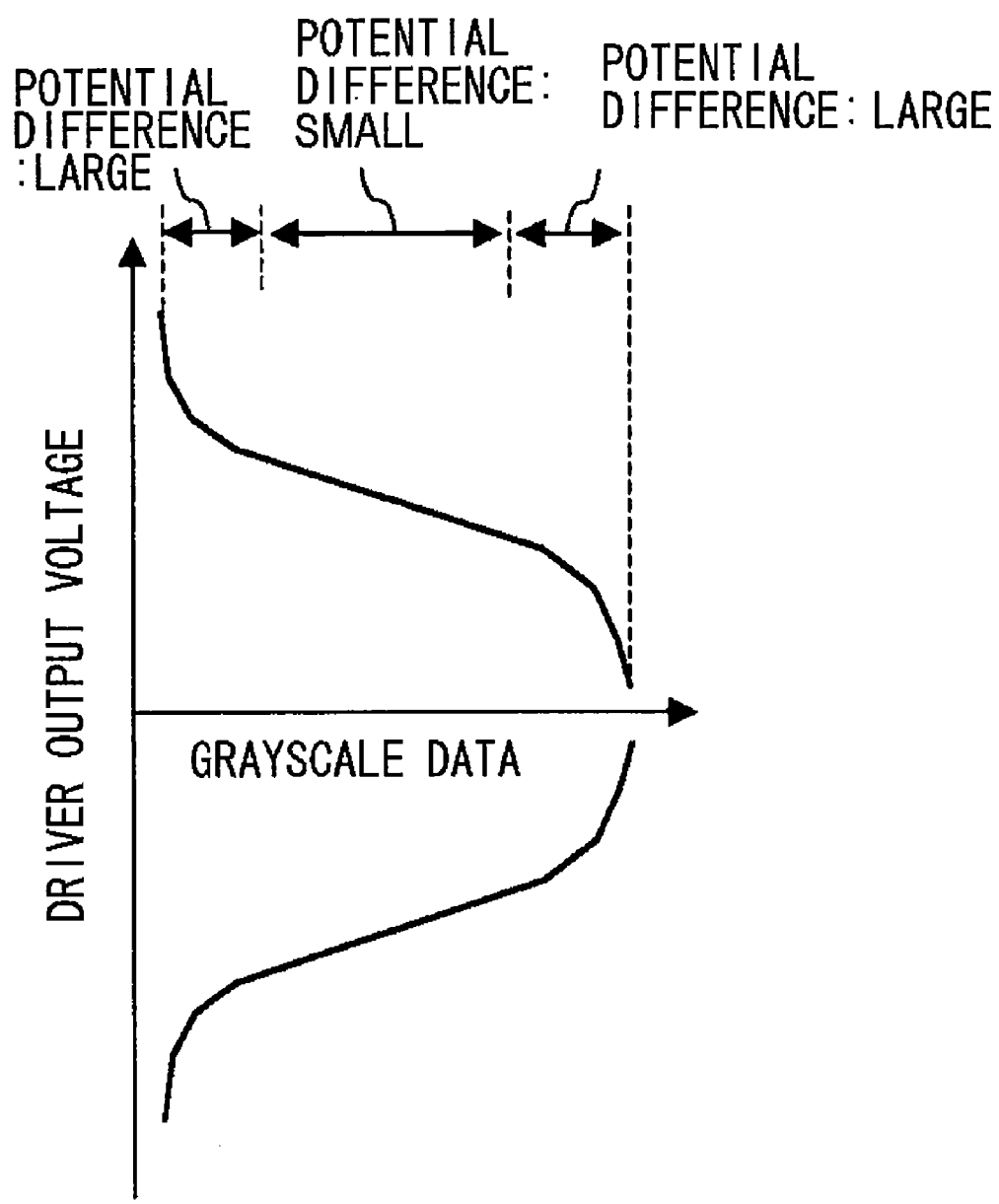
FIG. 30 shows output voltage characteristics of a data driver.
Figure 31:
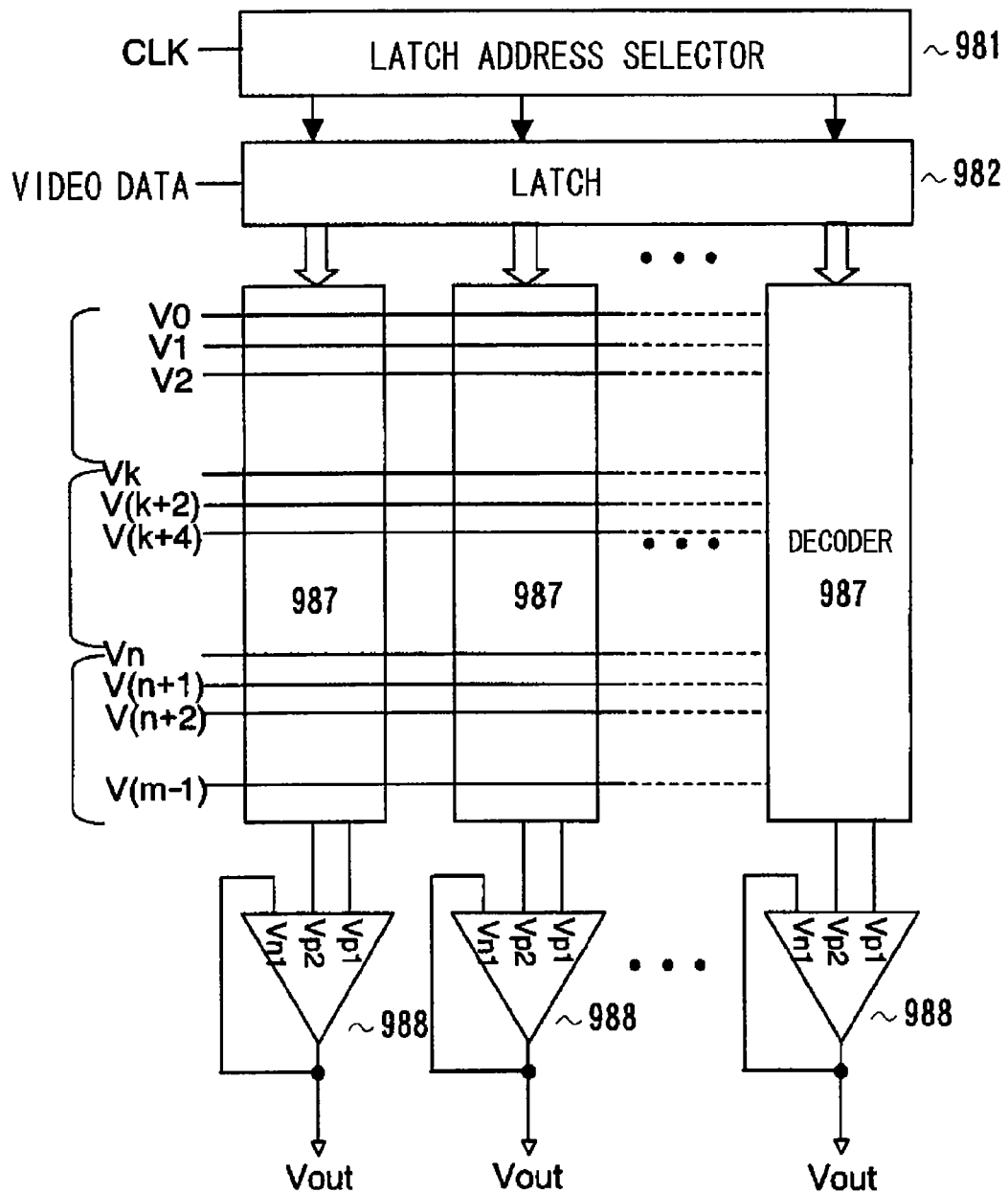
FIG. 31 shows another configuration of a data driver stated in the Patent Document1.
Figure 32:
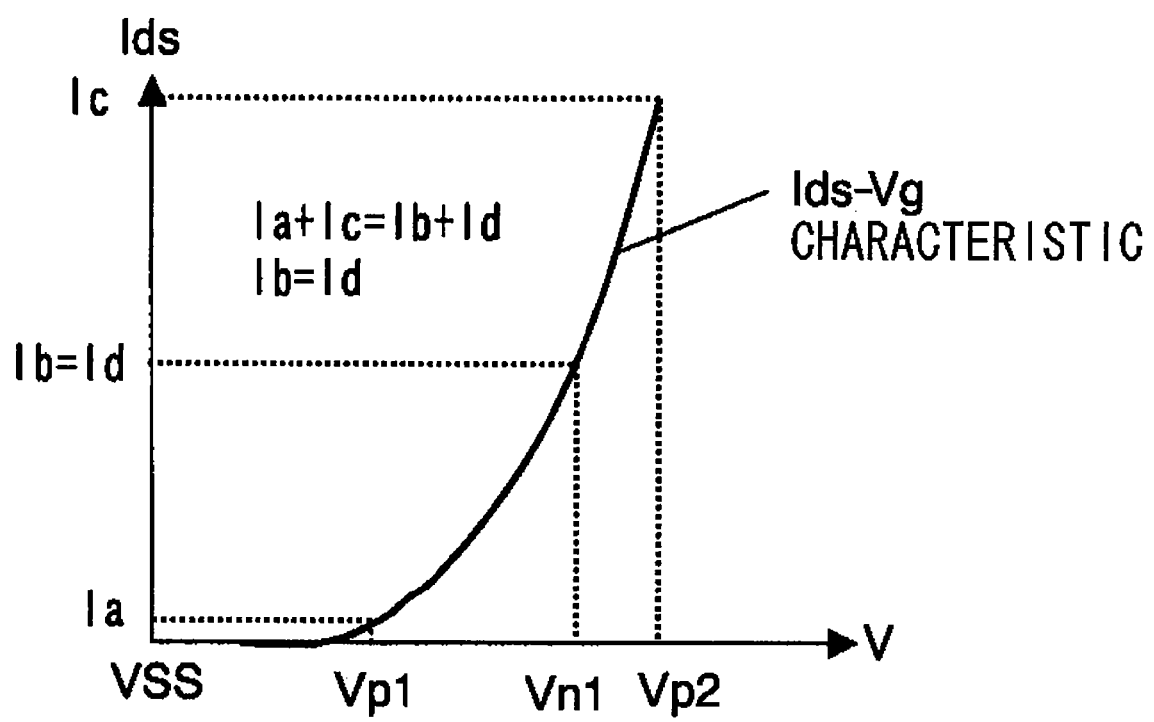
FIG. 32 illustrates the operating principle of the data differential amplifier of FIG. 29.
Figure 33:
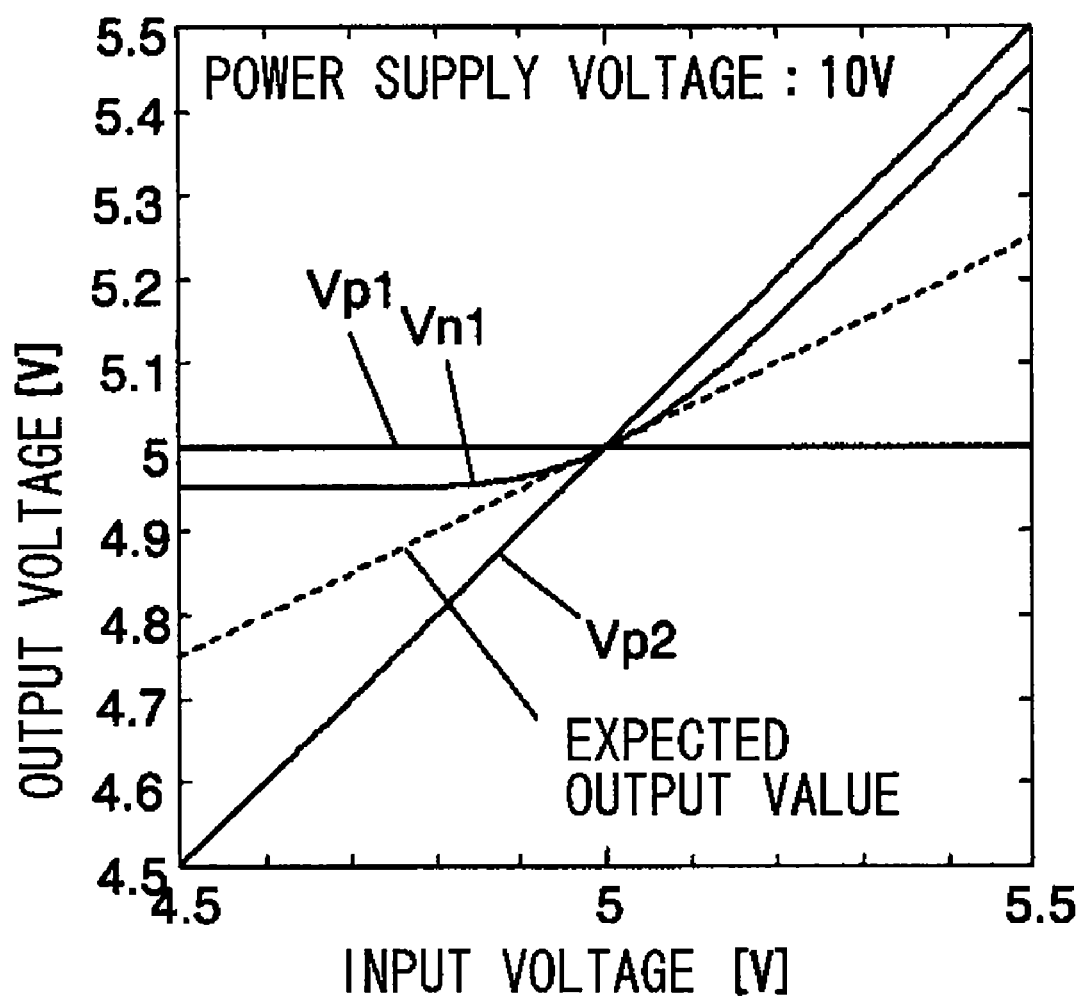
FIG. 33 shows input/output characteristics (DC characteristics) of a differential amplifier of FIG. 29.

FIG. 25 shows a configuration in which the present invention is applied to a data driver shown in FIG. 28 or 31. Referring to FIG. 25, the decoder 12 and the amplifier 13 are configured in accordance with the above-described embodiment. With the data driver of FIG. 28 or FIG. 31, the number of the grayscale voltage lines common to plural decoders 987 may be halved from the number of the entire DAC or the half-tone portion.

On the other hand, in the configuration shown in FIG. 25, the number of the grayscale voltage lines may further be decreased appreciably relative to the entire DAC or the halftone portion. Moreover, the space saving effect is high because the number of transistors making up the decoder 12 may be smaller than in case of the decoder 987 of FIG. 28 or FIG. 31. The grayscale voltage generating circuit 14 generates reference voltages of the above-described embodiments and hence the number of voltages generated may be decreased appreciably.

Figure 37:
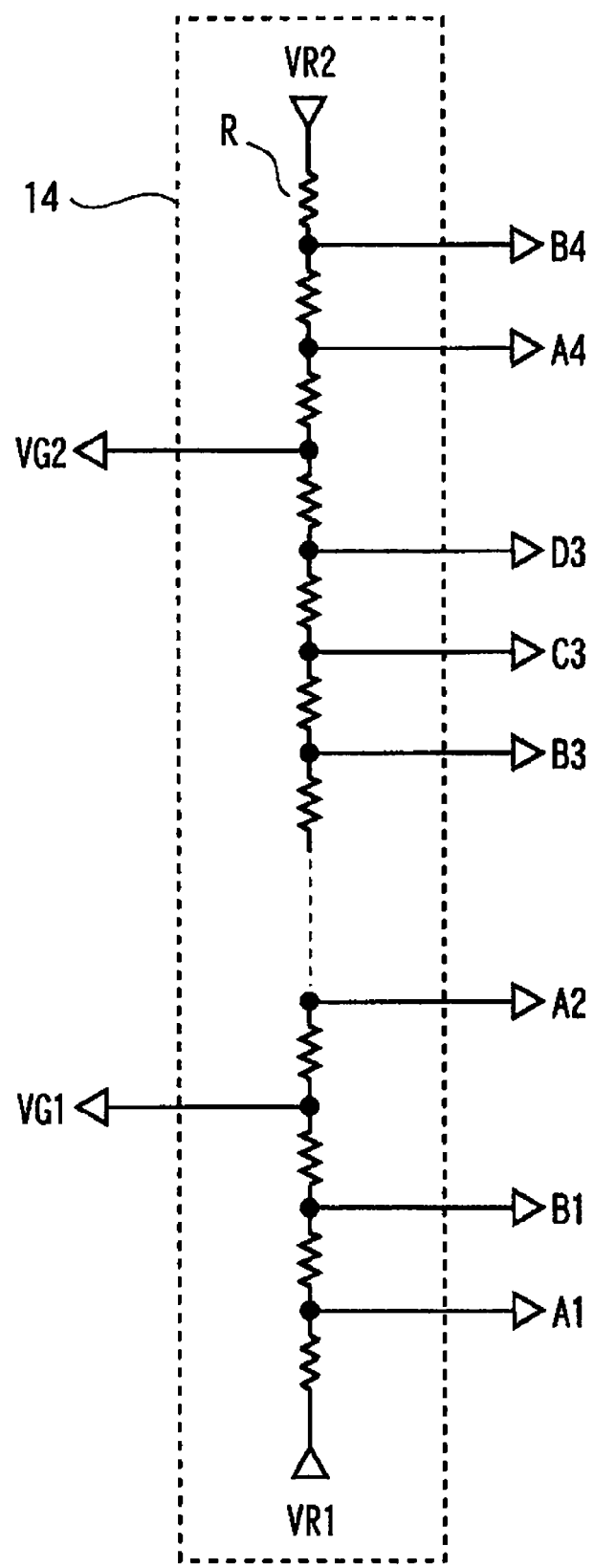
FIG. 37 shows an exemplary configuration of a grayscale voltage generating circuit used in the present embodiment.

FIG. 37 shows a typical configuration of the grayscale voltage generating circuit (14 of FIG. 25). This grayscale voltage generating circuit may conveniently be used as a circuit supplying plural reference voltages (A1, B1 to A4, B4) to the DAC. The relationship of the input/output correspondence and the output waveform of the DAC are shown in FIGS. 22 and 24.

Referring to FIG. 37, the grayscale voltage generating circuit includes a resistor string, made up by plural resistors R, connected in series across the power supplies (standard voltages) VR1, VR2, and input voltages (A1, B1 to A4, B4) are taken out from connection taps across the resistors to the decoder 12 of FIG. 1 or 25. In the example shown in FIG. 37, there are provided two external terminals for adjusting the voltage difference across the output grayscale voltages as set for each of the first section, second-third sections and the fourth section of FIG. 22. The voltages VG1 and VG2, distinct from the above-mentioned plural reference voltages, are supplied from outside to the respective external terminals.

Figure 38:
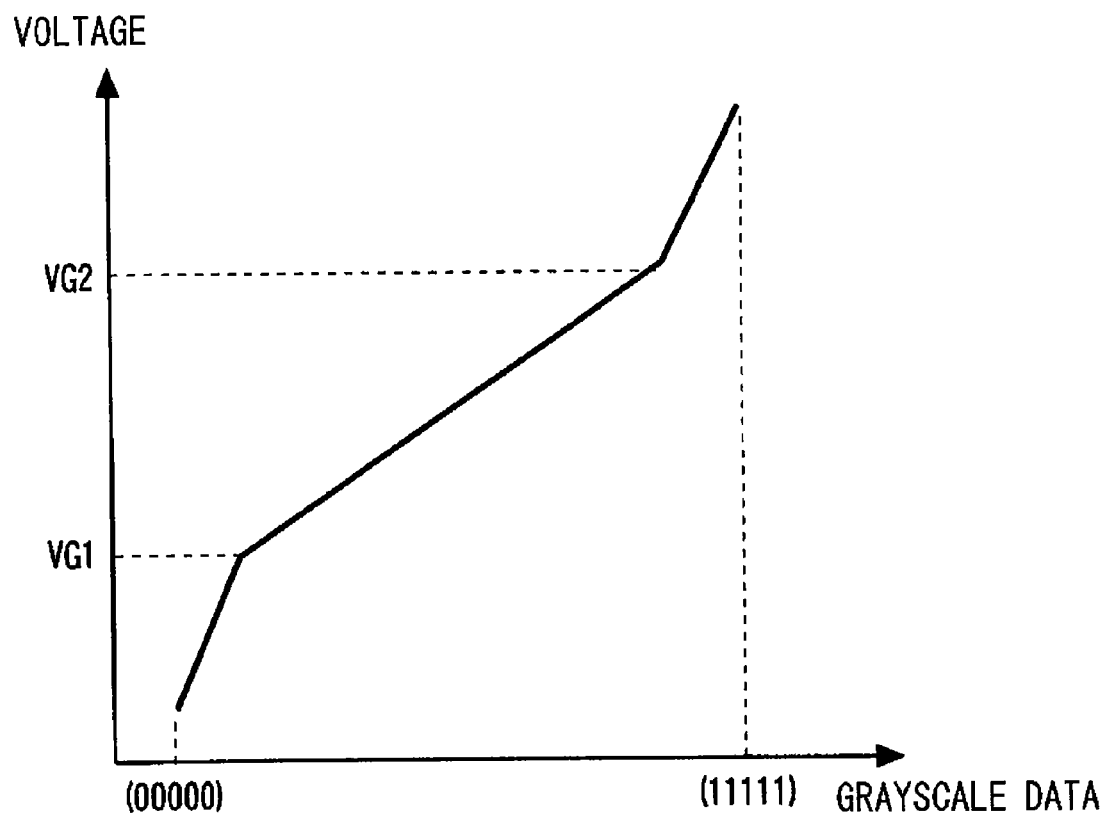
FIG. 38 shows the relationship between grayscale data and the grayscale voltage from the amplifier.

FIG. 38 depicts a graph corresponding to FIG. 24 showing the relationship between the grayscale data (abscissa) and the output grayscale voltage (ordinate). In FIG. 38, the potential difference between the neighboring grayscale levels is changed at two points (boundary between the first and second sections and that between the third and fourth sections). That is, the input/output characteristics (viz. the output voltage against the input from "00000" to "11111") is not a straight line, but is bent at two points.

To the voltages at the bent points of FIG. 38 (the points of change of the voltage difference between neighboring grayscale levels) are set the voltages VG1 and VG2 (see FIG. 37) applied to the external terminal. By setting the voltages VG1 and VG2 in this manner, the relationship between the grayscale data (abscissa of FIG. 38) and the output grayscale voltage (ordinate of FIG. 38) may be adjusted, based on the adjustment of the voltage values of the voltages VG1 and VG2, in such a manner as to conform optimally to the gamma characteristics of the liquid crystal.

Meanwhile, the relationship between the grayscale data and the output grayscale voltage may be adjusted by supplying part of the input voltages to the decoder 12 of FIG. 25 (A1, B1 to A4, B4) from an external terminal, without employing the voltages VG1 and VG2 of the bent parts of the input/output characteristics. In this case, it is in general difficult to adjust the relationship such as to provide for coincidence of the transition points of the voltage differences between the neighboring grayscale levels. The reason is that, the output grayscale voltage is changed appreciably, depending on the ratio of extrapolation, responsive to the slightest changes in the input voltage at the external terminal and hence it is difficult to carry out an appropriate adjustment and it becomes necessary to adjust other plural input voltages at the respective external terminals simultaneously.

With the configuration, shown in FIG. 37, the change points of the voltage difference between the neighboring grayscale levels are the voltages VG1 and Vg2, supplied from the external terminal, and the input grayscale voltage is determined by the resistance ratio of the resistor string, responsive to the voltages VG1 and VG2, so that the output grayscale voltage is not offset at the change point of the voltage difference between the neighboring grayscale levels. The result is that the precision in the gamma correction is maintained to assure facilitated adjustment.

Figure 39:
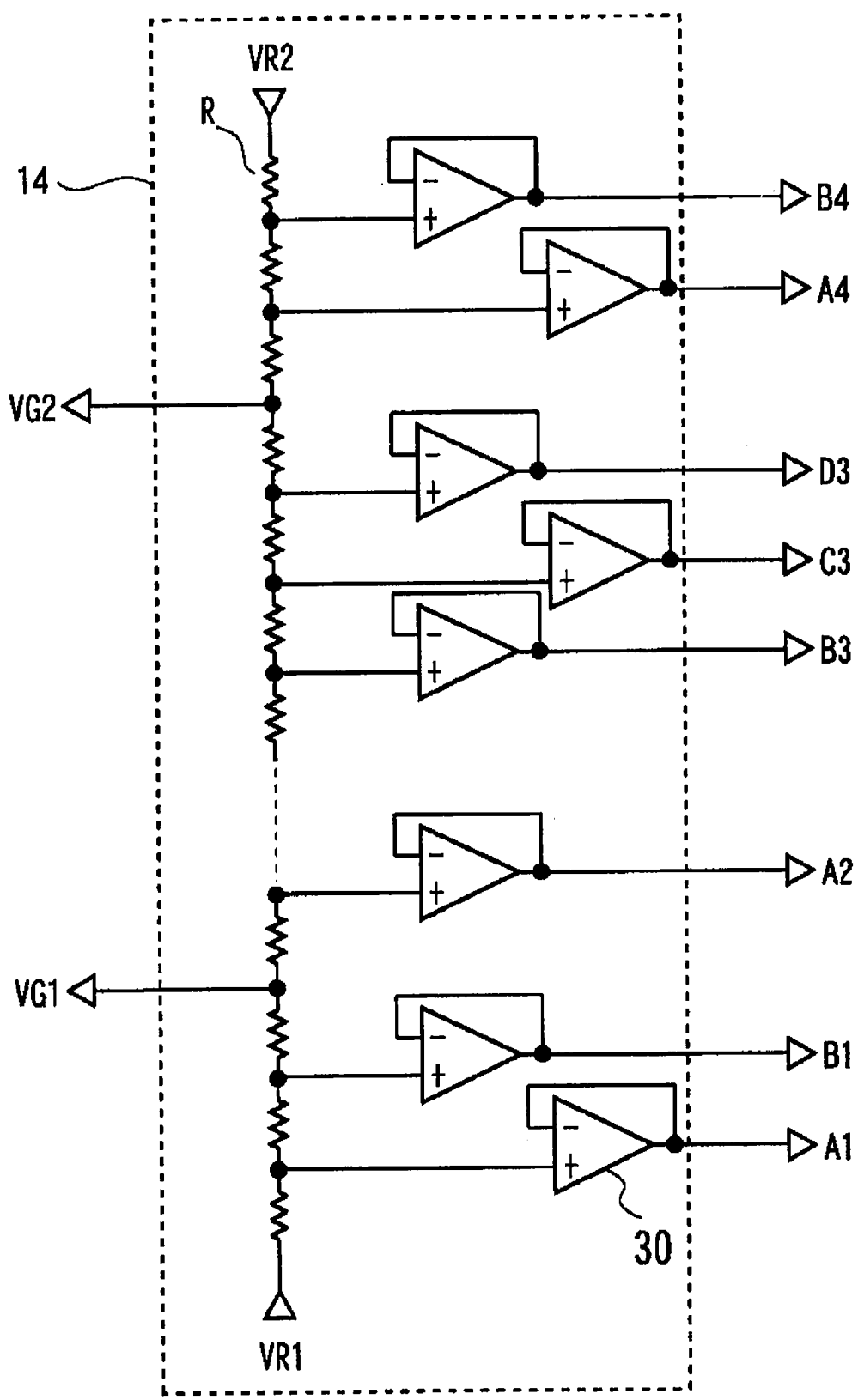
FIG. 39 shows an exemplary configuration of a grayscale voltage generating circuit used in the present embodiment.

FIG. 39 shows a modification of the grayscale voltage generating circuit 14, shown in FIG. 37, in which the voltage taken out from a tap of the resistor string is amplified by an operational amplifier 30 of the voltage follower configuration and output as an input grayscale voltage to the decoder 12. This grayscale voltage generating circuit is efficacious when applied to an amplifier of the large input capacitance, as shown for example in FIGS. 5 and 6.

Meanwhile, part or all of the grayscale voltage generating circuit 14 may be provided externally of the data driver. In case there are plural change points of the potential difference between the grayscale voltages (bent parts of FIG. 38), it is possible to supply the external voltage from the external terminals to a fraction of the change points, instead of supplying the external voltages to the totality of the external terminals.

The DAC may be formed by having the circuit of FIG. 37 enclosed, taking out m voltages from m taps, supplying the so taken out voltages to the selection circuit 12 of FIG. 1 as m reference voltages, and by forming the amplifier 13 by a circuit shown in FIG. 3.

In the foregoing, the differential amplifier of the present invention and the DAC employing it has been explained. The differential amplifier and the DAC, according to the present invention, is not limited to the LSI circuit formed on the silicon substrate, but may be applied to a TFT, devoid of a back gate, formed on an insulating substrate of, for example, glass or plastics.

Figure 26:
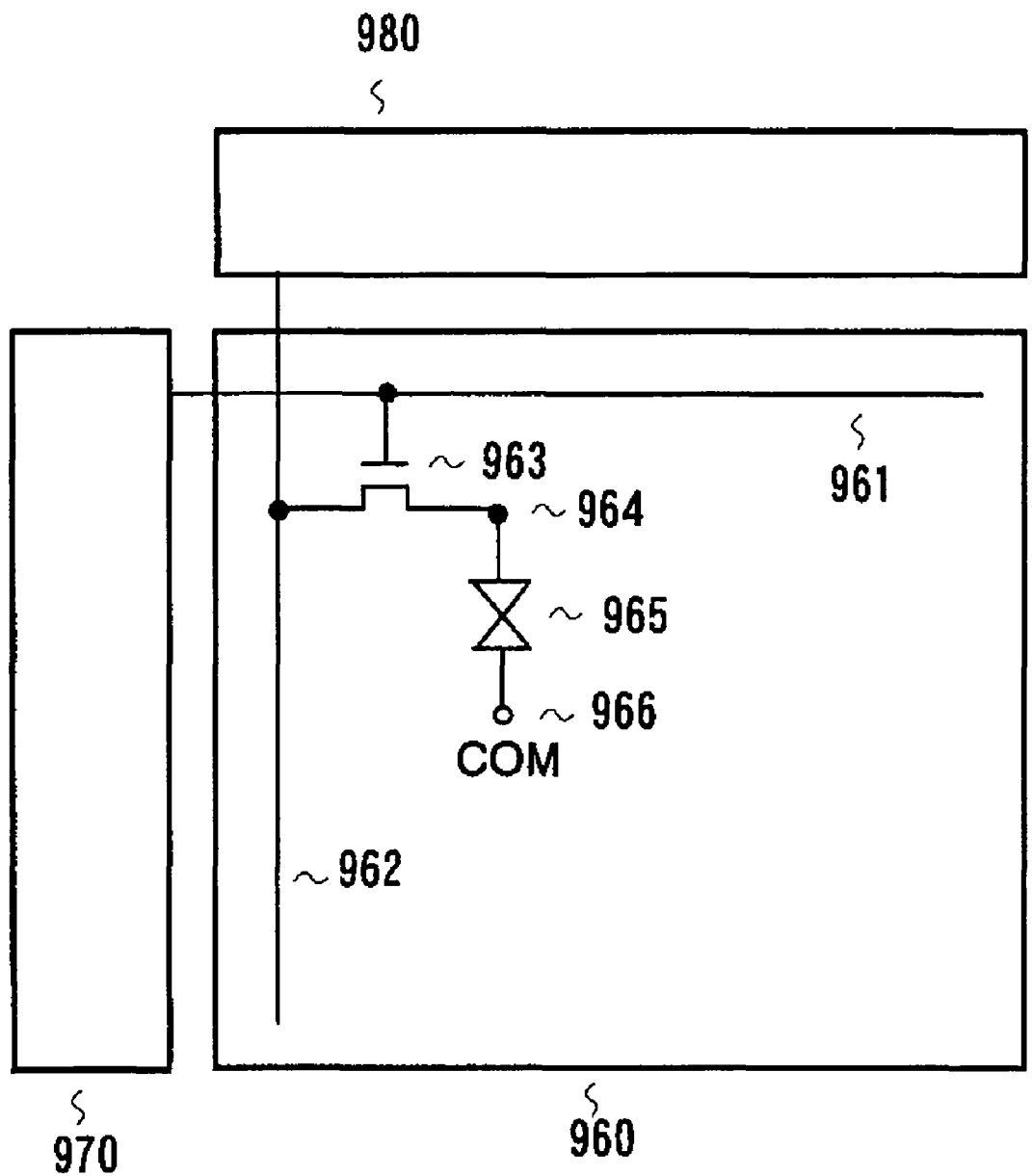
FIG. 26 shows a configuration of an active matrix liquid crystal display device.
Figure 27:
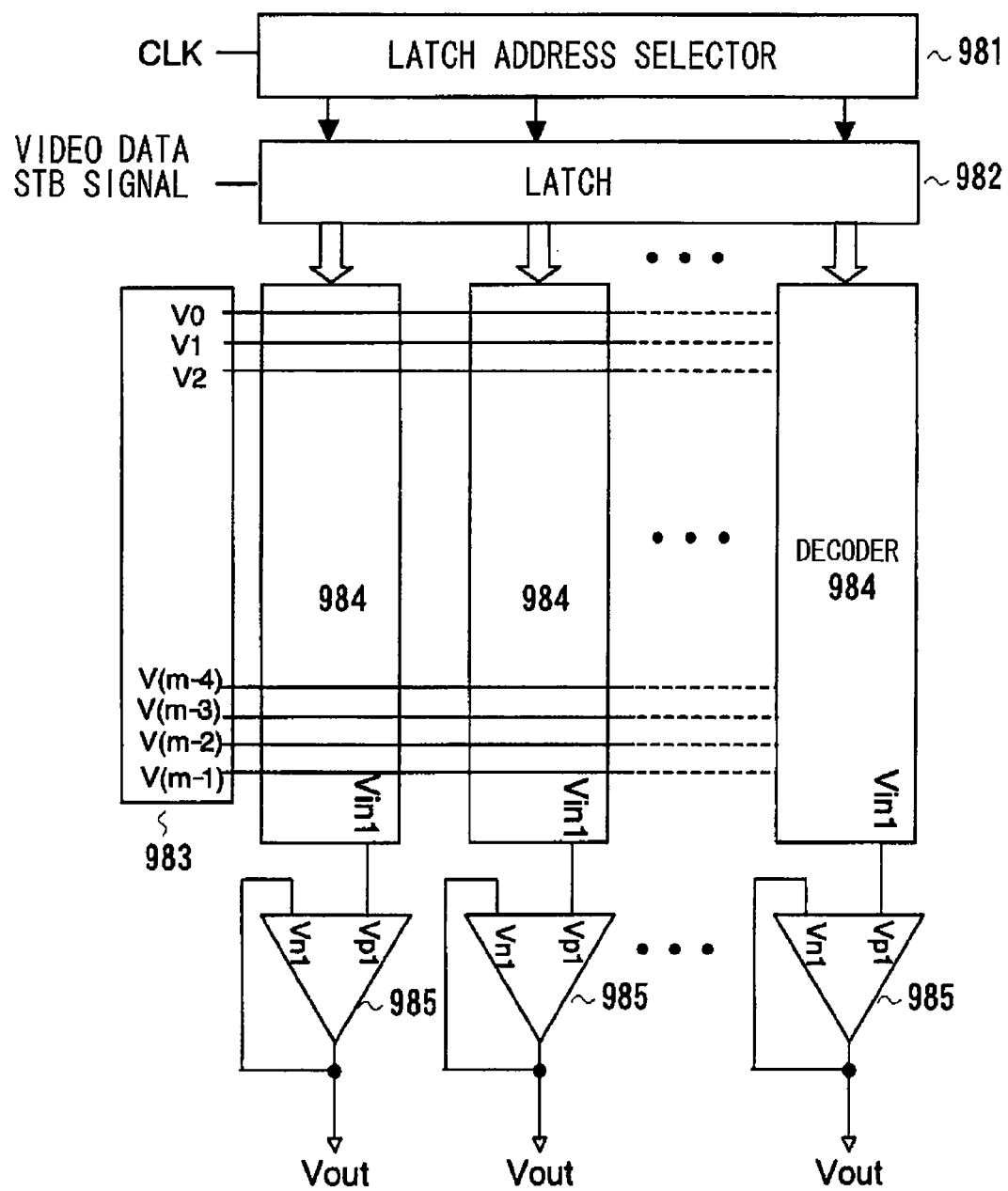
FIG. 27 shows a configuration of a conventional data driver.

Moreover, the data driver, employing the differential amplifier and the DAC, according to the present invention, may be used as the data driver 980 of the liquid crystal display device shown in FIG. 26. The data driver 980, having the differential amplifier and the DAC, according to the present invention, may be reduced in cost, by reducing the decoder area, thereby lowering the cost of the liquid crystal display device employing the data driver. In the liquid crystal device, shown in FIG. 26, the data driver 980 may separately be formed as a silicon LSI and connected as such to the display unit 960.

Alternatively, the circuit of the data driver and the display unit 960 may be formed as one on the insulating substrate, such as glass substrate, using a poly-silicon TFT (thin-film transistor). In the latter case, in which the data driver and the display unit are formed as one, the data driver area may be reduced in accordance with the present invention to narrow the frame size, that is, to reduce the width-wise size gap between the outer rim of the display unit 960 and the outer rim of the substrate.

The application of the differential amplifier or DAC according to the present invention to data drivers in display devices inclusive of display devices other than those shown in FIG. 26, may well promote the reduction of cost of the display device and the narrowing of the frame size. The differential amplifier according to the present invention may also be applied to such a device as an EL (Electro-Luminescence) display device with an active matrix driving system in which a data driver outputs a multi-level voltage signal on a data line.

The differential amplifier, explained in the above embodiments, is formed by MOS transistors. In e.g. a driver circuit of the liquid crystal device, the differential amplifier may also be formed by a MOS transistor (TFT) formed e.g. of poly-crystalline silicon. Although the differential amplifier in the above-described embodiments is applied to an integrated circuit, it may, of course, be applied to a discrete device configuration.

Figure 45:
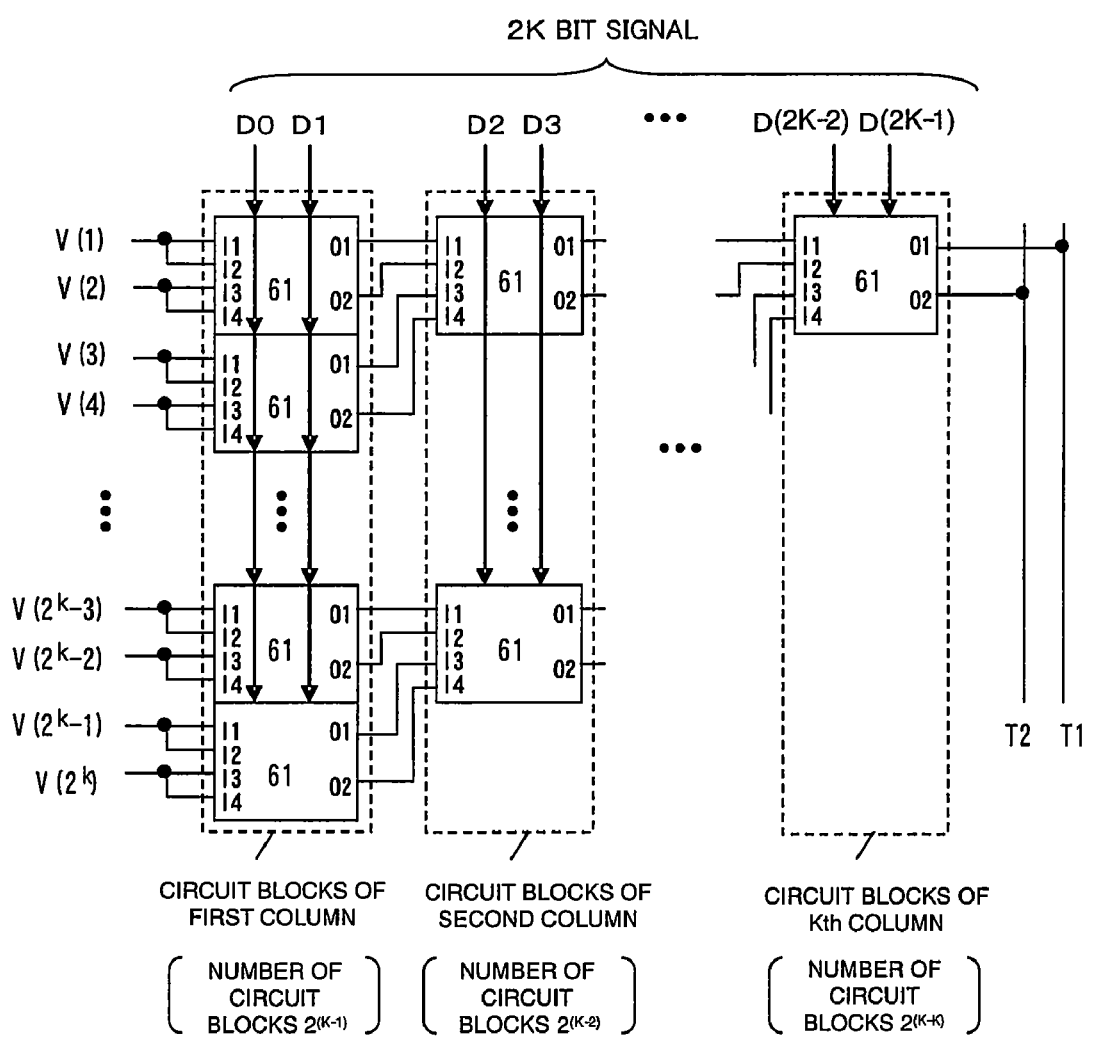
FIG. 45 shows an exemplary configuration of a selection circuit according to another embodiment of the present invention.

The explanation of the paragraphs [0068] and [0069] and [0160] to [0166] in the present specification is now to be supplemented. In the digital analog converter according to the present invention, in case the number m of the input voltages is a power of 2 ($m=2^K$, K being a positive number), and the number of output voltages is $4^K$, the digital data signal for selecting the output voltage, is 2K bits at the minimum. This is because the number that may be selected by digital data as binary numbers is prescribed by a bit number power of 2. That is, the 2K'th power of 2 is $4^K$ (K'th power of 4) and corresponds to the above-mentioned number of output voltages. In the above described embodiments, the circuit configurations of the decoders receiving the digital data signal having respective bit widths of 2, 4 and 6 are described with reference to e.g. FIG. 8, FIGS. 12 to 14, and FIG. 17. A further example of the decode (selection circuit) according to the present invention, in which the digital data signal has a bit width of 2K where K is a preset integer will be described in the below. FIG. 45 shows a configuration of a further example of the decoder according to the present invention, in which the digital data signal has a bit width of 2K.

Referring to FIG. 45, the decoder selects two voltages out of K'th power ($2^K$) input voltages (reference voltages): $V(1)$, $V(2), V(3), \ldots V(2^K)$ based on the 2K bit digital data signal to output the selected voltages to terminals T1 and T2. As shown in FIG. 45, the decoder has first to K'th columns of circuit blocks, each column having one or plurality of circuit blocks 61. The circuit block 61 receive respective voltage signals at four input terminals I1 to I4 and selects two voltages based on two bit signals to output the selected voltages to two output terminals O1 and O2.

The first column circuit blocks includes (K−1)'th power of 2 ($2^{K-1}$) circuit blocks 61, each of which has two input terminals I1 and I2 connected in common and two input terminals I3 and I4 connected in common and receives two reference voltages out of first to $2^K$'th references voltages ($V(1)$ to $V(2^K)$). Each circuit block 61 constituting the first column selects the two reference voltages based on first and second bit signals of the digital data signal (D0,D1) and outputs the so selected two voltages as two output voltage signals to the terminal O1 and O2.

The second column circuit blocks includes (K−2)'th power of 2 ($2^{K-2}$) circuit blocks 61, each of which has input terminals I1 to I4 supplied with respective output voltages signals of each two circuit blocks 61 of the first column circuit blocks (total four voltages). Each circuit block 61 constituting the second column selects the two voltages based on third and fourth bit signals (D2 and D3) and supplies the so selected two voltages as two output voltage signals to the terminal O1 and O2.

The third to K'th columns of circuit blocks are constructed in the same way. More specifically, by using a variable F (where F is a positive integer more than 2 and less than K), the F'th column circuit blocks includes (K−F)'th power of 2 circuit blocks 61, each of which has input terminals I1 to I4 supplied with respective output voltages signals of each two circuit blocks 61 of the (F−1)'th column circuit blocks (total four voltages). Each circuit block 61 constituting the F'th column selects the two voltages based on (2F−1)'th and 2F'th bit signals of the digital data signal (D(2F−2) and D(2F−1)) and supplies the so selected two voltages as two output voltage signals to the terminal O1 and O2.

K'th column circuit blocks includes one circuit block 61, which has input terminals I1 to I4 supplied with respective output voltages signals of two circuit blocks 61 of the (K−1)'th column circuit blocks (total four voltages). This circuit block 61 constituting the K'th column selects the two voltages based on (2K−1)'th and 2K'th bit signals (D(2K−2),D(2K−1)) and supplies the so selected two voltages as two output voltage signals to the terminal T1 and T2.

In case of K=1, the decoder includes only first column circuit blocks and is constituted by one circuit block 61 which receives first and second reference voltages ($V(1)$ and $V(2)$) and selects the two reference voltages based on first and second bit signals of the digital data signal (D0 and D1) to output the so selected two voltages as two output voltage signals to the terminal T1 and T2.

Figure 46:
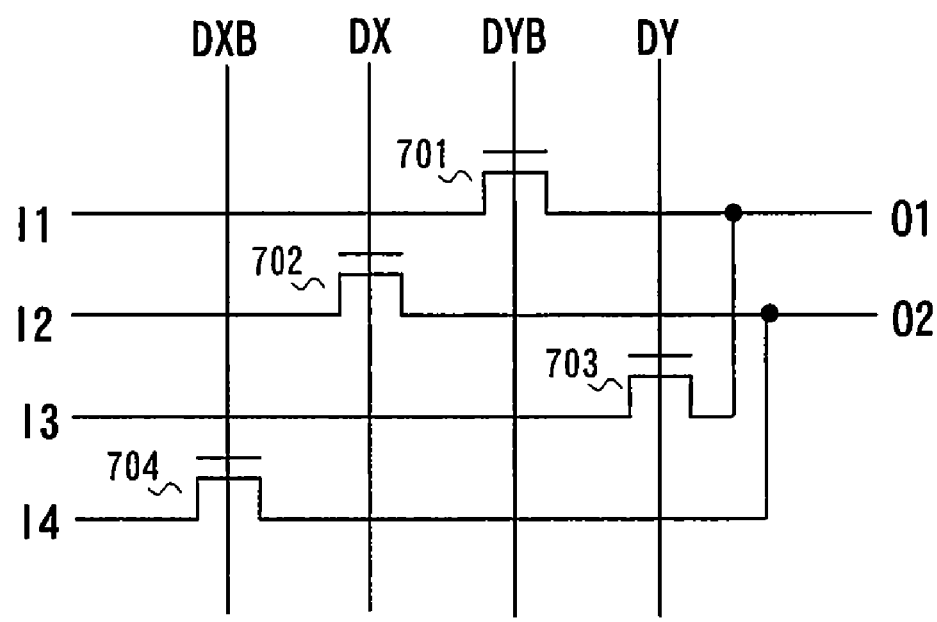
FIG. 46 shows an exemplary configuration of the circuit block of FIG. 45.

FIG. 46 shows an exemplary configuration of the 2-bit decoder constituted by n-channel transistors, which composes the circuit block 61. Referring to FIG. 46, this decoder includes a transistor switch 701 connected between the terminal O1 and the terminal O1 and supplied with a data bit signal DYB (complementary signal of data bit signal DY), a transistor switch 703 connected between the terminal I3 and the terminal O1 and supplied with a data bit signal DY, a transistor switch 702 connected between the terminal I2 and the terminal O2 and supplied with a data signal DX and a transistor switch 704 connected between the terminal I4 and the terminal O2 supplied with a data bit signal DXB (complementary signal of data bit signal DX).

With the configuration shown in FIG. 46 being adopted as each of circuit blocks 61 of FIG. 45, the decoder of FIG. 45 becomes the same configuration as that of FIG. 8 in case of K=1 and becomes the same configuration almost as that of FIG. 14 in case of K=2. Accordingly, the configuration shown in FIG. 45 is one of decoder configuration realizing the decoder according to the present invention with reduced number of elements.

In the above embodiment, FIGS. 8, 12, 13, 14, 17 and 23 are shown as illustrative configurations of the decoder, and it has been explained that the number of the transistors may differ even with the decoder of the same function, depending on the circuit configuration of the decoder. It has also been explained that a plural number of decoders with the same number of m and a plural number of decoders with a different number of m, where m, the number of the input voltages, described above, is a second power of 2, for example, 2, 4 or 8, may be used in combination.

In particular, if the number of output voltages becomes excessively large, the number of transistors is varied appreciably, depending on the decoder configuration, thus significantly affecting the decoder area. Hence, the relationship between the decoder configuration and the number of the transistors, in case the number of output voltages is extremely large, is now explained.

Figure 40:
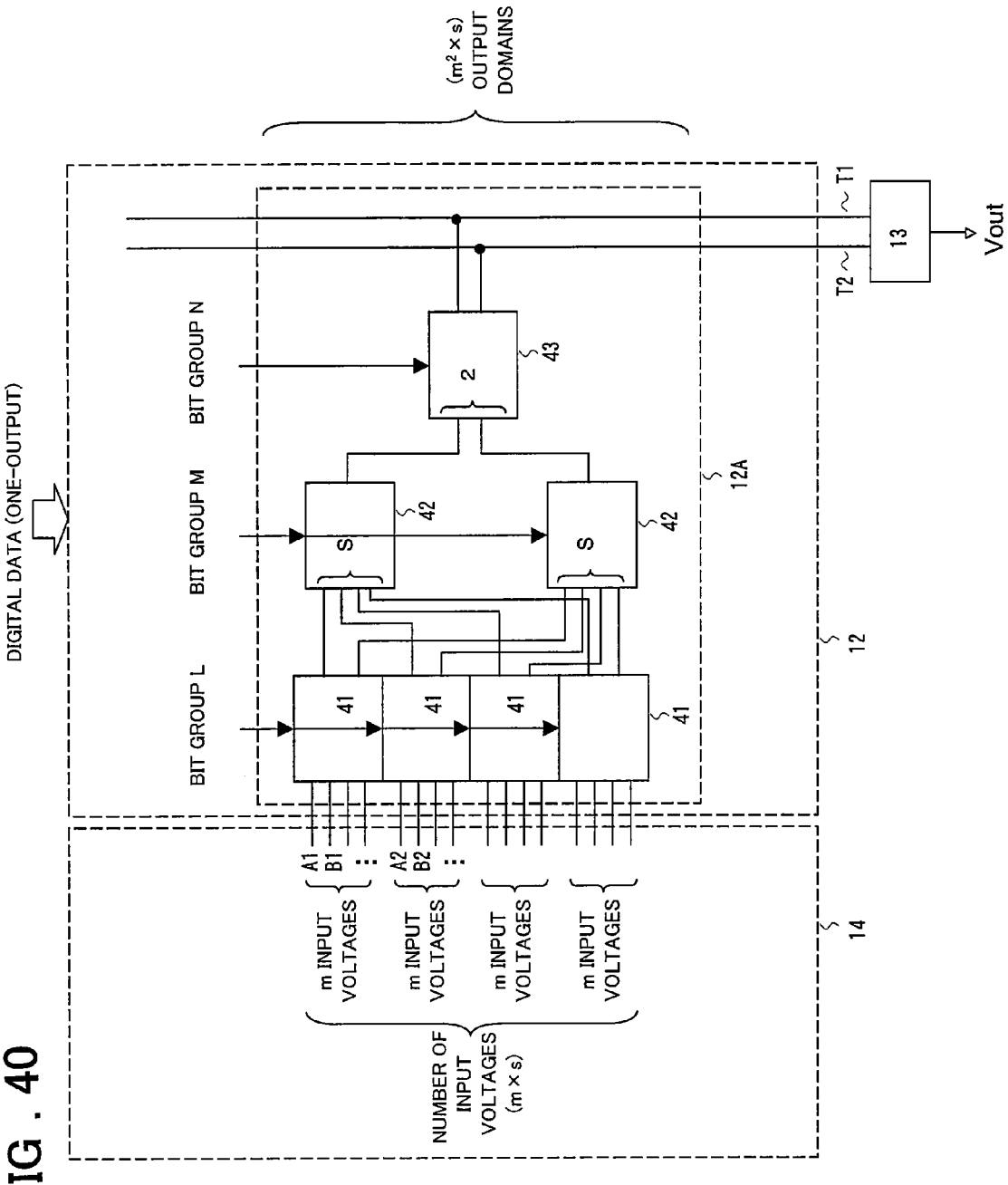
FIG. 40 shows an exemplary configuration of a DAC according to another embodiment of the present invention.
Figure 41:
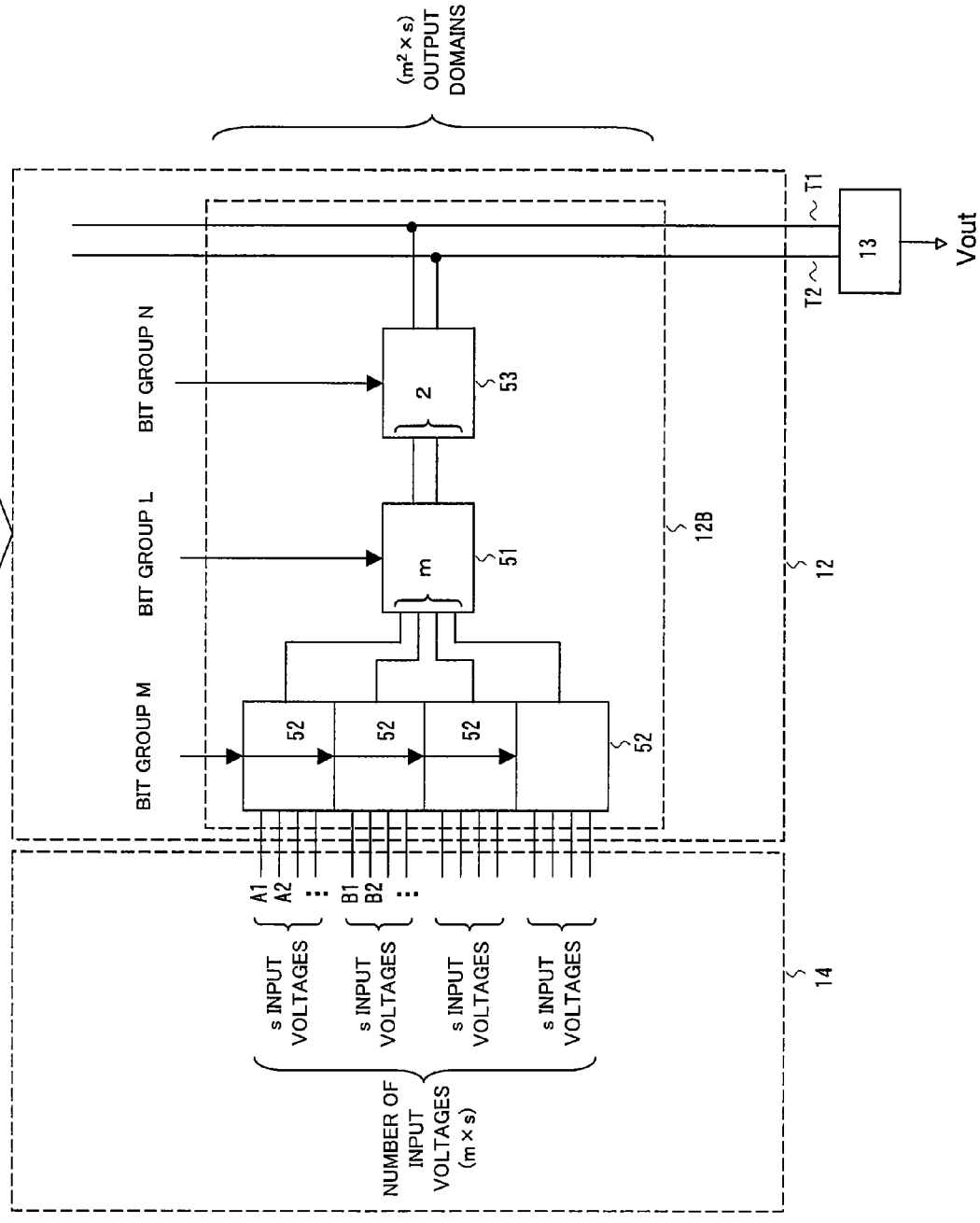
FIG. 41 shows an exemplary configuration of a DAC according to another embodiment of the present invention.

FIGS. 40 and 41 illustrate the configuration of two different decoders convenient for the present invention, and each specifically show the configuration of a grayscale voltage generating circuit 14, a decoder 12 and an amplifier 13 for one-output terminal, in a data driver shown in FIG. 25.

The decoder 12 includes S sections each having m input voltages and a corresponding number $m^2$ of output voltage levels ($m^2$ output domains), as part or all of the one-output decoder. These S sections are a decoder block 12A (FIG. 40) and a decoder block 12B (FIG. 41). For ease of explanation, there is no overlap of output voltage levels, among these S sections, such as is shown in FIG. 22. That is, the number of input voltages of the decoder blocks 12A of FIG. 40 is (m×S) and the number of the output voltage levels corresponding thereto is ($m^2$×S). The number of input voltages of the decoder blocks 12B of FIG. 41 is (m×S) and the number of the output voltage levels corresponding thereto is (m²×S).

The decoder blocks 12A are supplied with bit groups L, M and N. The decoder blocks 12B are supplied with bit groups L, M and N.

Out of the digital data, input to the decoder 12, bits needed for selection, including the overlapping bits, are allocated to the bit groups L, M and N. Referring to FIG. 40, the (m×S) input voltages are generated in the grayscale voltage generating circuit 14 and supplied to the data blocks 12A. Referring to FIG. 41, the (m×S) input voltages are generated in the grayscale voltage generating circuit 14 and supplied to the data blocks 12B.

In FIGS. 40 and 41, the amplifier 13 performs amplification by externally dividing the voltages supplied to terminals T1 and T2 with an external division ratio of 1:2, and output the so amplified voltage. The amplifier 13 may be composed by any one of the configurations shown, for example such as in FIGS. 3, 5A, and 6A.

The configuration of the decoder block 12A, shown in FIG. 40, is described. The decoder block 12A comprises first to S'th circuit blocks 41 each receiving a bit group L, first and second circuit blocks 42 each receiving a bit group M, and a circuit block 43 receiving a bit group N. In the decoder block 12A, each of first to S'th circuit blocks 41 selects, two out of m input voltages inclusive of overlap based on the bit group L.

The decoder block 12A comprises a first circuit block 42 which receives one voltage of two voltages selected in each of the first to the S'th circuit blocks 41 (a sum total of S voltages) and a second circuit block 42, which receives the other voltage of two voltages selected in each of the first to the S'th circuit blocks 41 (a sum total of S voltages). The first and second circuit blocks 42 select the one voltage of a given section out of S input voltages based on the bit group M respectively. The bit group M serves as bits for selecting a given section out of S sections of the decoder block 12A.

The decoder block 12A comprises a circuit block 43 which receives two voltages, selected from each of the first and second blocks 42, sorts the S sections of the decoder block 12A from the remaining sections by the bit group N and which supplies the two input voltages to terminals T1 and T2 respectively when the bit group N selects the aforementioned S sections.

As the circuit block 41, such a construction shown in any one of FIGS. 8, 12 to 14, 17, and 45 may be used, depending on the number of input voltages m. As the circuit block 42, a tournament type decoder, shown in FIG. 36 may be used and may be optimized in dependence upon the number of input voltages.

The relationship between the configuration of the decoder 12 shown in FIG. 40 and the number of transistors is such that the number of transistors of the decoder is smaller in case the number m of input voltages for one section is larger and the number of sections S is smaller. The reason is that the larger the number m of input voltages to the circuit blocks 41 becomes, the higher the efficiency of transistor elements in the circuit blocks 41 (that is, the reduction ratio of the number of transistor elements as compared with that of the conventional equivalent circuit) becomes.

The configuration of the decoder block 12B of FIG. 41, as distinct from FIG. 40, is now described. The decoder block 12B comprises first to m'th circuit blocks 52 each receiving a bit group M, a circuit block 51 receiving a bit group L, and a circuit block 53 receiving a bit group N. In the decoder block 12B, each of first to m'th circuit blocks 52 receives S input voltages of the same rank in the S sections, from these S sections, and selects one voltage in a given section from the S input voltages, by using the bit group M as a selection signal. That is, the bit group M serves as bits for selecting the given section out of S sections of the decoder block 12B.

A circuit block 51 receives a number m of voltages selected in each of the first to the m'th circuit blocks 52 and select two voltages, including the overlap, from the m input voltages by using the bit group L as a selection signal.

A circuit block 53 receives two voltages selected by the circuit block 51, sorts the S sections of the data block 12B from other sections by the bit group N and outputs two input voltages to terminals T1 and T2 respectively when the bit group N selects the S sections.

As the circuit block 51, such a construction shown in FIGS. 8, 12 to 14, 17 and 45 of the present invention may be used, depending on the number of input voltages m. As the circuit block 52, may be used a tournament type decoder, shown in FIG. 36, which may be optimized in dependence upon the number of input voltages.

The relationship between the configuration of the decoder 12 shown in FIG. 41 and the number of transistors is such that the number of transistors of the decoder is smaller in case the number m of input voltages for one section is larger and the number of sections S is smaller. The reason is that the larger the number m of input voltages to the circuit blocks 51 becomes, the higher the efficiency of transistor elements in the circuit blocks 51 becomes.

The two illustrative configurations of the data blocks 12A and 12B have been explained above with reference to FIGS. 40 and 41. In each of these configurations, the (m²×S) output voltage levels in the decoder block are preferably of consecutive output voltage levels.

If the output voltage levels become non-contiguous in a section boundary, the decoder blocks may be formed by dividing into consecutive sections.

In the respective sections in the decoder block, the voltage difference between neighboring voltage levels may be individually set from section to section, with the voltage difference set to be equal within each section.

In the above examples, shown in FIGS. 40 and 41, explanation has been made of the configurations of the decoder blocks 12A and 12B for a given value of m. However, if the decoder 12 has sections with a different value of m, the decoder block may be formed for each value of m.

If, in the decoder block 12A shown in FIG. 40, the respective bits of the bit group N are contained in their entirety in the bit group L and in the bit group M, the circuit block 43 may be omitted, because the decoder block has already been sorted by the bit groups L and M.

If, in the decoder block 12B of FIG. 41, the decoder 12 in its entirety has plural decoder blocks having different values of m, and the respective bits of the bit group N in the decoder block with the maximum value of m are contained in their entirety in the bit groups L and M, the circuit block 53 may be omitted.

The circuit block 53 may not be omitted in the decoder block other than the decoder block where m becomes maximum is that, if the circuit block 53 has been omitted in the decoder block where m is small, it is highly likely that unintended shorting may be produced across terminals T1 and T2 in the circuit block 51 such that erroneous outputs may be produced.

A more specified example is now shown for the configuration of the decoder 12 of FIGS. 40 and 41.

Figure 42:
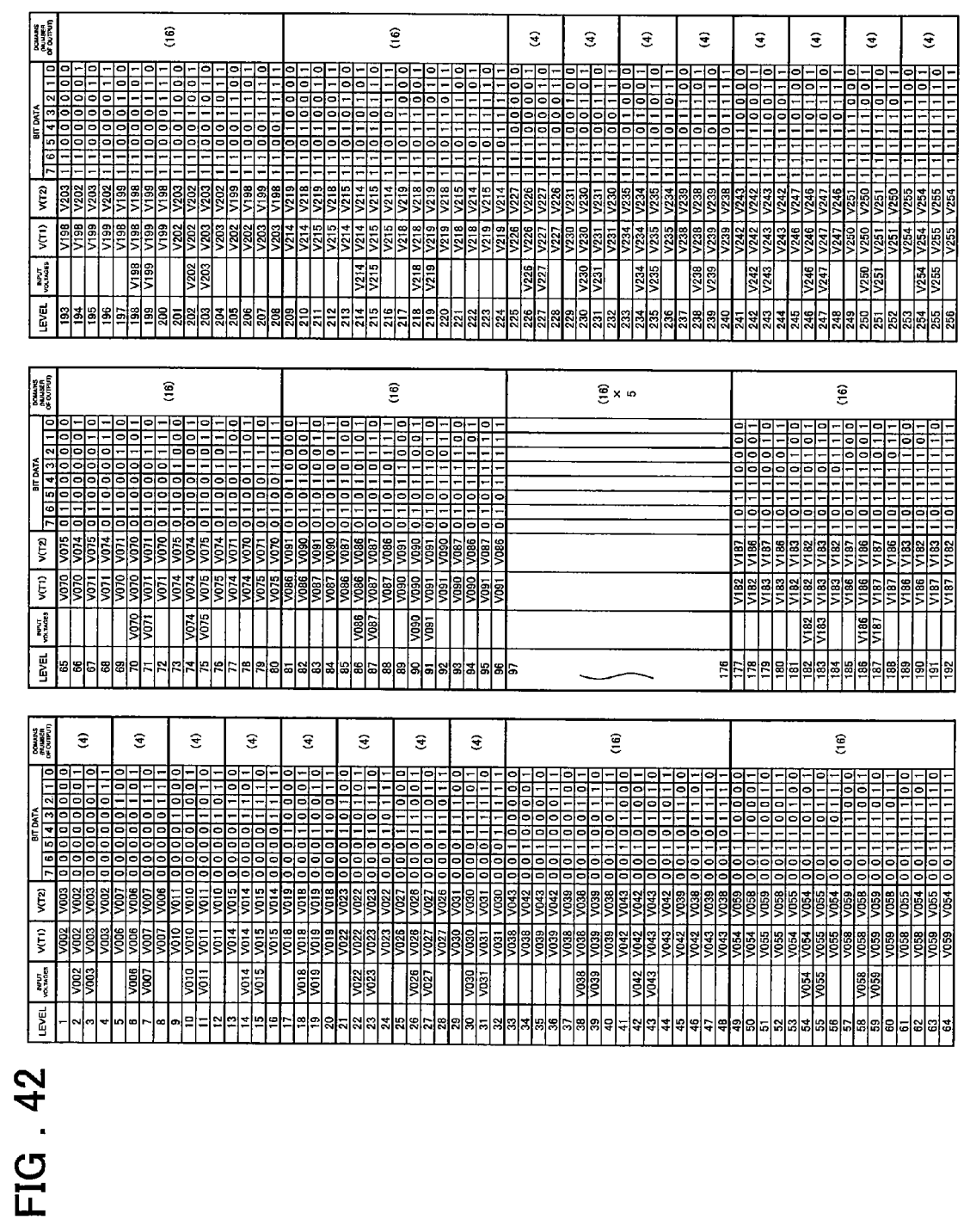

FIG. 42 shows the input/output correspondence in the DAC according to an embodiment of the present invention. More specifically, the example of FIG. 42 shows the input/output correspondence in an 8-bit DAC supplied with 8-bit data (D7 to D0) and outputting 256 voltage levels depending on the data, though the present invention is not limited to the 8-bit data. The levels 1 to 256 denote the output voltage level of the amplifier 13. The input voltage is the voltage generated in the grayscale voltage generating circuit 14 so as to be supplied to the decoder 12. The input voltage corresponds to the preset output voltage level and indicated by a symbol V entered ahead of the corresponding output voltage level. V(T1) and V(T2) denote the voltages selectively output by the decoder (selection circuit) according to the present embodiment to the terminals T1 and T2 responsive to the 8-bit data (D7 to D0). Each output voltage level denotes the voltage output by the amplifier 13 and which externally divides the voltages V(T1) and V(T2), supplied to the terminals T1 and T2, at an external division ratio of 1:2.

In the present embodiment, 256 output levels (grayscale levels) are formed by sections each having two input voltages 2 and four output voltage levels (four output sections; m=2) and sections each having four input voltages and 16 output voltage levels (16 output sections; m=4). [0234]

The first to 32nd voltage levels are formed by four output secions×8;

the 33rd to 224th voltage levels are formed by 16 output sections×12; and

225th to 256th voltage levels are formed by four output sections×8.

The input voltages entered to the decoder 12 are the second and third voltage levels of each section, for the four output sections, and sixth, seventh, tenth and eleventh voltage levels of each section, for the 16 output sections.

The total number of input voltages are 80 for 256 output levels.

Although the 97th to 176th output levels are omitted in FIG. 42, these will be comprehended readily.

Figure 43:
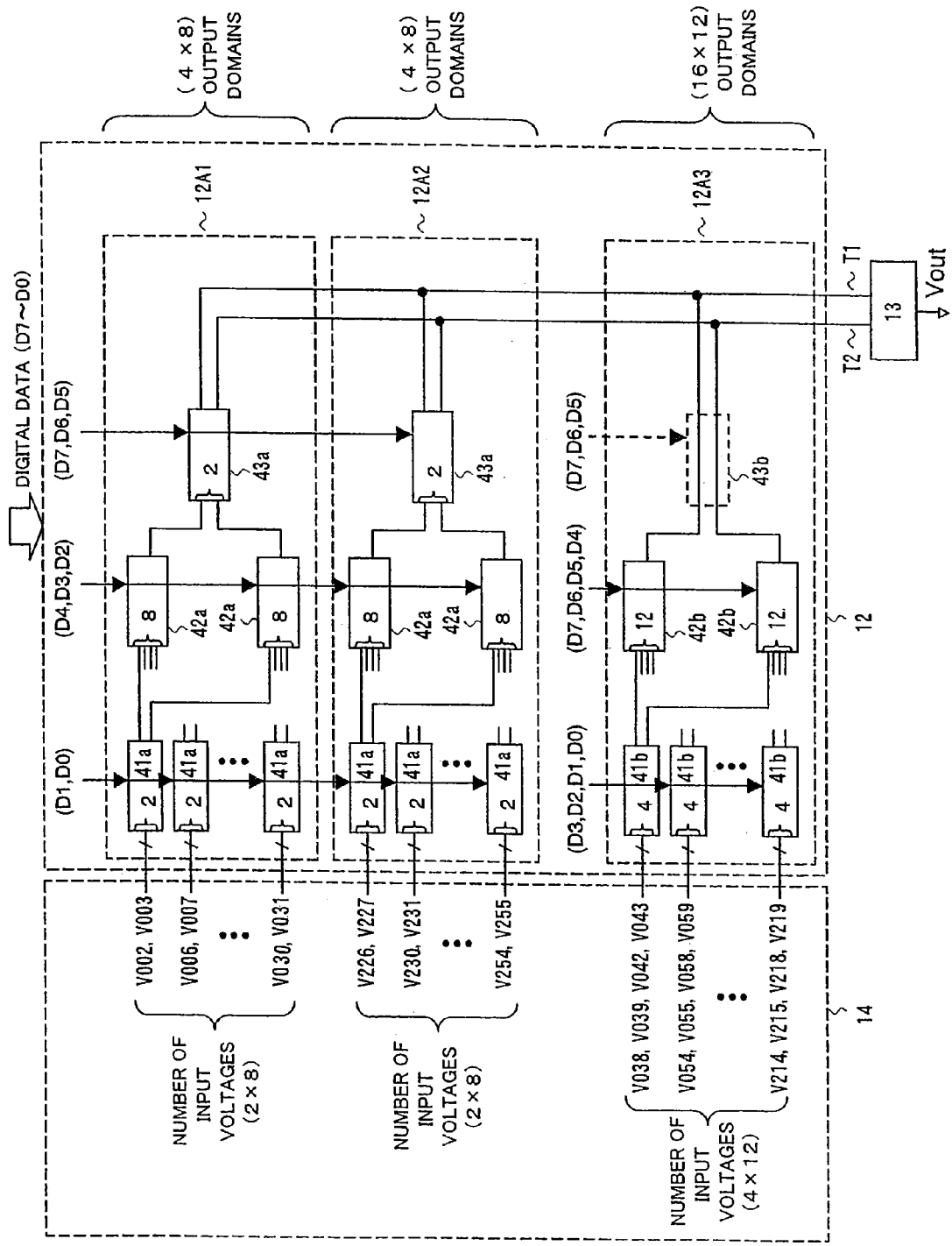
FIG. 43 shows an exemplary configuration of a decoder realizing the input/output correspondence shown in FIG. 42.

FIG. 43 shows an example in which a decoder 12 implementing the input/output correspondence relationship of FIG. 42 is constructed on the basis of FIG. 40. In FIG. 43, as in FIG. 40, the configuration of a grayscale voltage generating circuit 14, a decoder 12 and the amplifier 13 for one-output terminal in the data driver shown in FIG. 25, is shown.

Referring to FIG. 43, the decoder 12 is composed by three decoder blocks 12A1, 12A2 and 12A3.

The decoder block 12A1 is in charge of eight pieces of four-output sections corresponding to the first to 32nd voltage levels, the decoder block 12A2 is in charge of eight pieces of four-output sections corresponding to the 225th to 256th voltage levels, and the decoder block 12A3 is in charge of 12 pieces of 16-output sections corresponding to the 33rd to 224th voltage levels.

The four-output section is divided into two consecutive sections and hence the decoder block is formed by division into consecutive sections.

For the bit groups L, M and N, the bits needed for selection are allocated, inclusive of overlap, from among 8-bit data signals (D7 to D0), entered to the decoder 12. Although the bits of the 8-bit data signals (D7 to D0) are paired to the inverted versions (D7B to D0B), these inverted signals are omitted in FIG. 43.

Each of decoder blocks in FIG. 43 are described. The decoder block 12A1 is a decoder block for eight pieces of four-output sections corresponding to the first to 32nd voltage levels. It is a configuration of m=2 and S=8 in the decoder block 12A of FIG. 40. Hence, the decoder block 12A 1 comprises first to eighth circuit blocks 41a, first and second circuit blocks 42a and a circuit block 43a.

In the first to eighth circuit blocks 41a in the decoder block 12A1, input voltages V002 and V003 of the section corresponding to the first to fourth voltage levels are supplied to the first circuit block 41a, input voltages V006 and V007 of the sections corresponding to the fifth to eighth voltage levels are supplied to the second circuit block 41a, and so forth up to the eighth circuit block 41a.

In each circuit block 41a, two voltages, inclusive of the overlap, are selectively output from the two input voltages of each section in accordance with the value of the bit group L. Hence, the bit group L may be formed by two bits and may be 2-bit data (D1, D0) out of the 8-bit data. Each circuit block 41a is of the same input-output correspondence relationship as that of FIG. 7 and may be of the structure of FIG. 8 of the present invention.

Of the first and second circuit blocks 42a, the first circuit block 42a receives one of two voltages selected by the first to eighth circuit blocks 41a, with the sum of the input voltages being eight, while the second circuit block 42a receives the other of the two voltages selected by the first to eighth circuit blocks 41a, with the sum of the input voltages being eight.

In each of the first and second circuit blocks 42a, one voltage of a given section from eight input voltages is selectively output in accordance with the value of the bit group M. In this case, the bit group M proves a bit for sorting the aforementioned given section from the eight sections of the decoder block 12A1. The bit group M may, therefore, be made up by three bits, that is, may be 3-bit data (D4, D3, D2) out of the 8-bit data. Meanwhile, each circuit block 42a may be formed by a tournament type structure shown in FIG. 36 which may be optimized.

The circuit block 43a receives two voltages selected in each of the first and second circuit blocks 42a. In the circuit block 43a, the decoder block 12A1 (sections corresponding to the first to 32nd voltage levels) are sorted out from the remaining decoder blocks, by the bit group N. When the bit group N selects the decoder block 12A1, two input voltages are output to the terminals T1 and T2.

In FIG. 42, the sections of the decoder block 12A1 may be sorted out from the other sections by three bits of (D7, D6 and D5) and the bit group N is composed by 3 bits field data (D7, D6 and D5).

When (D7, D6 and D5)=(0,0,0), the circuit block 43a outputs two input voltages at the terminals T1 and T2, while not outputting the input voltages to the terminals T1 and T2 otherwise.

The decoder block 12A2 is now described. The decoder block 12A2 is eight pieces of four-output sections, corresponding to the 222nd to 256th voltage levels, and may be configured similarly to the decoder block 12A1.

The input bit groups L, M and N are allocated similarly to the decoder block 12A1.

The decoder block 12A2 differs from the decoder block 12A1 only as to the input voltages to the decoder blocks and as to the contents of sorting in the circuit block 43a by the bit data of (D7, D6 and D5). Turning more specifically to the points of difference, input voltages V226 and V227 of the section corresponding to the 225th to 228th voltage levels are entered to the first circuit block 41a in the decoder block 12A2, input voltages V230 and V231 of the section corresponding to the 229th to 232nd voltage levels are entered to the second circuit block 41a and so forth up to the eighth circuit block 41a. The contents of the sorting in the circuit block 43a by the bit data (D7, D6, D5) are such that, from FIG. 42, if (D7, D6, D5)=(1,1,1), the circuit block 43a outputs two input voltages at the terminals T1 and T2, while not outputting the input voltages to the terminals T1 and T2 if (D7, D6, D5) is other than (1,1,1).

The decoder block 12A3 is now described. The decoder block 12A3 is such a decoder block of 12 16-output sections, corresponding to the 33rd to 224th voltage levels, and is of a structure of m=4 and S=12 in the decoder block 12A in FIG. 40.

Thus, the decoder block 12A3 is formed by first to 12th circuit blocks 41b, first and second circuit blocks 42b and the circuit block 43b.

In the first to twelfth circuit blocks 41b in the decoder block 12A3, the first circuit block 41b receives input voltages V038, V039, V042 and V043 of the sections corresponding to the 33rd to 48th voltage levels, the second circuit block 41b receives input voltages V054, V055, V058 and V059 of the sections corresponding to the 49th to 64th voltage levels, and so forth up to the twelfth circuit block 41b which receives input voltages V214, V215, V218 and V219 of the sections corresponding to the 209th to 224th voltage levels.

In each circuit block 41b, two voltages, inclusive of overlap, are selectively output, out of input voltages of each section in accordance with the value of the bit group L. Hence, the bit group L may be four bits, and more specifically four-bit data (D3, D2, D1 and D0) out of 8-bit data. Meanwhile, the bit group L may be of the same input/output correspondence relationship as that of FIG. 11, such that the configuration of FIGS. 12 to 14 of the present invention may be used.

Of the first and second circuit blocks 42b, the first circuit block 42b receives one of two voltages, selected by the first to twelfth circuit blocks 41b, with the sum of the voltages being 12, while the second circuit block 42b receives the other of the two voltages selected by the first to 12th circuit blocks 41b, with the sum of the other voltages being 12.

In each circuit block 42b, the one voltage of a given section is selectively output from the 12 input voltages in accordance with the value of the bit group M. In this case, the bit group M acts as the bits which select the aforementioned section out of the 12 sections of the decoder block 12A. Hence, four bits are required of the bit group M and become 4-bit data (D7, D6, D5, D4) of the 8-bit data. Meanwhile, each circuit block 42b may be formed by an optimized tournament type configuration shown in FIG. 36.

The circuit block 43b receives two voltages selected in each of the first and second circuit blocks 42a. In the circuit block 43b, the decoder block 12A3 (sections corresponding to the 33rd to 224th voltage levels) are sorted out from the remaining decoder blocks, by the bit group N. When the bit group N selects the decoder block 12A3, two input voltages are output to the terminals T1 and T2.

In an example shown in FIG. 42, the sections of the decoder block 12A3 may be sorted out from the other sections by three bits of (D7, D6 and D5), with the bit group N being the 3-bit data (D7, D6, D5) out of the 8-bit data.

When (D7, D6 and D5) is other than (0,0,0) or (1,1,1), the decoder block 12A3 is selected, and the circuit block 43a outputs two input voltages at the terminals T1 and T2.

In FIG. 43, the circuit block 43b may be omitted, and a sum total of two voltages, selected in each of the two circuit blocks 42b, may be output to the terminals T1 and T2. The reason is that the 3-bit data (D7, D6, D5) entered to the circuit block 43b are contained in the 4-bit data (D7, D6, D5, D4), entered to the circuit group 42b, and hence the decoder block 12A3 is already sorted out from the other blocks in the circuit group 42b.

Figure 44:
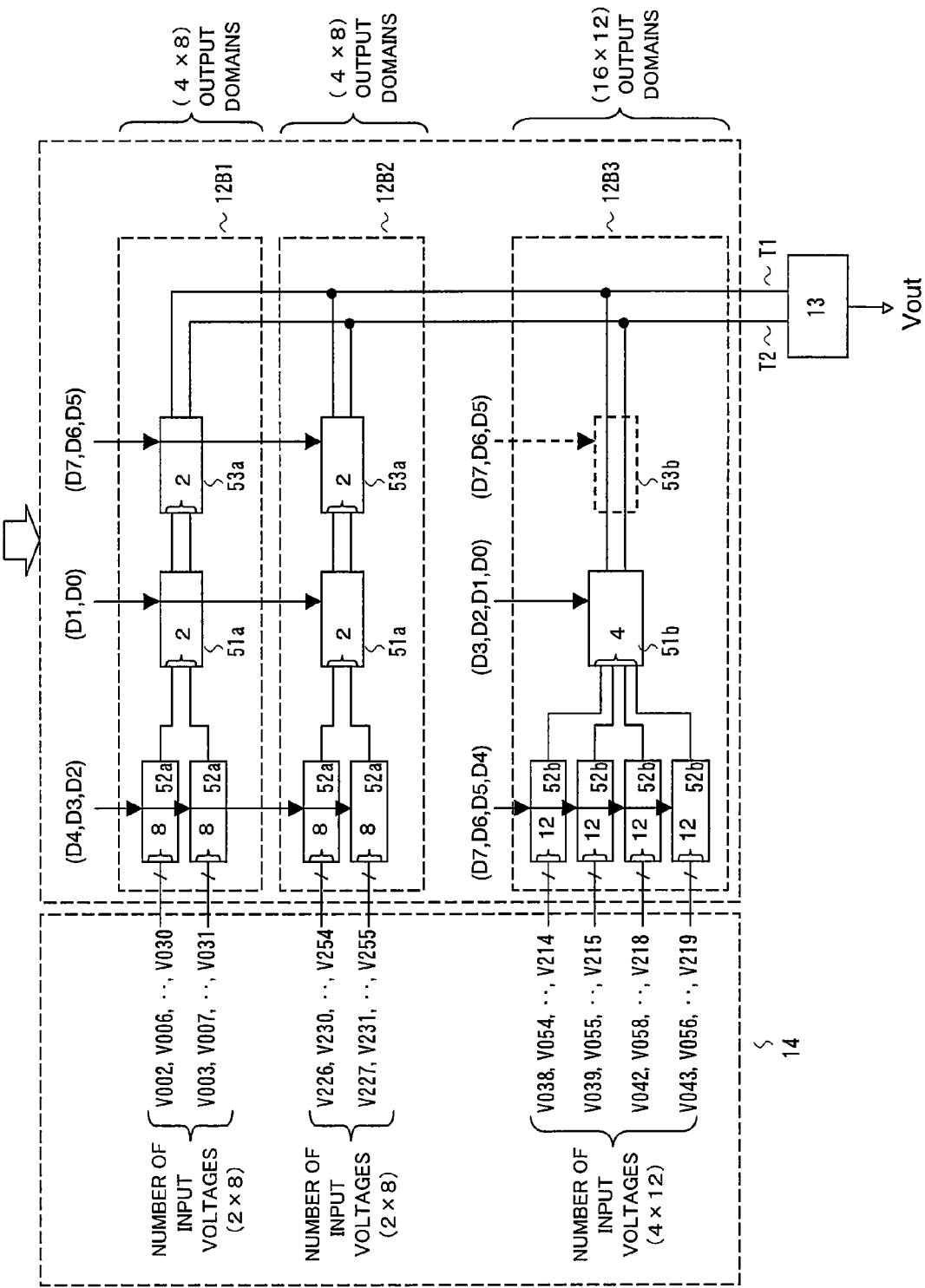
FIG. 44 shows an exemplary configuration of another decoder realizing the input/output correspondence shown in FIG. 42.

FIG. 44 shows an illustrative structure of another decoder 12, implementing the input/output correspondence relationship of FIG. 42, based on FIG. 41.

Similarly to FIG. 41, FIG. 44 shows the structure of the grayscale voltage generating circuit 14, a decoder 12 and an amplifier 13 for one-output terminal in the data driver shown in FIG. 25.

In FIG. 44, the decoder 12 is made up by three decoder blocks, namely a decoder block 12B1 formed by eight 4-output sections corresponding to first to 32nd voltage levels, a decoder block 12B2 formed by eight 4-output sections corresponding to 225th to 256th voltage levels and a decoder block 12B3 formed by twelve 16-output sections corresponding to 33rd to 224th voltage levels. Meanwhile, the four output sections are formed by two decoder blocks 12B1 and 12B2, with consecutive sections collected together, as in FIG. 43.

The bits needed for selection, inclusive of overlap, are allocated for the bit groups L, M, N, out of the 8-bit data signals (D7 to D0) for one output, entered to the decoder 12.

It is noted that, although the bits of the 8-bit data signals (D7 to D0) are paired to the inverted versions thereof (D7B to D0B), these inverted signals are omitted in FIG. 44.

Each decoder block of FIG. 44 is now described. The decoder block 12B1 is such a decoder block formed by eight 4-output sections corresponding to first to 32nd voltage levels. This decoder block corresponds to the decoder block 12B of FIG. 41 with m=2 and S=8. Thus, the decoder block 12B1 is formed by first and second circuit blocks 52a, a circuit block 51a and a circuit block 53a.

In the decoder block 12B1, the first circuit block out of the first and second circuit blocks 52a receives input voltages V002, V006, . . . , V030 of the second in-section voltage level in each of eight sections, with the sum total of the input voltages being eight, while the second circuit block out of the first and second circuit blocks 52a receives input voltages V003, V007, . . . , V031 of the third in-section voltage level in each of eight sections, with the sum total of the input voltages being eight.

In each of the circuit blocks 52a, one voltage of a given section, out of eight input voltages, is selectively output in accordance with the value of the bit group M. Hence, the bit group M may be formed by three bits, and may be 3-bit data (D4, D3, D2) out of 8-bit data. Meanwhile, each circuit block 52a may be formed by an optimized tournament structure shown in FIG. 36.

The circuit block 51a receives two voltages selected in each of the first and second circuit blocks 52a. In the circuit block 51a, two voltages, inclusive of overlap, are selectively output from two input voltages in accordance with the value of the bit group L. The circuit block 51a is of the same input-output correspondence relationship as that of FIG. 7 and may be of the structure of FIG. 8 of the present invention.

The circuit block 53a receives two voltages selected by the circuit block 51a. The circuit block 53a sorts out the decoder block 12B1 (the section corresponding to the first to 32nd voltage levels) from the other blocks and, when the bit group N selects the decoder block 12B1, the two input voltages are output to the terminals T1 and T2.

In FIG. 42, the section of the decoder block 12B1 may be sorted from the other sections by three bits (D7, D6, D5), with the bit group N being 3-bit data (D7, D6, D5) out of the 8-bit data. With (D7, D6, D5)=(0,0,0), the circuit block 53a outputs two input voltages to the terminals T1 and T2, while not outputting the input voltages to the terminals T1, T2 if otherwise.

The decoder block 12B2 is now described. The decoder block 12B2 is such a decoder block comprising eight 4-output sections, corresponding to the 225th to 256th voltage levels, and may be configured similarly to the decoder block 12B1.

The bit field allocation of the bit blocks L, M and N is also same with that of the decoder block 12B1.

The decoder block 12B2 differs from the decoder block 12B1 only as to the input voltages to the decoder block and as to the contents of sorting by the three-bit data (D7, D6, D5) in the circuit block 53a. Turning more specifically to the points of difference, as for the input voltages for the decoder block 12B2, the first circuit block 52a receives a sum total of eight input voltages V226, V230, . . . , V254, each being of the second in-section voltage level in each section of the decoder block 12B2, while the second circuit block 52a receives a sum total of eight input voltages V227, V231, . . . , V255, each being of the third in-section voltage level in each section of the decoder block 12B2.

Referring to FIG. 42, the contents of sorting by the three-bit data (D7, D6, D5) in the circuit block 53a are such that, with (D7, D6, D5)=(1,1,1), the circuit block 53a outputs two input voltages to the terminals T1 and T2, while not outputting the input voltages to the terminals T1, T2 if otherwise.

The decoder block 12B3 is now described. The decoder block 12B3 is such a decoder block comprising twelve 16-output sections, corresponding to the 33rd to 224th voltage levels, and is of the configuration of the decoder block 12B of FIG. 41, with m=4 and S=12. Hence, the decoder block 12B3 is formed by first to fourth circuit blocks 52b, a circuit block 51b and a circuit block 53b.

In the decoder block 12B3, the first circuit block 52b of the first to fourth circuit blocks 52b receives a sum total of twelve input voltages V038, V054, . . . , V214, each being of the sixth in-section voltage level in each of twelve sections, while the second circuit block 52b receives a sum total of twelve input voltages V039, V055, . . . , V215, each being of the seventh in-section voltage level in each of twelve sections. The third circuit block 52b receives a sum total of twelve input voltages V042, V058, . . . , V218, each being of the tenth in-section voltage level in each of the twelve sections, while the fourth circuit block 52b receives a sum total of twelve input voltages V043, V059, . . . , V219, each being of the eleventh in-section voltage level in each of the twelve sections.

In each circuit block 52b, a sole voltage of a given section out of 12 input voltages, is selected by the bit group M and output. At this time, the bit group M becomes bits for selecting the aforementioned given section form the twelve sections of the decoder block 12B3. Hence, four bits are needed for the bit group M which are the four bit data (D7, D6, D5, D4) of the 8-bit data. Meanwhile, each circuit block 52b may be formed by an optimized tournament structure shown in FIG. 36.

The circuit block 51b receives four voltages selected in each of the first to fourth circuit blocks 52b.

In the circuit block 51b, two voltages, inclusive of overlap, are selectively output from four input voltages by the bit group L. Hence, the bit group L may be four bits, and may be four bit data (D3, D2, D1, D0). The circuit block 51b is of the input/output correspondence relationship, similar to that of FIG. 11, and may be of the configuration of FIGS. 12 to 14 of the present invention.

The circuit block 53b receives two voltages selected by the circuit block 51b. In the circuit block 53b, the decoder block 12B3 (sections corresponding to the 33rd to 224th voltage levels) is sorted by the bit group N from the other decoder blocks. When the bit group N selects the decoder block 12B3, two input voltages are output to the terminals T1 and T2.

In the present embodiment, the section of the decoder block 12B3 may be sorted from the other sections by three bit data of (D7, D6, D5), with the bit group N being the three bit data of (D7, D6, D5) of the 8-bit data, as may be seen from FIG. 42. Except if (D7, D6, D5)=(0,0,0) or (1,1,1), the circuit block 53b outputs the two input voltages to the terminals T1 and T2.

In FIG. 44, the circuit block 53b may be omitted, with the two voltages, selected in each of the circuit blocks 51b, then being output to the terminals T1 and T2. The reason is that the decoder blocks 12B1, 12B2 and 12B3 correspond to m=2, 2, and 4, respectively, and that, in the decoder block 12B3 where m becomes maximum, the three-bit data (D7, D6, D5), entered to the circuit block 53b, is contained in the 4-bit data (D7, D6, D5, D4), entered to the circuit block 52b. Thus, if the circuit block 53b is omitted, the decoder block 12B3 is already sorted from the remaining decoder blocks, in the circuit block 52b, while it is possible to prevent unintended shorting across the terminals T1 and T2 in the circuit block 51a of the decoder block 12B1 or 12B2 where m is small.

The unintended shorting across the terminals T1 and T2 in the circuit block 51a of the decoder block 12B1 or 12B2 is hereinafter described. For ease of explanation, it is assumed that the circuit blocks 53a, and 53b, supplied with the bit group N, may be omitted.

In this case, the output terminals of the circuit blocks 51a and 51b are directly connected to the terminals T1 and T2. The circuit block 51a may be as shown in FIG. 8 of the present invention, while the circuit block 51b may be as shown in FIGS. 12 to 14 of the present invention. It is noted that shorting may occur across the terminals T1 and T2, depending on the value of the 2-bit data (D1 and D0) in FIG. 8 or on the value of the 4-bit data (D3, D2, D1 and D0) in FIGS. 12 to 14.

Referring to FIG. 42, with the decoder block 12B1 or 12B2, shorting across the terminals T1 and T2 occurs in the circuit block 51a when the 2-bit data (D1, D0)=(0,1), (1,0).

On the other hand, in the decoder block 12B3, shorting across the terminals T1 and T2 occurs in the circuit block 51b when the 4-bit data (D3, D2, D1, D0)=(0,1,0,1), (0,1,1,0), (1,0,0,1) or (1,0,1,0).

Hence, in the decoder block 12B3, the shorting across the terminals T1 and T2 by the decoder blocks 12B1 or 12B2 may occur for the values of the 4-bit data (D3, D2, D1, D0) different from those given above, thus possible producing an erroneous output.

Conversely, with the decoder block 12B1 or 12B2, there is no risk of erroneous outputs from being produced due to shorting across the terminals T1 and T2 due to the decoder block 12B3. It is because the condition for shorting across the terminals T1 and T2 is met, even in the circuit block 51a, when shorting across the terminals T1 and T2 occurs in the circuit block 51b.

Thus, if there are plural decoder blocks having different values of m, and it is desired to prevent erroneous outputs due to shorting across the terminals T1 and T2, the circuit block of the decoder block, with the maximum value of m, which is supplied with the bit group N, may be omitted, however, it is necessary to provide the circuit blocks of the other decoder blocks with the smaller value of m, supplied with the bit group N.

The number of devices in the configuration of FIGS. 43 and 44 is now explained.

If, in FIGS. 43 and 44, the structure of FIG. 8 of the present invention (the number of transistors: 4) is used for the circuit blocks 41a, 51a, the structure of FIGS. 13 and 14 of the present invention (the number of transistors: 12) is used for the circuit blocks 41b, 51b, an 8-input tournament decoder (the number of transistors: 14) is used for the circuit blocks 42a, 52a and an optimized 12-input tournament decoder (the number of transistors: 24) is used for the circuit blocks 42b, 52b, the number of transistors of the decoder 12 of FIG. 43 is 276, while that of the decoders 12 of FIG. 44 is 184.

The number of transistor elements of the decoder structure becomes different depending on the section setting. As may be seen from the above comparison of the number of transistor elements, generally the number of transistor elements is smaller with the decoder structure shown in FIG. 44 than with the decoder structure shown in FIG. 43, thus saving the space.

Although the present invention has been described with reference to the above embodiments, it is apparent that the present invention can be modified by those skilled in the art by correction or substitution of the embodiments within the scope not departing form the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed:

1. A digital to analog conversion circuit having an output voltage range determined by a lower level to a upper level of an output voltage that may be output and that has a same polarity with regard to a predetermined electric potential, said output voltage range being divided into a plurality of sections that are not overlapped with one another, said digital to analog conversion circuit comprising:
   m number of reference voltages having respective different voltage levels, where m is an integer not less than 2, and accommodated for at least one section out of the plurality of sections;
   said m number of reference voltages not used for generation of an output voltage of any other section than said one section and exclusively allocated to said one section;
   a decoder circuit that receives said m number of reference voltages and selects first and second voltages out of said m number of reference voltages, including an overlap, based on an input digital signal to output the selected first and second voltages to first and second terminals; and
   an amplifier circuit that receives the first and second voltages at said first and second terminals and performs operational amplification of the voltages at said first and second terminals to output the resultant voltage at an output terminal thereof; wherein, in said one section, for said m number of reference voltages, n number of voltage levels different to one another, wherein n is greater than m, can be output from said output terminal.

2. The digital to analog conversion circuit according to claim 1, wherein n which is the number of voltage levels, different to one another, output from said output voltage, is a second power of said m.

3. The digital to analog conversion circuit according to claim 1, wherein said decoder circuit receives a first reference voltage (A) and a second reference voltage (B) having respective different voltage values;
   said decoder circuit selecting and supplying any one out of reference voltage pairs of:
      first and second reference voltages (A and B);
      first and first reference voltages (A and A);
      second and second reference voltages (B and B); and
      second and first reference voltages (B and A);
   to said first and second terminals, based on four items of data values of said digital data signal, whereby a number of respective different voltage levels equal to four can be output from said output terminal.

4. The digital to analog conversion circuit according to claim 1, wherein said decoder circuit receives a first reference voltage (A) and a second reference voltage (B) having respective different voltage values;
   said decoder circuit selecting and supplying any one out of reference voltage pairs of:
      first and second reference voltages (A and B);
      first and first reference voltages (A and A);
      second and second reference voltages (B and B); and
      second and first reference voltages (B and A);
   to said first and second terminals, based on at least two bit signals constituting said digital data signal, whereby a number of respective different voltage levels equal to four can be output from said output terminal.

5. The digital to analog conversion circuit according to claim 1, wherein said digital to analog conversion circuit comprises:
   a plurality of sets of reference voltages having respective different voltage levels, each set of reference voltages being accommodated for an associated one of said plurality of sections; and
   a plurality of decoder circuits, each decoder circuit receiving a set of reference voltages associated with a corresponding section and selecting first and second voltages out of said reference voltages, including an overlap based on an input digital signal to output the selected first and second voltages to said first and second terminals; wherein one number of said amplifier circuit that receives the voltages at said first and second terminals and performs operational amplification of the voltages at said first and second terminals to output the resultant voltage at said output terminal is provided common for said plurality of sections.

6. A data driver for driving a data line based on an input data signal, comprising:
   a reference voltage generating circuit that generates a plurality of reference voltages having respective different voltage values; and
      the digital to analog conversion circuit as set forth in claim 1.

7. A display device comprising:
   a plurality of data lines extending parallel to one another in one direction;
   a plurality of scanning lines extending parallel to one another in a direction perpendicular to said one direction;
   a plurality of pixel electrodes arranged in a matrix fashion at the points of intersection of said data lines and the scanning lines;
   a plurality of transistors, associated with said plural pixel electrodes, each having one of the drain and the source connected to an associated one of said pixel electrodes, the other of said drain and the source connected to an associated one of said data lines and having the gate connected to an associated one of said scanning lines;
   a gate driver supplying a scanning signal to a plurality of said scanning lines; and
   a data driver that supplies grayscale signals, corresponding to input data, to said data lines; wherein
   said data driver being a data driver as set fourth in claim 6.

8. A digital-to-analog converter according to claim 1, comprising:

said decoder circuit includes S member of sections in said plurality of sections and a decoder block receiving (m×S) number of reference voltages, where S is a predetermined positive integer, in which said m number of reference voltages for each of said S member of sections are not common with the other sections; said input digital signal comprising a plurality of bits formed of a first, second and third bit groups;

said decoder block comprising first to third stages of circuit blocks; wherein said first stage includes first to S'th circuit blocks each receiving each m reference voltages and selecting two voltages including an overlap to supply the selected voltages in accordance with the value of the first bit group;

said second stage includes a first circuit block receiving one of two voltages output from each of first to S'th circuit blocks of the first stage and selecting one voltage out of the S voltages received to output the selected voltage in accordance with the value of the second bit group and a second circuit block receiving another one of the two voltages output from each of S circuit blocks of the first stage and selecting one voltage out of the S voltages received to output the selected voltage in accordance with the value of the second bit group; and said third stage includes a circuit block receiving two voltages selected and output from said first and second circuit blocks of the second stage and performing control so as to supply the two voltages received to the first and second terminals or not to output the two voltages received to the first and second terminals in accordance with the value of the third bit group; and wherein any one voltage level out of $(m^2 \times S)$ voltage levels corresponding to said n number of voltage levels being different to another output from said output terminal in accordance with the signal values of said first, second and third bit groups.

9. The digital-to-analog converter according to claim 8, wherein, in case bits in the third bit group are included in the first bit group and/or the second bit group, the third stage circuit block is omitted and the outputs of two circuit blocks of the second stage are supplied to the first and second terminals.

10. The digital-to-analog converter according to claim 8, comprising three pieces of said decoder blocks composing first to third decoder blocks, with said digital data signal being an 8-bit data signal (D7, D6,D5,D4,D3,D2,D1,D0);

wherein said first and second decoder blocks, having common m and S, where m is 2 and S is 8, receives 16 reference voltages and receiving (D1,D0), (D4,D3,D2) and (D7,D6,D5), as said first, second and third bit groups respectively;

wherein said third decoder blocks, having m equal to 4 and S equal to 12, receives 48 reference voltages and receiving (D3,D2,D1,D0), (D7,D6,D5,D4) and (D7,D6,D5), as said first, second and third bit groups;

wherein ones of respective two outputs of said first to third decoder blocks are connected in common to said first terminal and another ones of said respective two outputs of said first to third decoder blocks are connected in common to said second terminal; and wherein any one level of 256 different voltage levels can be output from said output terminal based on said 8-bit digital data signal.

11. The digital-to-analog converter according to claim 10, wherein said third stage circuit block in said third decoder block is omitted; and wherein outputs of said first and second circuit blocks of the second stage are connected to said first and second terminals respectively.

12. A digital-to-analog converter according to claim 1, comprising:

said decoder circuit includes S member of sections in said plurality of sections and a decoder block receiving (m×S) number of reference voltages, where S is a predetermined positive integer, in which said m number of reference voltages for each of said S member of sections are not common with the other sections; said input digital signal comprising a plurality of bits formed of a first, second and third bit groups;

said decoder block comprising first to third stages of circuit blocks; wherein said first stage includes first to m'th circuit blocks each receiving each S reference voltages and selecting one voltages to supply the selected voltage in accordance with the value of the first bit group;

said second stage includes a circuit block receiving m voltages output from each of first to m'th circuit blocks of the first stage and selecting two voltage out of the m voltages received to output the selected two voltage in accordance with the value of the second bit group; and said third stage includes a circuit block receiving two voltages output from said circuit block of the second stage and performing control so as to supply the two voltages received to the first and second terminals or not to output the two voltages received to the first and second terminals in accordance with the value of the third bit group; and wherein any one voltage level out of $(m^2 \times S)$ voltage levels corresponding to said n number of voltage levels being different to another output from the output terminal in accordance with the signal values of said first, second and third bit groups.

13. The digital-to-analog converter according to claim 12, comprising a plurality of said decoder blocks having the common m or respectively different values of m, wherein in the decoder block having the maximum value of said m, in case bits in the third bit group are included in the first bit group and/or the second bit group, the third stage circuit block is omitted and the outputs of the second stage circuit block are supplied to the first and second terminals.

14. The digital-to-analog converter according to claim 12, comprising three pieces of said decoder blocks composing first to third decoder blocks, with said digital data signal being an 8-bit data signal (D7, D6,D5,D4,D3,D2,D1,D0);

wherein said first and second decoder blocks, having common m and S, where m is 2 and S is 8, receives 16 reference voltages and receiving (D4,D3,D2), (D1,D0) and (D7,D6,D5), as said first, second and third bit groups respectively;

wherein said third decoder blocks, with m being 4 and with S being 12, receives 48 reference voltages and receiving (D7,D6,D5,D4), (D3,D2,D1,D0) and (D7,D6,D5), as said first, second and third bit groups;

wherein ones of respective two outputs of said first to third decoder blocks are connected in common to said first terminal and another ones of said respective two outputs of said first to third decoder blocks are connected in common to said second terminal; and wherein any one level of 256 different voltage levels can be output from said output terminal based on said 8-bit digital data signal.

15. The digital-to-analog converter according to claim 14, wherein said third stage circuit block in said third decoder block is omitted; and wherein outputs of the second stage circuit block are connected to said first and second terminals respectively.

16. A display device comprising:
a data driver comprising the digital-to-analog converter as defined in claim 12; and
a display panel;
wherein a data line of the display panel is driven with an output signal of the data driver.

17. The digital-to-analog converter according to claim 1, wherein
said m is $2^K$, where K is a preset positive integer; and wherein
said decoder circuit, which selects first to $2^K$'th reference voltages and outputs the selected voltages to said first and second terminals based on first to 2K signal constituting total 2K bits signals of said digital signal, includes first to K'th columns of circuit blocks, each comprising four input terminals for receiving voltage signals and two output terminals for outputting voltage signals selected based on two bit signals; wherein
said first column includes (K−1)'th power of 2 pieces of said circuit blocks, each having each two input terminals tied together to compose two separate input ends and receiving each two reference voltages out of first to $2^K$'th reference voltages at said input ends, for selecting two voltage signals based on the first and second signals to output the selected two voltage signals to the two output terminals thereof respectively; and the F'th column (where F is any one of integers from 2 to K) includes (K−F)'th power of 2 pieces of said circuit blocks, each receiving output voltage signals of each two circuit blocks of (F−1)'th columns and selecting two voltages signals based on the (2F−1)'th and 2F'th signals to output the selected two voltages signals to the two terminals thereof respectively;
the two output voltage signals output from the K'th column being supplied to said first and second terminals.

18. The digital-to-analog converter according to claim 17, wherein said circuit block, having said four input terminals (as termed first to fourth terminals) and said two output terminals (as termed first and second terminals), comprises:
first and second switches having one ends thereof connected to said first and third input terminals respectively and having other ends thereof connected in common to said first output terminal and on/off controlled based on one bit signal of said two bit signals; and
third and fourth switches having one ends thereof connected to said second and fourth input terminals respectively and having other ends thereof connected in common to said second output terminal and on/off controlled based on the other bit signal of said two bit signals.

19. A display device comprising:
a data driver comprising the digital-to-analog converter as defined in claim 17; and
a display panel;
wherein a data line of the display panel is driven with an output signal of the data driver.

* * * * *